United States Patent
Ishikawa et al.

(10) Patent No.: US 11,204,547 B2
(45) Date of Patent: Dec. 21, 2021

(54) PELLICLE SUPPORT FRAME, PELLICLE, METHOD FOR MANUFACTURING PELLICLE SUPPORT FRAME, AND EXPOSURE ORIGINAL PLATE AND EXPOSURE DEVICE EMPLOYING PELLICLE

(71) Applicant: MITSUI CHEMICALS, INC., Tokyo (JP)

(72) Inventors: Akira Ishikawa, Ichihara (JP); Atsushi Okubo, Tokyo (JP); Yosuke Ono, Sodegaura (JP); Kazuo Kohmura, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 16/953,748

(22) Filed: Nov. 20, 2020

(65) Prior Publication Data

US 2021/0080824 A1 Mar. 18, 2021

Related U.S. Application Data

(63) Continuation of application No. PCT/JP2019/023267, filed on Jun. 12, 2019.

(30) Foreign Application Priority Data

Jun. 12, 2018 (JP) .............................. JP2018-111648

(51) Int. Cl.
*G03F 1/64* (2012.01)
*G03F 7/20* (2006.01)

(52) U.S. Cl.
CPC ............ *G03F 1/64* (2013.01); *G03F 7/70983* (2013.01)

(58) Field of Classification Search
CPC .... G03F 1/64; G03F 7/70191; G03F 7/70866; G03F 7/70916; G03F 7/70983
(Continued)

(56) References Cited

U.S. PATENT DOCUMENTS

2013/0065160 A1* 3/2013 Lao ........................... G03F 1/64
430/5
2015/0212433 A1* 7/2015 Kim ..................... G03F 7/70983
355/30
(Continued)

FOREIGN PATENT DOCUMENTS

JP H1062966 A 3/1998
JP 2017083791 A 5/2017
(Continued)

OTHER PUBLICATIONS

International Search Report (PCT/ISA/210) dated Aug. 13, 2019, by the Japan Patent Office as the International Searching Authority for International Application No. PCT/JP2019/023267, and an English translation.
(Continued)

*Primary Examiner* — Colin W Kreutzer
(74) *Attorney, Agent, or Firm* — Buchanan Ingersoll & Rooney PC

(57) ABSTRACT

A support frame for pellicle is provided including a first support frame part, a second support frame part, and a filter, wherein the filter has a flat plate-shaped frame shape and is sandwiched by the first support frame part and the second support frame part, the first support frame part includes a first body part having a flat plate-shaped frame shape and a first engaging portion protruded from the first body part to a thickness direction of the support frame for pellicle, and the second support frame part includes a second body part having a flat plate-shaped frame shape and a second engaging portion of the second body part engaging with the first
(Continued)

engaging portion being arranged in a concave part provided in the thickness direction of the support frame for pellicle.

17 Claims, 39 Drawing Sheets

(58) Field of Classification Search
USPC ........ 355/30, 53, 67, 69, 72; 359/507; 430/5
See application file for complete search history.

(56) References Cited

U.S. PATENT DOCUMENTS

| | | |
|---|---|---|
| 2017/0184955 A1 | 6/2017 | Akinori et al. |
| 2019/0129300 A1 | 5/2019 | Ono et al. |

FOREIGN PATENT DOCUMENTS

| | | |
|---|---|---|
| JP | 2017116697 A | 6/2017 |
| WO | 2018008594 A1 | 1/2018 |

OTHER PUBLICATIONS

Written Opinion (PCT/ISA/237) dated Aug. 13, 2019, by the Japan Patent Office as the International Searching Authority for International Application No. PCT/JP2019/023267.

\* cited by examiner (a)

FIG. 27A
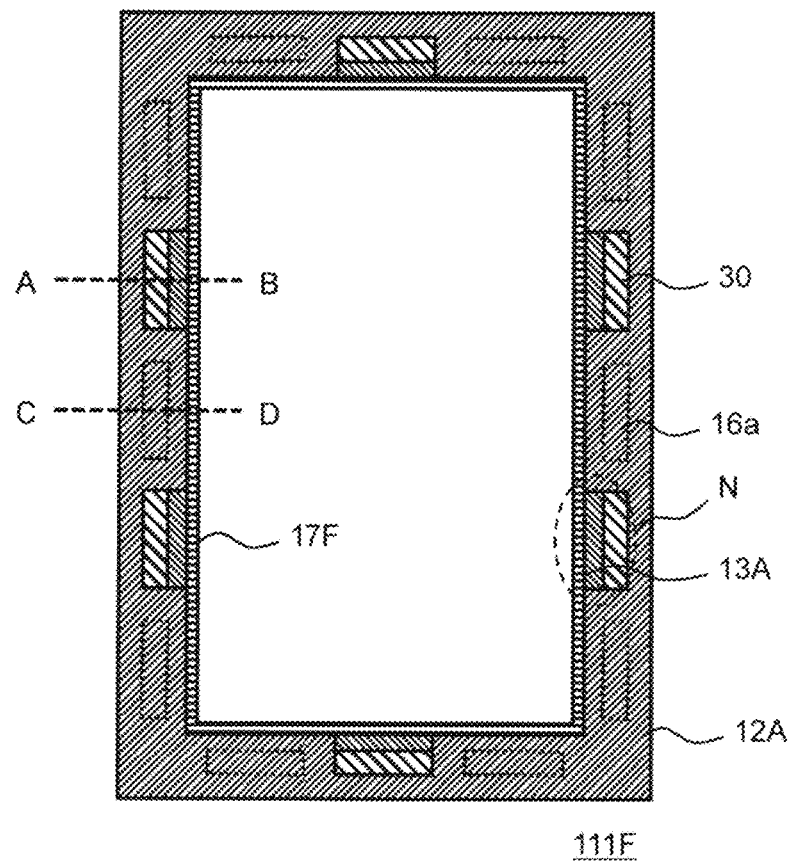
FIG. 27B
FIG. 27C
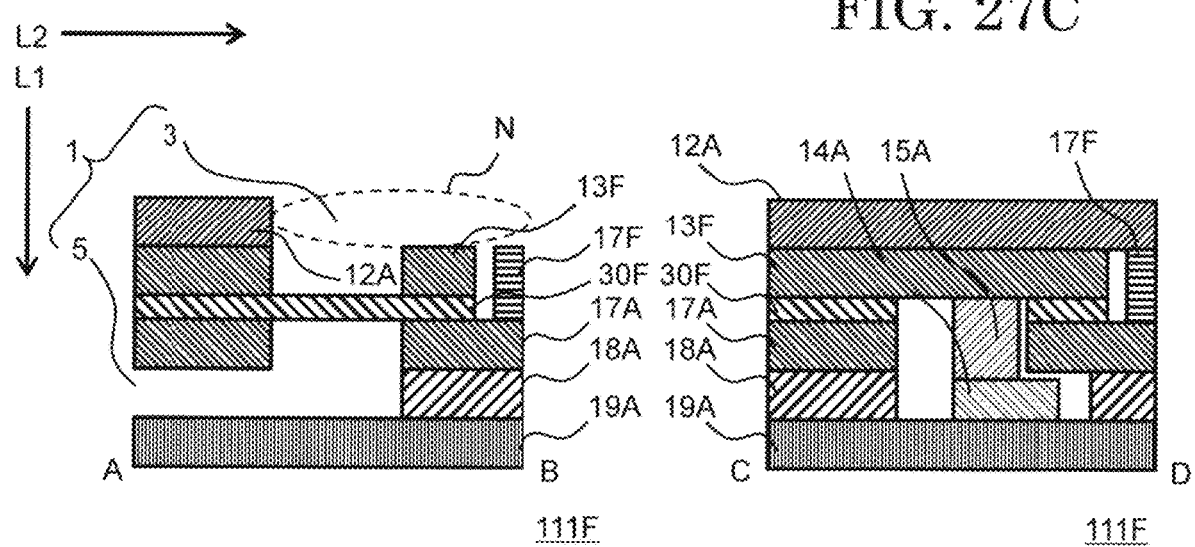

FIG. 29A
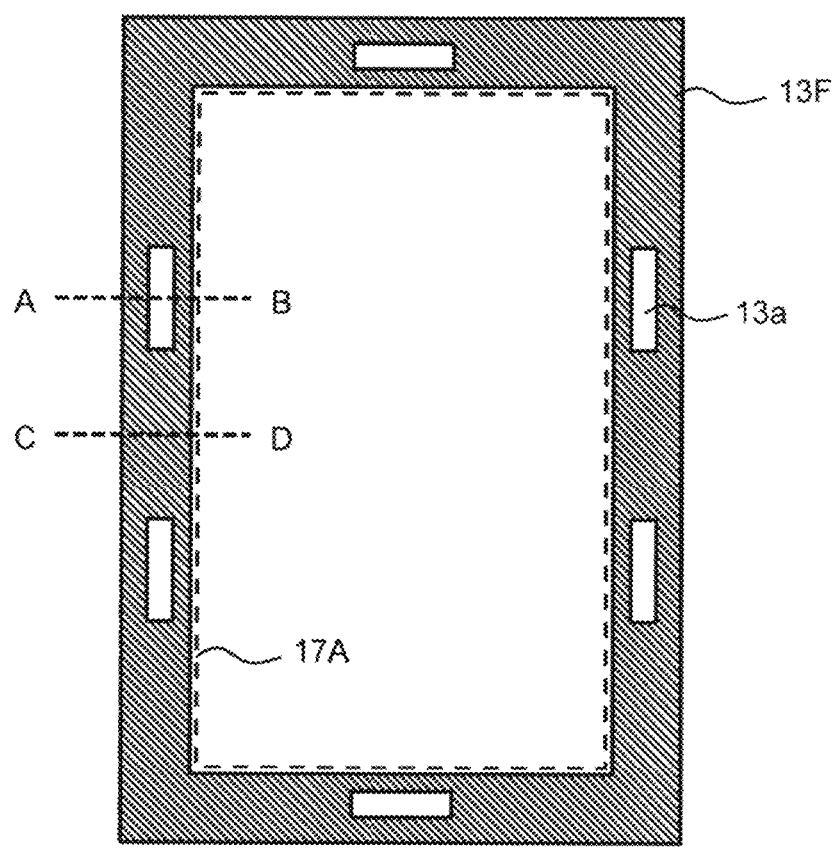
FIG. 29B
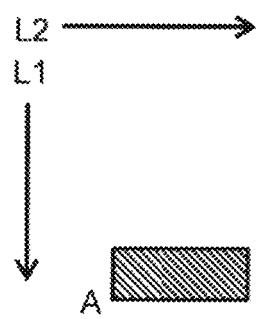
FIG. 29C

FIG. 35A
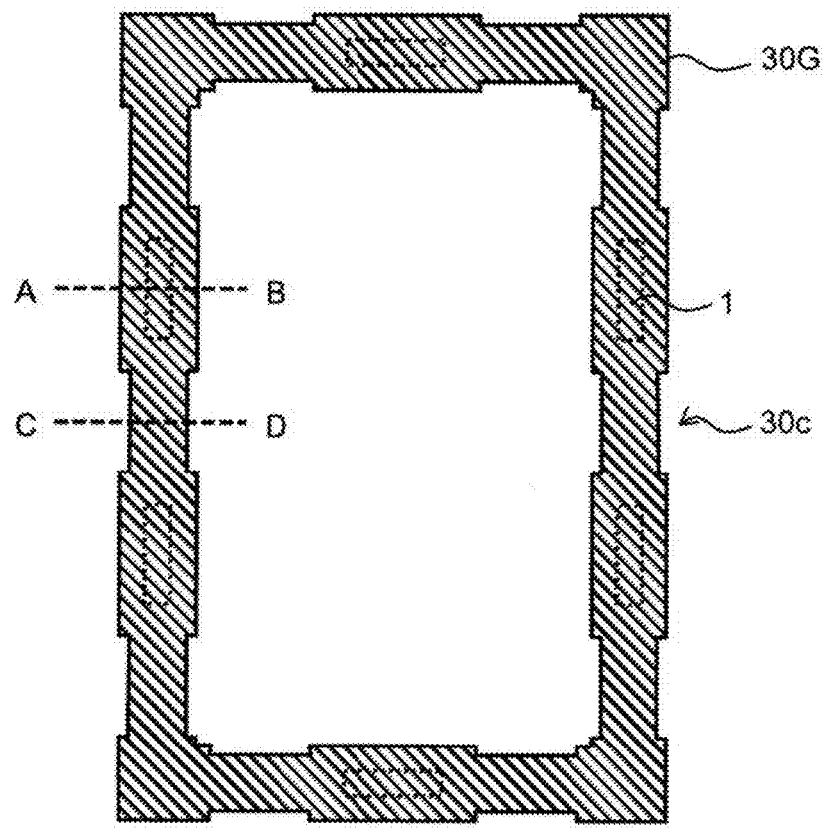
FIG. 35B
FIG. 35C
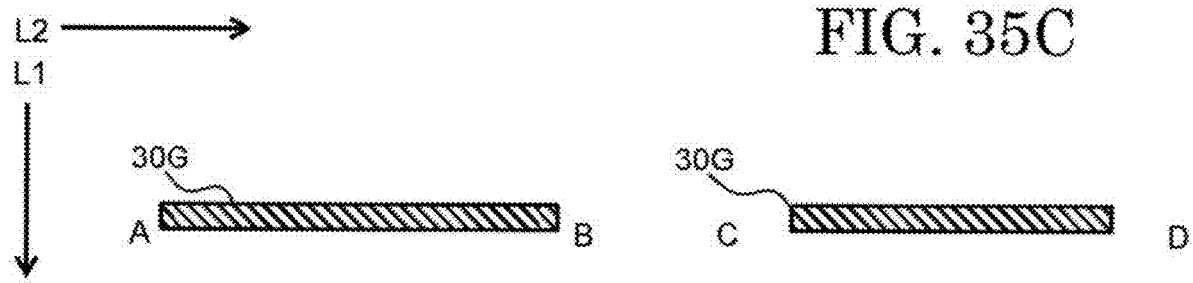

PELLICLE SUPPORT FRAME, PELLICLE, METHOD FOR MANUFACTURING PELLICLE SUPPORT FRAME, AND EXPOSURE ORIGINAL PLATE AND EXPOSURE DEVICE EMPLOYING PELLICLE

CROSS REFERENCE TO RELATED APPLICATIONS

This application is based upon and claims the benefit of priority from the prior Japanese Patent Application No. 2018-111648, filed on Jun. 12, 2018, and PCT Application No. PCT/JP2019/023267, filed on Jun. 12, 2019, the entire contents of which are incorporated herein by reference.

FIELD

The present invention relates to a photomask or a reticle used when manufacturing a semiconductor device or the like by a lithography technique (hereinafter referred to collectively as a "photomask") and a pellicle or the like which is a dustproof cover for a photomask for preventing dust from adhering thereto. In particular, it relates to a support frame for pellicle for extreme ultraviolet (Extreme Ultraviolet: EUV) lithography and a pellicle, and a method for manufacturing a support frame for pellicle and, and to an exposure pattern plate and an exposure device using the pellicle.

BACKGROUND

A semiconductor element is manufactured through a process called lithography. In lithography, an exposure device called a scanner or stepper is used to irradiate a mask on which a circuit pattern is drawn with exposure light to transfer the circuit pattern to a semiconductor wafer on which a photoresist is applied. By the present, the wavelength of the lithography advances in the shortening, and the development of EUV lithography is advanced as a lithography technology of the next generation. The EUV light refers to light having wavelengths of soft X-ray region or vacuum-ultraviolet region and refers to light having a wavelength of about 13.5 nm±0.3 nm. The EUV light is easily absorbed by all materials, and the EUV lithography therefore requires exposure in vacuo in the exposure device. Because the EUV light is easily absorbed by all materials, a pellicle film placed in a pellicle also need to be a film of the order of nanometers, which is unconventional.

In the EUV lithography where the exposure device is evacuated, it was initially believed that attaching a pellicle to a photomask was not essential, so the currently developed EUV exposure device has only about 3.0 mm of space for attaching a pellicle to a photomask. However, to ensure a space in the exposure device for mounting a conventional pellicle with a height of 5 mm or more, an optical system needs to be redesigned, which delays the development of EUV lithography. Therefore, it is necessary to newly design a pellicle having a height of about half or less of the conventional pellicle.

Vacuum in the exposure device creates a pressure differential between the closed space formed by the photomask and the pellicle (inside the pellicle) and its exterior, then the pressure differential can cause the pellicle film to sag or swell. As a solution to this, it is conceivable to provide a vent hole. However, because the installation space of the pellicle is greatly limited, adequate ventilation through the vent hole arranged in a frame body of the pellicle is required to prevent damages to the pellicle film of the order of nanometers. The vent hole must be equipped with a filter in the vent hole to prevent foreign matter from entering inside the pellicle. However, the installation space of the pellicle is greatly limited, and the allowable height of the frame body is greatly limited. Therefore, the frame body must be designed with an unprecedented filter configuration.

For example, Japanese laid-open patent publication No. 2017-116697, from the viewpoint of heat resistance and ventilation speed (decompression time) and foreign matter collection efficiency, a pellicle for EUV exposure in which the vent hole with a metallic or ceramic is covered by continuously integrated filters by welding a pellicle frame is described.

SUMMARY

A filter covering a vent hole must be replaced because they are degraded by exposure to the EUV light. It is not easy to replace the filter integrated with a pellicle frame, and a pellicle capable of easily replacing the filter is desired.

It is an object of the present invention to solve the above-mentioned problems and to provide a support frame in which a vent hole is provided with an easily detachable filter, and in which a pellicle film for extreme ultraviolet light lithography can be provided, a pellicle in which a pellicle film for extreme ultraviolet light lithography is provided in support frame, a method for manufacturing support frame, and an exposure pattern plate using these support frames and a exposure device.

A support frame for pellicle according to an embodiment of the present invention includes a first support frame part, a second frame part, and a filter. The filter has a flat plate-shaped frame shape and is sandwiched by the first support frame part and the second support frame part. The first support frame part has a first body part having a flat plate-shaped frame shape and a first engaging portion protruded from the first body part to a thickness direction of the support frame for pellicle. The second support frame part has a second body part having a flat plate-shaped frame shape and a second engaging portion of the second body part engaging with the first engaging portion being arranged in a concave part provided in the thickness direction of the support frame for pellicle.

In an embodiment of the present invention, the first engaging portion includes a first extending portion extending in the thickness direction of the support frame for pellicle and a second extending portion extending in a direction intersecting with the thickness direction of the support frame for pellicle from an end of the first extending portion opposite to the first body part. The second engaging portion includes a first groove extending in the thickness direction of the support frame for pellicle from a first surface of the second support frame arranged at a first support frame side and a second groove extending in a direction intersecting with the thickness direction of the support frame for pellicle from a bottom of the first groove. At least a part of the second extending portion is housed in the second groove.

In an embodiment of the present invention, the filter may include an opening at a position corresponding to the first engaging portion and the second engaging portion. The first engaging portion may engage with the second engaging portion through the opening.

In an embodiment of the present invention, the second engaging portion may include a fixing tool separately arranging in a direction to the first surface from the bottom of the second groove. The second groove may be composed of the bottom of the first groove and the fixing tool.

In an embodiment of the present invention, the fixing tool may include a third engaging portion engageable with a jig.

In an embodiment of the present invention, a vent hole connecting an inner edge and an outer edge of the support frame for pellicle may be further included, the vent hole may be arranged with the filter.

In an embodiment of the present invention, the vent hole may include a first hole arranging the filter and extending in a first direction almost parallel to the thickness direction of the support frame for pellicle and a second hole connected to a first end of the first hole. The second hole may extend in a second direction intersecting with the first direction, and have an opening in the inner edge or the outer edge.

In an embodiment of the present invention, the vent hole may further include a third hole connected to a second end of the first hole and provided in a direction intersecting with the thickness direction of the support frame for pellicle.

In an embodiment of the present invention, a plurality of the first engaging portions, a plurality of the second engaging portions, and a plurality of the vent holes may be included.

In an embodiment of the present invention, the first support frame part may be a laminated body including a thin plate having a frame shape forming the first body part, a thin plate forming the first extending portion, and a thin plate forming the second extending portion.

In an embodiment of the present invention, the second support frame part may be a laminated body including a thin plate forming the first groove and a thin plate forming the second groove.

In an embodiment of the present invention, a wall arranged inside the frame shape of the filter may be further included.

In an embodiment of the present invention, a pellicle including any one of the support frames for pellicle described above and a pellicle film is provided.

In an embodiment of the present invention, an exposure pattern plate including the pellicle and a pattern plate is provided.

In an embodiment of the present invention, an exposure device including the exposure pattern plate and an optical system is provided.

In an embodiment of the present invention, a manufacturing method of a support frame for pellicle is provided. The manufacturing method of a support frame for pellicle includes steps of preparing a first support frame part including a first body part having a flat plate-shaped frame shape and a first engaging portion protruded in a thickness direction of the support frame for pellicle from the first body part, preparing a second support frame part including a second body part having a flat plate-shaped frame shape and a second engaging portion arranged in a concave part of the second body part provided in the thickness direction of the support frame for pellicle and engaging with the first engaging portion, preparing a filter having a flat plate-shaped frame shape, and sandwiching the filter by the first support frame part and the second support frame part, and engaging the first engaging portion with the second engaging portion.

In an embodiment of the present invention, it may include steps of connecting a thin plate forming the first body part, a thin plate forming a first extending portion, and a thin plate forming a second extending portion to prepare the first support frame part including the first engaging portion protruded from the first body part to the thickness direction of the support frame for pellicle, connecting a thin plate forming a first groove, a thin plate forming a second groove, and a thin plate forming the second body part to prepare the second support frame including the second engaging portion, and housing at least a part of the second extending portion in the second groove to engage the first engaging portion with the second engaging portion.

BRIEF DESCRIPTION OF THE DRAWINGS

FIG. 27A is a schematic diagram showing a support frame 111F for pellicle in an embodiment and is a schematic diagram of the support frame 111F for pellicle viewed in the plane direction of the pattern plate where the support frame 111F for pellicle is arranged from the side where the pellicle film is arranged;

FIG. 27B is a cross-sectional view of the support frame 111F for pellicle in the line segment AB in FIG. 27A;

FIG. 27C is a cross-sectional view of the support frame 111F for pellicle in the line segment CD in FIG. 27A;

FIG. 29A is a schematic diagram of a thin plate 13F according to an embodiment and is a top view of the thin plate 13F;

FIG. 29B is a cross-sectional view of the thin plate 13F in the line segment AB shown in FIG. 29A;

FIG. 29C is a cross-sectional view of the thin plate 13F in the line segment CD shown in FIG. 29A;

FIG. 35A is a schematic diagram of a filter 30G according to an embodiment and is a top view of the filter 30G;

FIG. 35B is a cross-sectional view of the filter 30G in the line segment AB shown in FIG. 35A;

FIG. 35C is a cross-sectional view of the filter 30G in the line segment CD shown in FIG. 35A;

REFERENCE SIGNS LIST

Figure 1A:
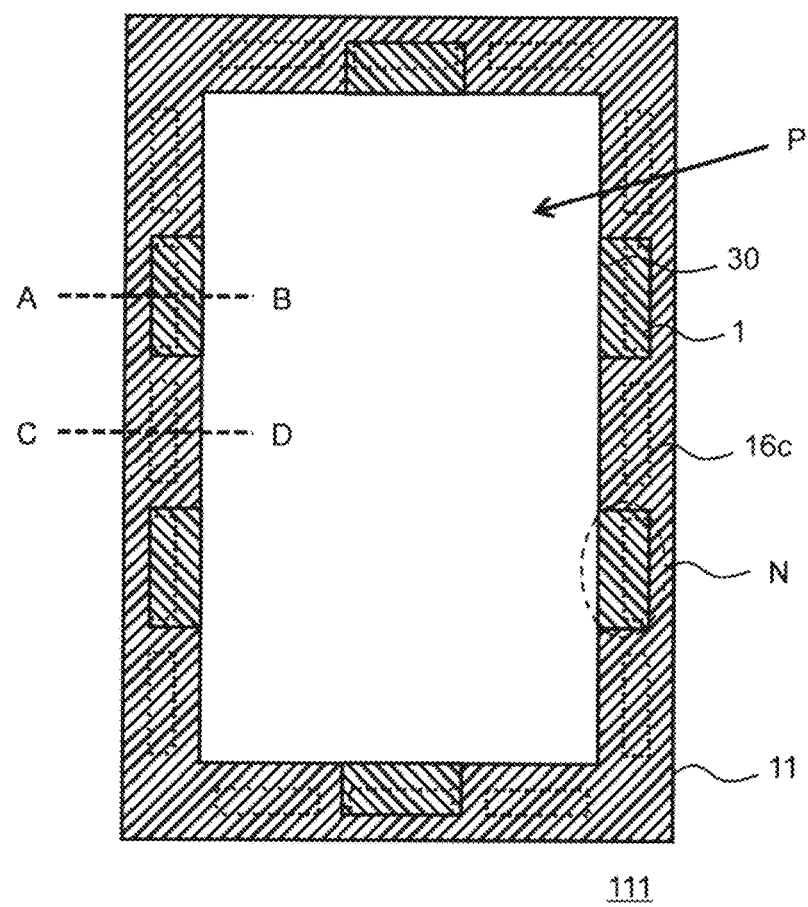
FIG. 1A is a schematic diagram of a support frame 111 for pellicle according to an embodiment and is a schematic diagram of the support frame 111 for pellicle viewed in the plane direction of the pattern plate where the support frame 111 for pellicle is arranged from the side where the pellicle film is arranged.

1 Vent hole, 3 hole, 5 hole, 7 hole, 11 first support frame part, 11a first body part, 11A first support frame part, 11B first support frame part, 11C first support frame part, 11E first support frame part, 11G first support frame part, 11b first engaging portion, 11c first extending portion, 11d second extending portion, 11e first extending portion, 11f second extending portion, 11g first extending portion, 11h second extending portion, 12A thin plate, 12C-1 thin plate, 12C-2 thin plate, 12F thin plate, 12G thin plate, 12a concave part (recess shape), 13A thin plate, 13C thin plate, 13F thin plate, 13G thin plate, 13G thin plate, 13a opening, 14A thin plate, 14B thin plate, 14C-1 thin plate, 14C-2 thin plate, 14 C-3 thin plate, 15A thin plate, 15B thin plate, 15C thin plate, 16 second support frame part, 16A second support frame part, 16B second support frame part, 16C second support frame part, 16D second support frame part, 16G second support frame part, 16a second body part, 16b second engagement portion, 16c first groove, 16d second groove, 16e first groove, 16f second groove, 16g first groove, 16h second groove, 161 locking mechanism, 17A thin plate, 17B thin plate, 17C-1 thin plate, 17C-2 thin plate, 17D thin plate, 17F wall, 17G thin plate, 17a opening, 17b opening, 18 thin plate, 18A thin plate, 18B thin plate, 18C thin plate, 18D thin plate, 18G thin plate, 18a concave part (recess shape), 18b opening, 19A thin plate, 19D thin plate, 19G hooking portion, 19G-1 flat plate-shaped member, 19G-2 wall-shaped member, 21D thin plate, 23D fixing tool, 21a concave part (recess shape), 21b opening, 24D third engaging portion, 25E top plate, 30 filter, 30D filter, 30F filter, 30G filter, 39 adhesive layer, 100 pellicle, 102 pellicle film, 104 first frame body, 106 pellicle frame body, 111 support frame for pellicle, 111A support frame for pellicle, 111B support frame for pellicle, 111C support frame for pellicle, 111D support frame for pellicle, 111E support frame for pellicle, 111F support frame for pellicle, 180 exposure device, 181 exposure pattern plate, 182 light source, 183 lighting optical system, 184 pattern plate, 185 filter window, 187 sensitive substrate, 188 projection optical system, 189 multilayer film mirror, 190 multilayer film mirror, 191 multilayer film mirror

DESCRIPTION OF EMBODIMENTS

Embodiments of the present invention will be described below with reference to the drawings. However, the present invention can be implemented in many different modes and should not be construed as being limited to the description of the following embodiments. For the sake of clarity of explanation, the drawings may be schematically represented with respect to widths, thicknesses, shapes, and the like of the respective portions in comparison with actual embodiments, but are merely an example and do not limit the interpretation of the present invention. In this specification and each of the drawings, the same elements as those described above with reference to the preceding drawings are denoted by the same reference numerals, and a detailed description thereof may be omitted as appropriate.

Definition

In this specification, when a member or region is "above (or below)" another member or region, it includes not only being directly on (or directly below) another member or region, but also being above (or below) another member or region, i.e., including other components in between above (or below) another member or region, unless otherwise limited.

In this specification, the extreme ultraviolet light (EUV light) refers to light having a wavelength of 5 nm or more and 30 nm or less. The wavelength of the EUV light is preferably 5 nm or more and 14 nm or less.

In this specification, a pellicle means one having a pellicle film and a support unit which supports a pellicle film provided on one surface of the pellicle film and is connected to a pattern plate. The pellicle film means a thin film used in the pellicle. The support unit includes at least a support frame connected to the pattern plate. The support frame comprises a vent hole. When the pellicle is arranged in the pattern plate, the vent hole is a hole which allows venting of the inside and the outside of an enclosed space formed by the pellicle and the pattern plate. A filter is arranged inside the vent hole. The support frame is a frame body with the filters arranged inside the vent hole. The support unit may be a support frame to extend the pellicle film, or it may further have another frame body connected to the pellicle film and the support frame. The construction in which the pellicle film is extended on the frame body is called a pellicle frame body. Therefore, the pellicle can be defined as a structure in which the pellicle film and the support unit are connected, or a structure in which the pellicle frame body and the support frame are connected.

In the present specification, the term "plane" is not limited to a flat surface and includes a curved surface.

Problems of the Prior Art Disclosed in the Invention

In the case where an area of the filter on the support unit of the pellicle is small when an inner space of a lithography apparatus using a EUV pellicle is evacuated, the air is difficult to pass through the filter, and it takes relatively long time to evacuate to the inside of the pellicle. The pellicle for EUV exposure described in Patent Document 1, since the metallic or ceramic filters are continuously integrated by welding with the pellicle frame to cover the vent hole, has solved this problem. On the other hand, the filter covering the vent hole is deteriorated due to exposure of the EUV light, so it needs to be replaced, but it is difficult to replace the filter integrated with the pellicle frame. When the filter is fixed to the pellicle frame using an organic adhesive as in a conventional pellicle for non-EUV exposure, it is possible to peel the filter from the pellicle frame, but in the pellicle for EUV exposure exposed under vacuum, outgas may be generated from the adhesive. Outgases cause deposits on the surface of the photomask or cause fogging of the lens optical system exposure measures, resulting in poor exposure or insufficient light. In the conventional pellicle in which one vent hole is covered with one filter, the replacement of the filter is complicated.

Embodiment 1

Figure 1B:
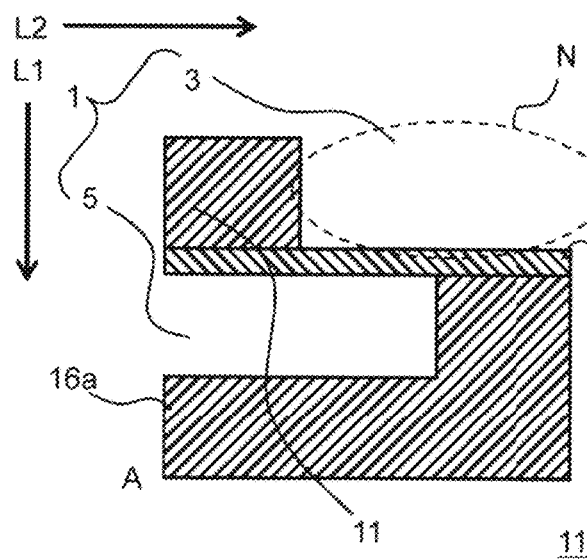
FIG. 1B is a cross-sectional view of the support frame 111 for pellicle in the line segment AB in FIG. 1A.
Figure 1C:
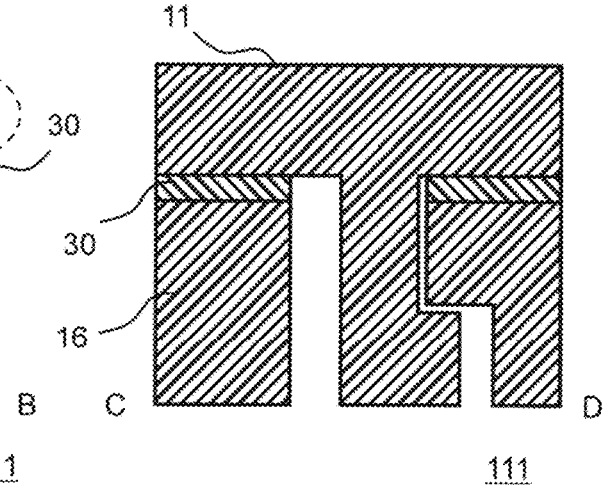
FIG. 1C is a cross-sectional view of the support frame 111 for pellicle in the line segment CD in FIG. 1A.
Figure 2A:
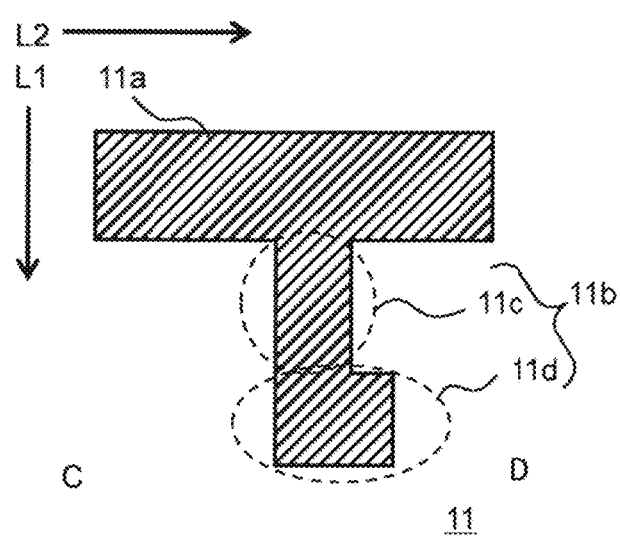
FIG. 2A is a schematic diagram illustrating details of the first support frame part 11 and the second support frame part 16 constituting the support frame 111 for pellicle according to an embodiment and is a schematic diagram illustrating details of the first support frame part 11.
Figure 2B:
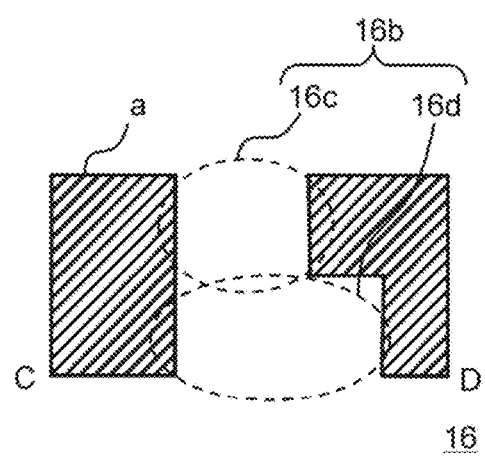
FIG. 2B is a schematic diagram illustrating details of the second support frame part 16.
Figure 2C:
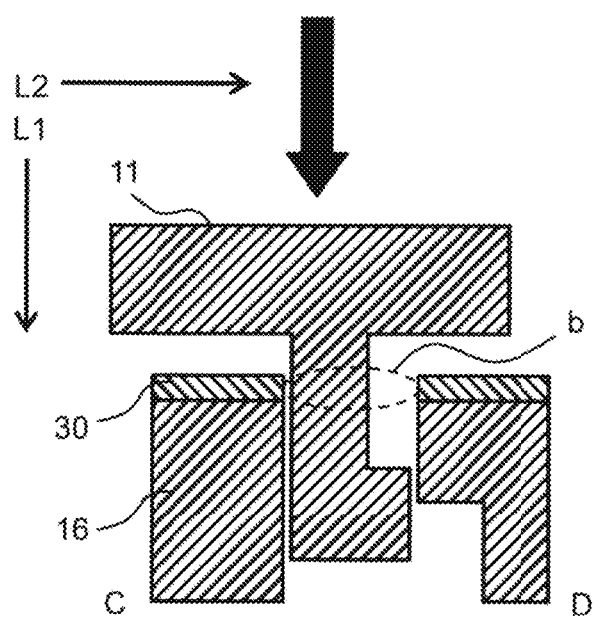
FIG. 2C is a schematic diagram illustrating a method of sandwiching and fixing a filter 30 by the first support frame part 11 and the second support frame part 16.
Figure 2D:
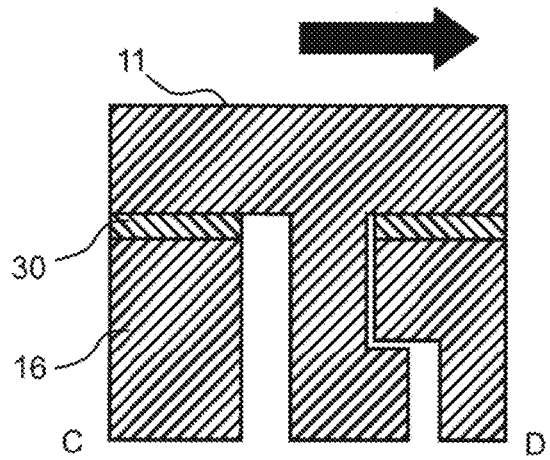
FIG. 2D is a schematic diagram illustrating a method of sandwiching and fixing a filter 30 by the first support frame part 11 and the second support frame part 16.
Figure 3A:
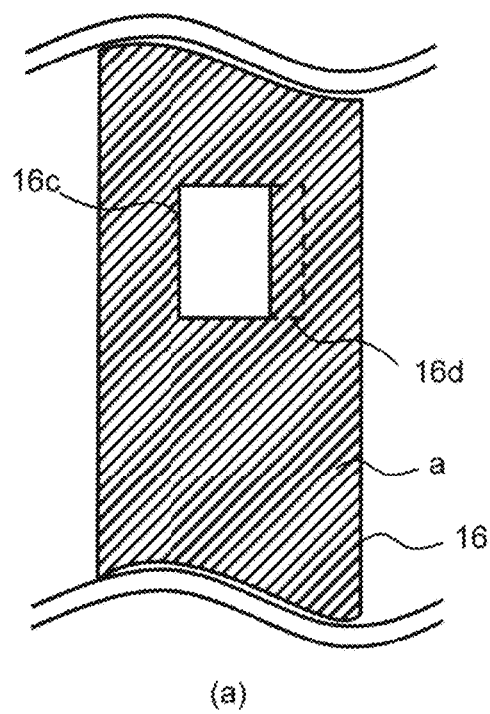
FIG. 3A shows a method of engaging a first engaging portion 11b with a second engaging portion 16b and is a schematic diagram of the support frame 111 for pellicle viewed at a first surface a of the second support frame part 16 located toward the first support frame part 11 in the surface direction of the pattern plate in which the support frame 111 for pellicle is arranged from a side in which a pellicle film is arranged.
Figure 3B:
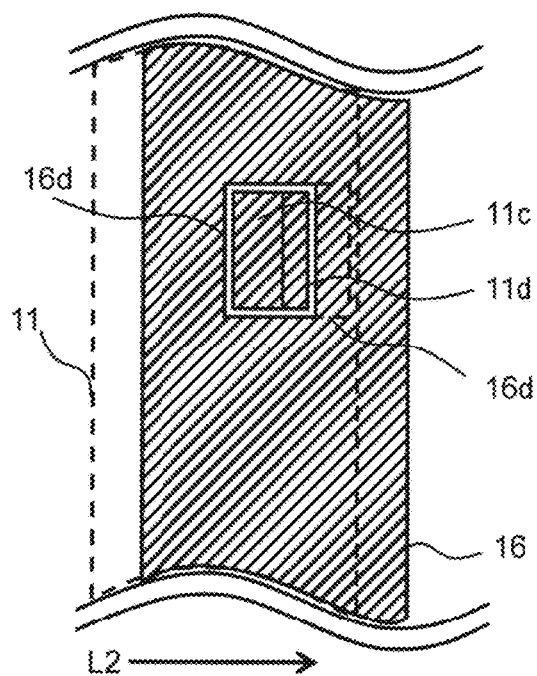
FIG. 3B shows a method of engaging a first engaging portion 11b with a second engaging portion 16b and is a schematic diagram of the support frame 111 for pellicle viewed at a first surface a of the second support frame part 16 located toward the first support frame part 11 in the surface direction of the pattern plate in which the support frame 111 for pellicle is arranged from a side in which a pellicle film is arranged.
Figure 3C:
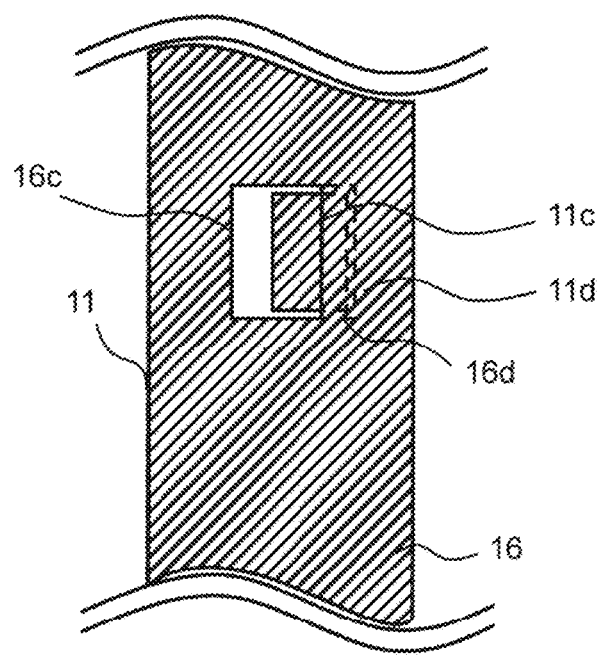
FIG. 3C shows a method of engaging a first engaging portion 11b with a second engaging portion 16b and is a schematic diagram of the support frame 111 for pellicle viewed at a first surface a of the second support frame part 16 located toward the first support frame part 11 in the surface direction of the pattern plate in which the support frame 111 for pellicle is arranged from a side in which a pellicle film is arranged.

FIGS. 1A to 1C are schematic diagrams of a support frame 111 for pellicle according to an embodiment of the present invention. FIG. 1A is a schematic diagram of the support frame 111 for pellicle viewed in the plane direction of the pattern plate (mask) where the support frame 111 for pellicle is arranged from the side where the pellicle film is arranged. The "plane direction of pattern plate" is a direction intersecting the plane of the pattern plate, in the present embodiment, a direction substantially perpendicular to the plane of the pattern plate. FIG. 1B is a cross-sectional view of the support frame 111 for pellicle in the line segment AB of FIG. 1A, and FIG. 1C is a cross-sectional view of the support frame 111 for pellicle in the line segment CD of FIG. 1A. FIGS. 2A to 2D are schematic diagrams illustrating the details of a first support frame part 11 and a second support frame part 16 constituting the support frame 111 for pellicle. FIG. 2A is a schematic diagram illustrating the details of the first support frame part 11, and FIG. 2B is a schematic diagram illustrating the details of the second support frame part 16. FIGS. 2C and 2D are schematic diagrams illustrating a method of sandwiching and fixing a filter 30 by the first support frame part 11 and the second support frame part 16. FIGS. 3A to 3C show a method of engaging a first engaging portion 11b with a second engaging portion 16b. These are schematic diagrams of the support frame 111 for pellicle viewed at a first surface a of the second support frame part 16 located in the first support frame part 11 side toward the surface direction of the pattern plate in which the support frame 111 for pellicle is arranged from a side in which a pellicle film is arranged.

The support frame 111 for pellicle includes the first support frame part 11, the second support frame part 16, and the filter 30. The filter 30 has a flat plate-shaped frame shape. The filter 30 is sandwiched between the first support frame part 11 and the second support frame part 16. In the support frame 111 for pellicle, a vent hole 1 has an hole 3 (also referred to as a first hole) extending in a thickness direction L1 of the support frame 111 for pellicle (the direction substantially intersecting with the plane direction of the pellicle film, and hereinafter referred to as a first direction) inside the support frame 111 for pellicle (It is a side where the closed space is formed when the pellicle is mounted on the pattern plate. The arrow P indicates the closed space portion when the pellicle is mounted on the pattern plate), and an hole 5 (also referred to as a second hole) connected to the hole 3 and extending in the second direction L2 (the direction substantially parallel to the plane direction of the pellicle film) intersecting with a first direction L1. The hole 3 has an opening at an inner edge of the support frame 111 for pellicle, the hole 5 extends to the outside of the closed space portion P, thereby an opening at an outer edge of the support frame 111 for pellicle is included.

As shown in FIGS. 1A and 1B, in order to arrange the filter 30, as an embodiment, the first support frame part 11 has a notch portion N having a stepped configuration in which a part of the upper surface is cut out. In the present embodiment, by arranging the notch portion N to the first support frame part 11 to fix the filter 30 to the support frame 111 for pellicle by sandwiching the filter 30 by the first support frame part 11 and the second support frame part 16, it is possible to arrange the hole 3 in the inner edge of the support frame 111 for pellicle. As described below, a pellicle can be obtained by arranging a pellicle film or a pellicle frame body on the top surface of the support frame 111 for pellicle. Therefore, in the pellicle according to an embodiment of the present invention, the filter 30 is arranged apart from the pellicle film.

The first support frame part 11 has a first body part 11a having a flat plate-shaped frame shape, and a first engaging portion 11b protruding from the first body part 11a in the thickness direction L1 of the support frame 111 for pellicle. The second support frame part 16 includes a second body part 16a having a flat plate-shaped frame shape, and a second engaging portion 16b arranged in a concave part provided in the first direction L1 of the support frame 111 for pellicle of the second body part 16a and engaging with the first engaging portion 16b.

The first engaging portion 11b has a first extending portion 11c extending in the first direction L1 of the support frame 111 for pellicle from the first body part 11a, a second extending portion 11d extending in the second direction L2 intersecting the first direction L1 of the support frame 111 for pellicle from an end of the first extending portion 11c opposite to the first body part 11a. The second engagement portion 16b has a first groove 16c extending in the first direction L1 of the support frame 111 for pellicle from the first surface a of the second support frame part 16 located at the first support frame part 11 side, and a second groove 16d extending in a second direction L2 intersecting the first direction L1 of the support frame 111 for pellicle from the bottom of the first groove 16c. At least a part of the second extending portion 11d is housed in the second groove 16d.

The first support frame part 11 and the second support frame part 16 according to the present embodiment can be formed by casting or injection molding, for example, but are not limited thereto. For example, the first engagement portion 11b may be connected to the first body part 11a to form the first support frame part 11. The second support frame part 16 may be formed by etching the member of flat plate-shaped frame shape. Metals, glasses, silicon wafers, ceramics, resins, and the like are exemplified as a material for the first support frame part 11 and the second support frame part 16.

The filter 30 has an opening b at a position corresponding to the first engaging portion 11b and the second engaging portion 16b, and the first engaging portion 11b engages the second engaging portion 16b through the opening b. Such engagement can be performed by passing the first engaging portion 11b of the first support frame part 11 through the opening b of the filter 30, and further inserting it into the first groove 16c of the second support frame part 16 toward the first direction L1 of the support frame 111 for pellicle, and sliding the first support frame part 11 in the second direction L2 intersecting the first direction L1 of the support frame 111 for pellicle when the first engaging portion 11b reaches the bottom of the second support frame part 16. At this time, since the first body part 11a, the filter 30, and the second body part 16a are the frame shape having the same or substantially the same widths, they can be integrated to form the support frame 111 for pellicle. In the present embodiment, since the filter 30 is one member having the flat plate-shaped frame shape, there is no need to arrange the filter for each vent hole, and it can be easily attached to the support frame 111 for pellicle. In this way, connecting the inner edge and the outer edge of the support frame 111 for pellicle, the vent hole 1 in which the filter 30 is arranged is configured.

For the filter 30, membrane filters such as HEPA and ULPA, non-woven fabric filters, filters in which fibers such as carbon nanotubes and cellulose are stacked, ceramic filters, glass filters, metal sintering filters, hollow paper filters, and the like can be used. The support frame 111 for pellicle according to an embodiment of the present invention can reduce the duration of evacuation because the area of the vent hole can be made large even when the ventilation resistance of the filter 30 is high, and preferably, the filter 30 is a filter having characteristics of an initial pressure loss of 100 Pa or more and 550 Pa or less, and a particle capture rate of 99.7% or more and 100% or less for particles having a particle diameter of 0.15 μm or more and 0.3 μm or less. If a plurality of vent holes 1 is provided, it is preferred that an area of the sum of the filters 30 located in the plurality of vent holes 1, i.e., the area of the sum of the filters 30 available for ventilation between the inside and outside of the pellicle, is between 100 mm$^2$ or more and 2000 mm$^2$ or less. The explanation of this filter is common to the respective embodiments, and therefore, the explanation thereof will be omitted below.

In the support frame 111 for pellicle, by sandwiching the filter 30 by the first support frame part 11 and the second support frame part 16 to engage the first engaging portion 11b and the second engaging portion 16b, the filter 30 is fixed. In this embodiment, since no adhesive is used for fixing the filter 30, the filter 30 can be easily removed from the support frame 111 for pellicle by separating the first support frame part 11 and the second support frame part 16 engaged by the first engaging portion 11b and the second engaging portion 16b. That is, the engagement between the first engaging portion 11b and the second engaging portion 16b is released by sliding the first support frame part 11 in a direction opposed to the second direction L2 or sliding the second support frame part 16 in the second direction L2. The first support frame part 11 and the second support frame part 16 can then be separated by lifting the first support frame part 11 in a direction opposed to the first direction L1, or by lowering the second support frame part 16 in the first direction L1.

In the conventional pellicle, since the filter was arranged for each vent hole, each filter had to be removed. In this embodiment, since the filter 30 is one member having a flat plate-shaped frame shape, if separating the first support frame part 11 and the second support frame part 16, it can be easily removed from the support frame 111 for pellicle.

In an embodiment, the filter 30 can be conveniently replaced by re-sandwiching a new filter as the filter 30 with first support frame part 11 and second support frame part 16. In this embodiment, since no adhesive is used for fixing the filter 30, generation of outgas from the adhesive is reduced, and contamination in a region in the space formed by the pattern plate and the pellicle in which the EUV light is irradiated is suppressed. It is possible to suppress fogging of lenses of an optical system of an exposure device by outgassing from the adhesives, exposure defects, and light deficiency.

The support frame 111 for pellicle is manufactured by preparing the first support frame part 11 including the first body part 11a having a flat frame shape and the first engaging portion 11b protruding in the thickness direction of the pellicle support frame 111 from the first body part 11a, preparing the second support frame part 16 including the second body part 16a having a plate-shaped frame shape and the second engaging portion 16b arranged in the concave part provided in the thickness direction of the pellicle support frame 111 of the second body part 16a and the second engaging portion 16b engaged with the first engaging portion 11b, preparing the filter 30 having a plate-shaped frame shape, sandwiching the filter 30 by the first support frame part 11 and the second support frame part 16, and engaging the first engaging portion 11b and the second engaging portion 16b.

Embodiment 2

In the first embodiment described above, the first body part 11a and the first engaging portion 11b are integrally molded, or the first support frame part 11 in which the first engaging portion 11b is connected to the first body part 11a is used, however, the support frame for pellicle and the pellicle related to the present invention are not limited thereto. Examples of constituting the first support frame part and the second support frame part by laminating a plurality of plate-shaped members will be described as Embodiment 2. Hereinafter, a configuration different from that of Embodiment 1 will be described in particular, and a description of the same configuration as that of Embodiment 1 will be omitted.

Figure 4A:
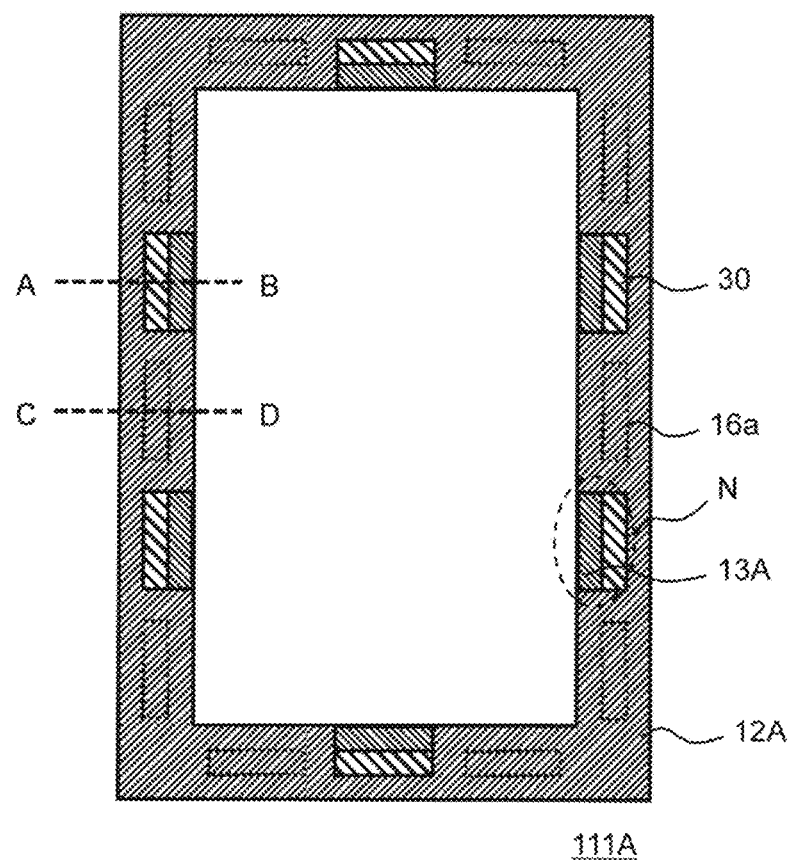
FIG. 4A is a schematic diagram of a support frame 111A for pellicle according to embodiment and is a schematic diagram of the support frame 111A for pellicle viewed in the plane direction of the pattern plate where the support frame 111 for pellicle is arranged from the side where the pellicle film is arranged.
Figure 4B:
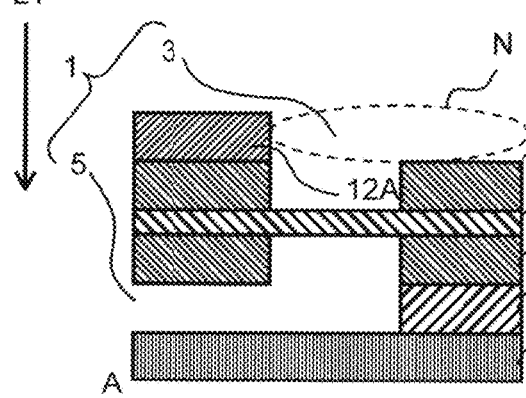
FIG. 4B is a cross-sectional view of the support frame 111A for pellicle in the line segment AB in FIG. 4A.
Figure 4C:
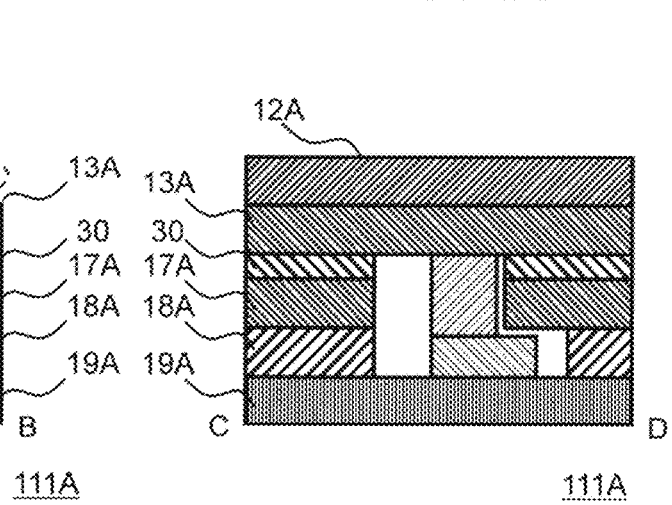
FIG. 4C is a cross-sectional view of the support frame 111A for pellicle in the line segment CD in FIG. 4A.
Figure 5A:
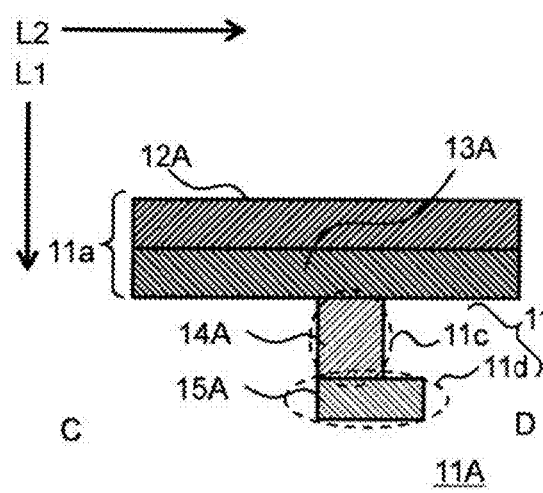
FIG. 5A is a schematic diagram illustrating details of a first support frame part 11A and a second support frame part 16A constituting the support frame 111A for pellicle according to the embodiment and is a schematic diagram illustrating details of the first support frame part 11A.
Figure 5B:
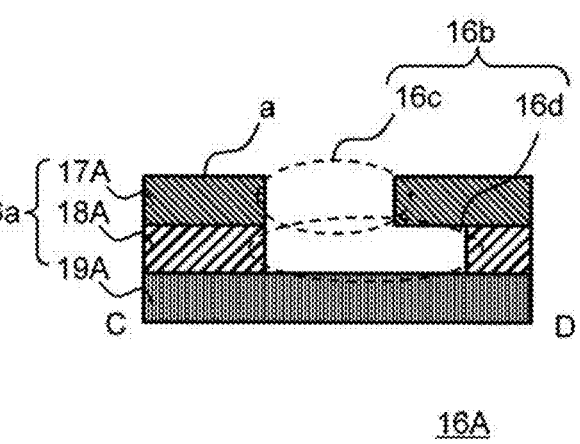
FIG. 5B is a schematic diagram illustrating details of the second support frame part 16A
Figure 5C:
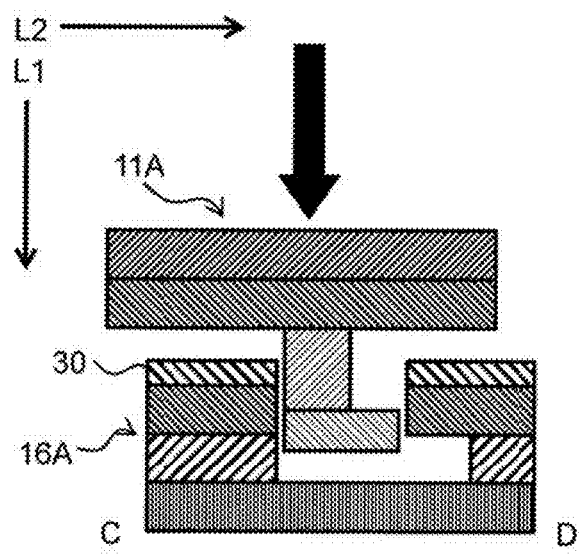
FIG. 5C is a schematic diagram illustrating a method of sandwiching and fixing a filter 30 by the first support frame part 11A and the second support frame part 16B.
Figure 5D:
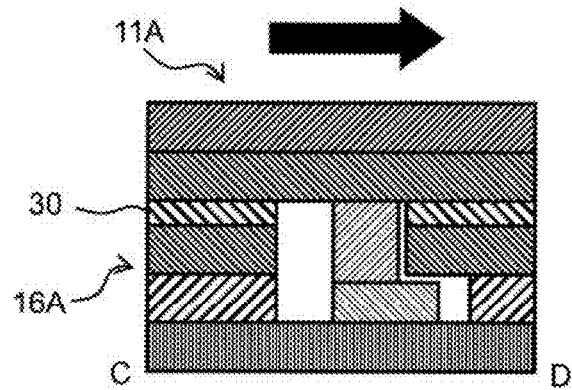
FIG. 5D is a schematic diagram illustrating a method of sandwiching and fixing a filter 30 by the first support frame part 11A and the second support frame part 16B.

FIGS. 4A to 4C are schematic diagrams of a support frame 111A for pellicle according to an embodiment of the present invention. FIG. 4A is a schematic diagram of the support frame 111A for pellicle viewed in the plane direction of the pattern plate where the support frame 111A for pellicle is arranged from the side where the pellicle film is arranged. FIG. 4B is a cross-sectional view of the support frame 111A for pellicle in the line segment AB of FIG. 4A, and FIG. 4C is a cross-sectional view of the support frame 111A for pellicle in the line segment CD of FIG. 4A. FIG. 5A to 5D are schematic diagrams illustrating the details of a first support frame part 11A and a second support frame part 16A constituting the support frame 111A for pellicle. FIG. 5A is a schematic diagram illustrating the details of the first support frame part 11A, and FIG. 5B is a schematic diagram illustrating the details of the second support frame part 16A. FIGS. 5C and 5D are schematic diagrams illustrating a method of sandwiching and fixing a filter 30 by the first support frame part 11A and the second support frame part 16A.

The support frame 111A for pellicle includes the first support frame part 11A, the second support frame part 16A, and the filter 30. The filter 30 is sandwiched by the first support frame part 11A and the second support frame part 16A. The first support frame part 11A, for example, includes a first body part 11a constituted by laminating a thin plate 12A having a flat plate-shaped frame shape and a thin plate 13A having a flat plate-shaped frame shape arranged on the lower surface of the thin plate 12A. In the present embodiment, the notch portion N of the first support frame part 11A is configured by arranging the thin plate 12A on the upper surface of the thin plate 13A, and the hole 3 extending in the first direction L1 can be arranged on the inner edge of the support frame 111A for pellicle.

The first support frame part 11A includes the first engagement portion 11b formed by stacking a thin plate 14A extending in the first direction L1 of the support frame 111A for pellicle from the lower surface of the thin plate 13A and a thin plate 15A arranged on the lower surface of the thin plate 14A and extending in the second direction L2 of the support frame 111A for pellicle intersecting with the first direction L1 from the thin plate 14A. In the present embodiment, the first extending portion 11c extending from the first body part 11a in the first direction L1 of the support frame 111A for pellicle is configured by the thin plate 14A. The second extending portion 11d extending in the second direction L2 from the end of the first extending portion 11c opposite to the first body part 11a is constituted by the thin plate 15A.

The second support frame part 16A includes a second body part 16a constructed by sequentially stacking a thin plate 18A having a flat plate-shaped frame shape and a thin plate 17A having a flat plate-shaped frame shape on the upper surface of a thin plate 19A having a flat plate-shaped frame shape. In this embodiment, as will be described later, a concave part is arranged on the outer edge of the thin plate 18A, and the hole 5 extending in the second direction L2 of the support frame 111A for pellicle can be arranged by sandwiching the concave part between the thin plate 17A and the thin plate 19A.

The first groove 16c is arranged in the thin plate 17A, the second groove 16d is arranged in the thin plate 18A. By sequentially stacking the thin plate 18A and the thin plate 17A on the upper surface of the thin plate 19A, the first groove 16c extending in the first direction L1 and the second groove 16d extending in the second direction L2 are overlapped to form a concave part in the second support frame part 16A. The concave part functions as the second engaging portion 16b which engages with the first engaging portion 11b. At least a part of the second extending portion 11d is housed in the second groove 16d, and the first engaging portion 11b and the second engaging portion 16b are engaged each other.

Figure 6A:
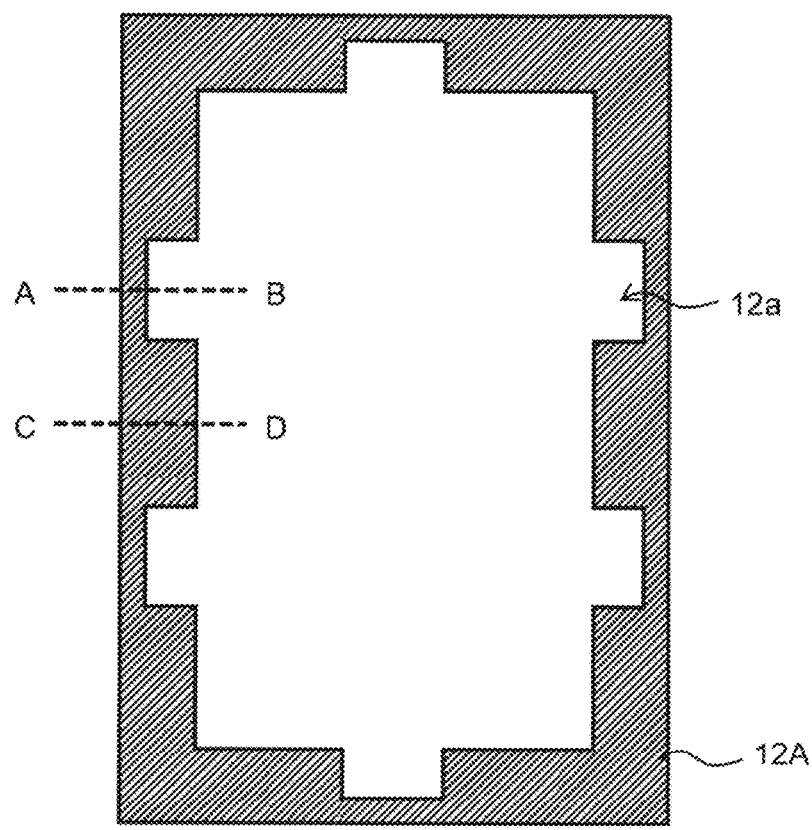
FIG. 6A is a schematic diagram of a thin plate 12A according to an embodiment and is a top view of a thin plate 12A.
Figure 6B:
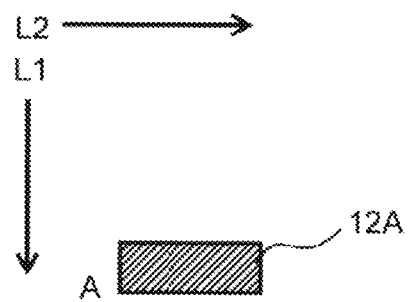
FIG. 6B is a cross-sectional view of the thin plate 12A in the line segment AB shown in FIG. 6A.
Figure 6C:
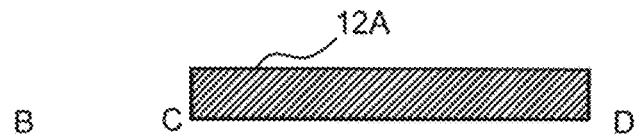
FIG. 6C is a cross-sectional view of the thin plate 12A in the line segment CD shown in FIG. 6A.

Here, the respective thin plate constituting the first support frame part 11A and the second support frame part 16A will be further described. FIGS. 6A to 6C are schematic diagrams of the thin plate 12A. FIG. 6A is a top view of the thin plate 12A, FIG. 6B is a cross-sectional view of the thin plate 12A in the line segment AB shown in FIG. 6A, and FIG. 6C is a cross-sectional view of the thin plate 12A in the line segment CD shown in FIG. 6A. The thin plate 12A has, for example, a rectangular frame shape, and has a concave part (recess shape) 12a connected to the inner edge of the frame (which is the side where the pellicle film is extended and the side where the closed space is formed when used as a pellicle) and recessed in the second direction. There is no particular limitation on the number of the concave part 12a, it is possible to provide a plurality of concave parts 12a for the filters 30 which are sufficient to ventilate the closed space and the outside of the pellicle. As shown in FIG. 6C, the region adjacent to the concave part 12a has a width corresponding to the width of the first body part 11a and imparts the required strength to the first support frame part 11A. Metals, glasses, silicon wafers, ceramics, and resins are exemplified as a material for thin plate 12A. In the present embodiment, the opening formed by the concave part 12a corresponds to the hole of the first direction L1.

Figure 7A:
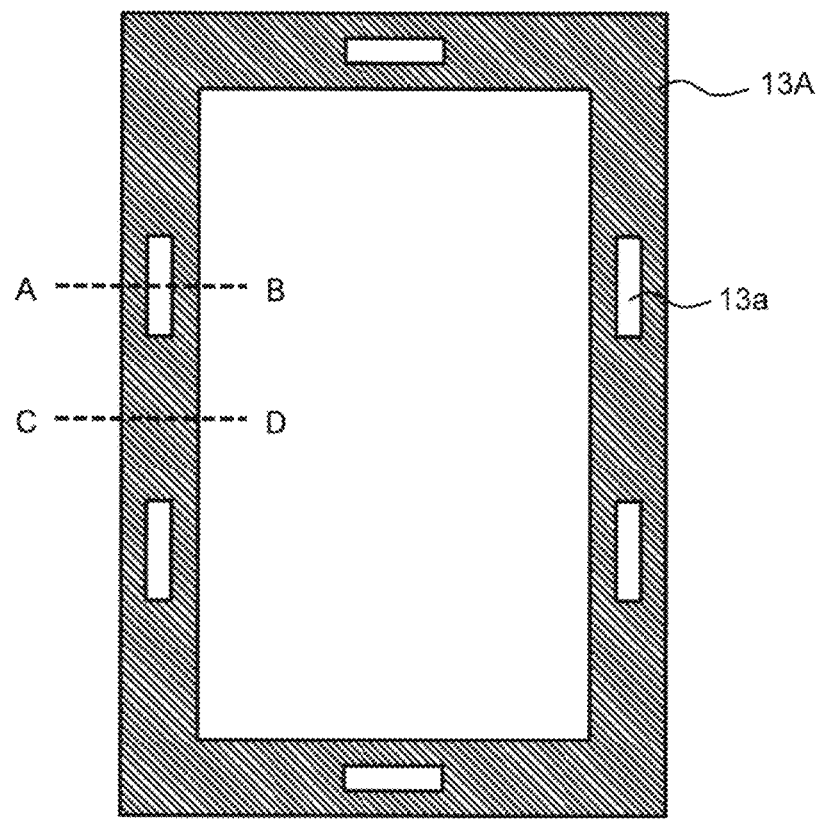
FIG. 7A is a schematic diagram of a thin plate 13A according to an embodiment and is a top view of the thin plate 13A.
Figure 7B:
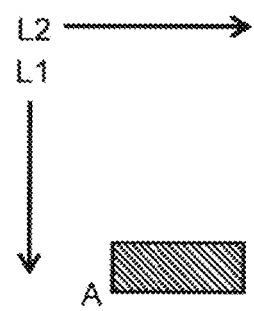
FIG. 7B is a cross-sectional view of the thin plate 13A in the line segment AB shown in FIG. 7A.
Figure 7C:
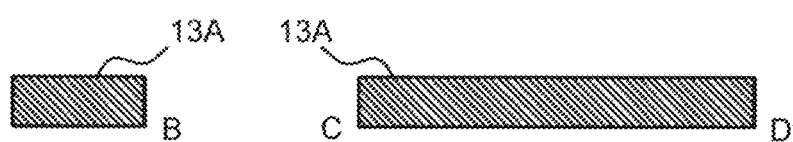
FIG. 7C is a cross-sectional view of the thin plate 13A in the line segment CD shown in FIG. 7A.

FIGS. 7A to 7C are schematic diagrams of the thin plate 13A. FIG. 7A is a top view of the thin plate 13A, FIG. 7B is a cross-sectional view of the thin plate 13A in the line segment AB shown in FIG. 7A, and FIG. 7C is a cross-sectional view of the thin plate 13A in the line segment CD shown in FIG. 7A. The thin plate 13A has, for example, a rectangular frame shape, and has an opening 13a opened in the first direction L1. The concave part 12a and the opening 13a at least partially overlap and constitute the hole 3 extending in the first direction L1. The number of the opening 13a is not particularly limited, and a number corresponding to the concave part 12a can be provided. As shown in FIG. 7C, the region adjacent to the opening 13a has a width corresponding to the width of the first body part 11a and imparts the required strength to the first support frame part 11A. Metals, glasses, silicon wafers, ceramics, and resins are exemplified as a material for the thin plate 13A.

Figure 8A:
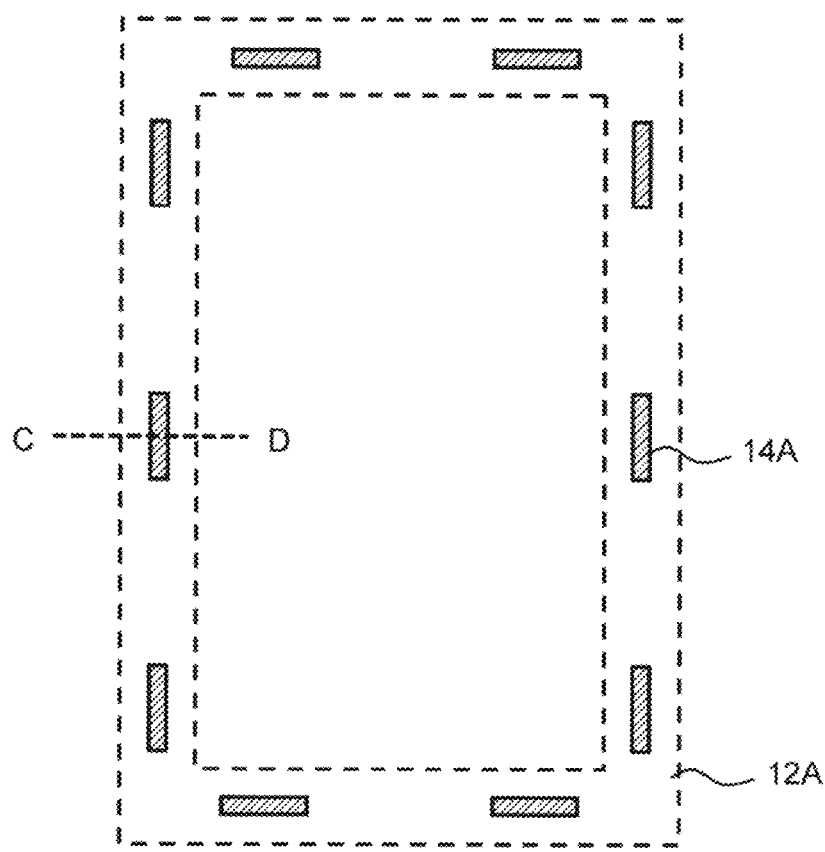
FIG. 8A is a schematic diagram of a thin plate 14A according to an embodiment and is a top view of the thin plate 14A.
Figure 8B:
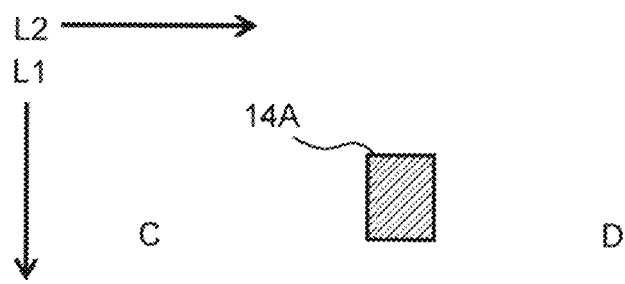
FIG. 8B is a cross-sectional view of the thin plate 14A in the line segment CD shown in FIG. 8A.

FIGS. 8A to 8B are schematic diagrams of the thin plate 14A. FIG. 8A is a top view of the thin plate 14A, and FIG. 8B is a cross-sectional view of the thin plate 14A in the line segment CD shown in FIG. 8A. The thin plate 14A has, for example, a rectangular shape, and is connected to the lower surface of the thin plate 13A, and constitutes the first extending portion 11c extending from the first body part 11a in the first direction L1 of the support frame 111A for pellicle. The thin plate 14A is arranged on a region adjacent to the region where the thin plate 13A in which the opening 13a is arranged. It is not particularly limited to the number of the thin plate 14A, it is preferably arranged on the region of the thin plate 13A located both sides of the opening 13a. That is, in the present embodiment, by arranging the first engaging portion 11b and the second engaging portion 16b on both sides of the vent hole 1, the first support frame part 11A and the second support frame part 16A can increase the strength to engage, air leakage when venting through the filter is reduced. Metals, glasses, silicon wafers, ceramics, and resins are exemplified as a material for the thin plate 14A.

Figure 9A:
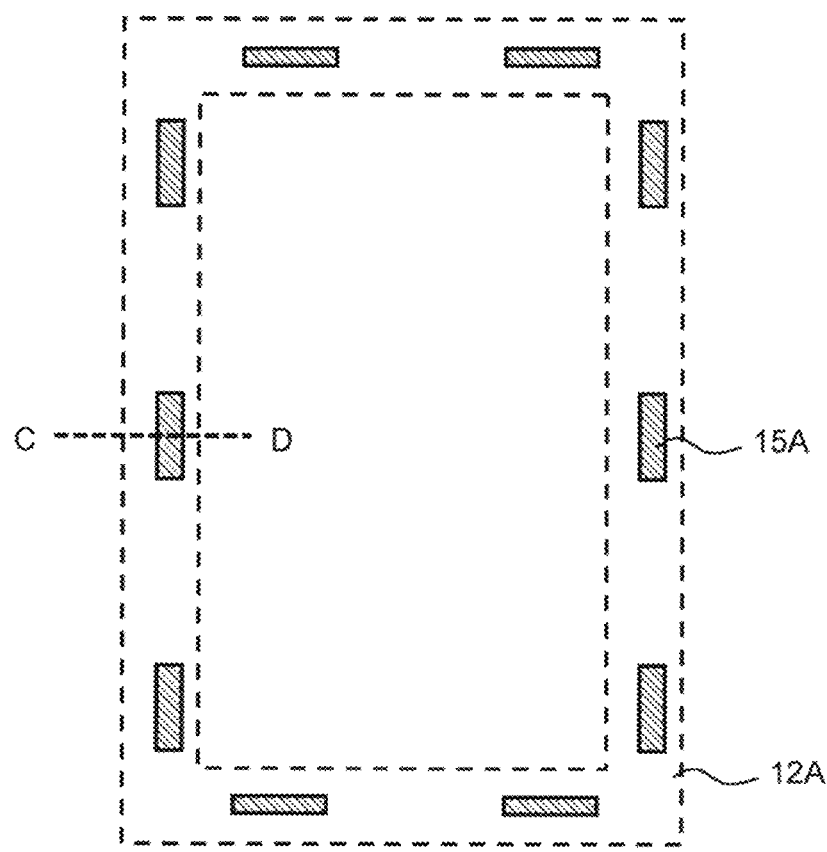
FIG. 9A is a schematic diagram of a thin plate 15A according to an embodiment and is a top view of the thin plate 15A.
Figure 9B:
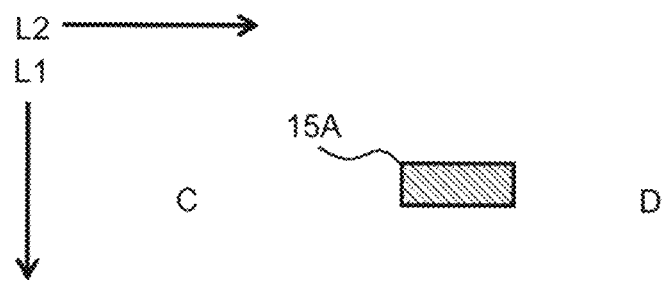
FIG. 9B is a cross-sectional view of the thin plate 15A in the line segment CD shown in FIG. 9A.

FIGS. 9A to 9B are schematic diagrams of the thin plate 15A. FIG. 9A is a top view of the thin plate 15A, and FIG. 9B is a cross-sectional view of the thin plate 15A in the line segment CD shown in FIG. 9A. The thin plate 15 A has, for example, a rectangular shape, and is connected to the lower surface of the thin plate 14A and constitutes the second extending portion 11d extending in the second direction L2 of the support frame 111A for pellicle. Therefore, the thin plate 15A extends in a predetermined length in the second direction L2 than the thin plate 14A. The part of thin plate 15A extending from the thin plate 14A in the second orientation L2 participates in engagement with the second engaging portion 16b. Here, the length of the part of thin plate 15A extending in the second direction L2 can be arbitrarily set as long as the strength at which the first support frame part 11A and the second support frame part 16A engage with each other can be obtained. Longer parts of the thin plate 15A extending in the second orientation L2 increase the reliability of engagement of the first support frame part 11A with the second support frame part 16A. On the other hand, when fixing the filter 30 by sandwiching between the first support frame part 11A and the second support frame part 16A, a distance in which the first support frame part 11A is moved in the second direction L2 in contact with the filter 30 becomes long, there is a possibility that dust from the filter 30 occurs due to friction between the first support frame part 11A and the filter 30. The number of the thin plate 15A is not particularly limited and the thin plate 15A is arranged in a number corresponding to the number of the thin plate 14A. Metals, glasses, silicon wafers, ceramics, and resins are exemplified as a material for the thin plate 15A.

Figure 10A:
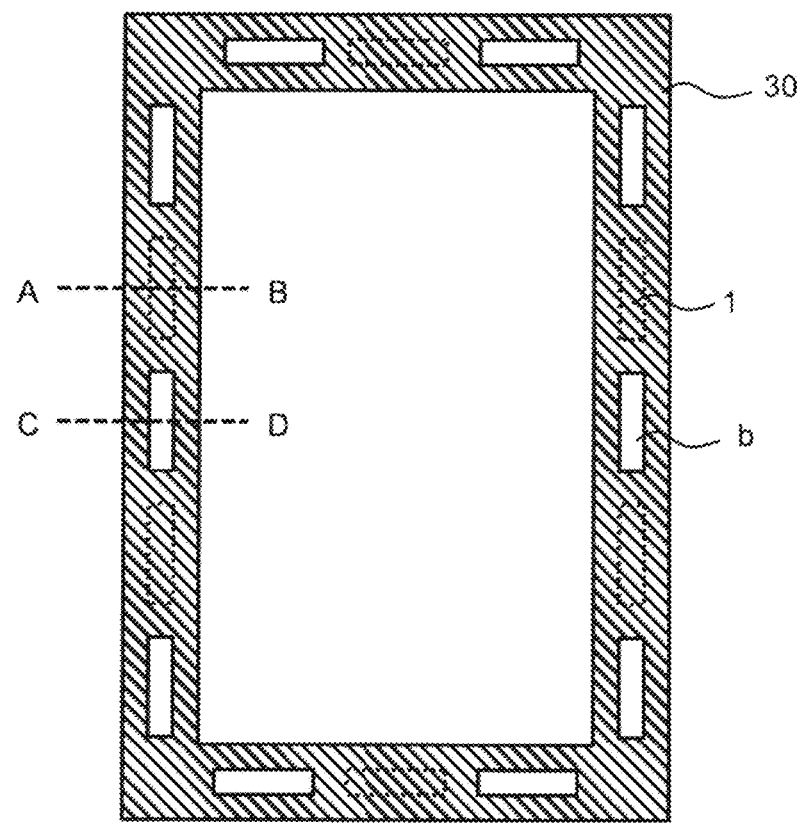
FIG. 10A is a schematic diagram of a filter 30 according to an embodiment and is a top view of the filter 30.
Figure 10B:
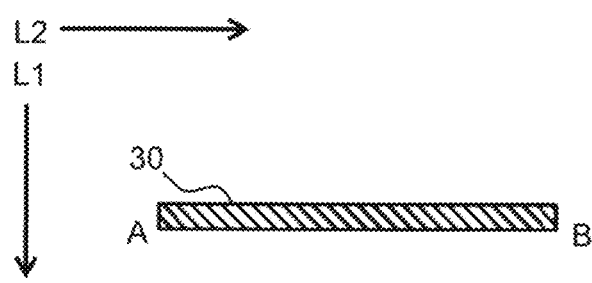
FIG. 10B is a cross-sectional view of the filter 30 in the line segment AB shown in FIG. 10A.
Figure 10C:
FIG. 10C is a cross-sectional view of the filter 30 in the line segment CD shown in FIG. 10A.

FIGS. 10A to 10C are schematic diagrams of the filter 30. FIG. 10A is a top view of the filter 30, FIG. 10B is a cross-sectional view of the filter 30 in the line segment AB shown in FIG. 10A, and FIG. 10C is a cross-sectional view of the filter 30 in the line segment CD shown in FIG. 10A. The filter 30, for example, a rectangular shape, has the opening b at a position corresponding to the first engaging portion 11b and the second engaging portion 16b. That is, the opening b is arranged at the position of the filter 30 corresponding to a region adjacent to the region where the opening 13a of the thin plate 13A is arranged. In the filter 30, what functions as the filter of the support frame 111A for pellicle is a part corresponding to the vent hole 1. Other configurations of the filter 30 may be the same as those described in the first embodiment, and a detailed description thereof is omitted.

Figure 11A:
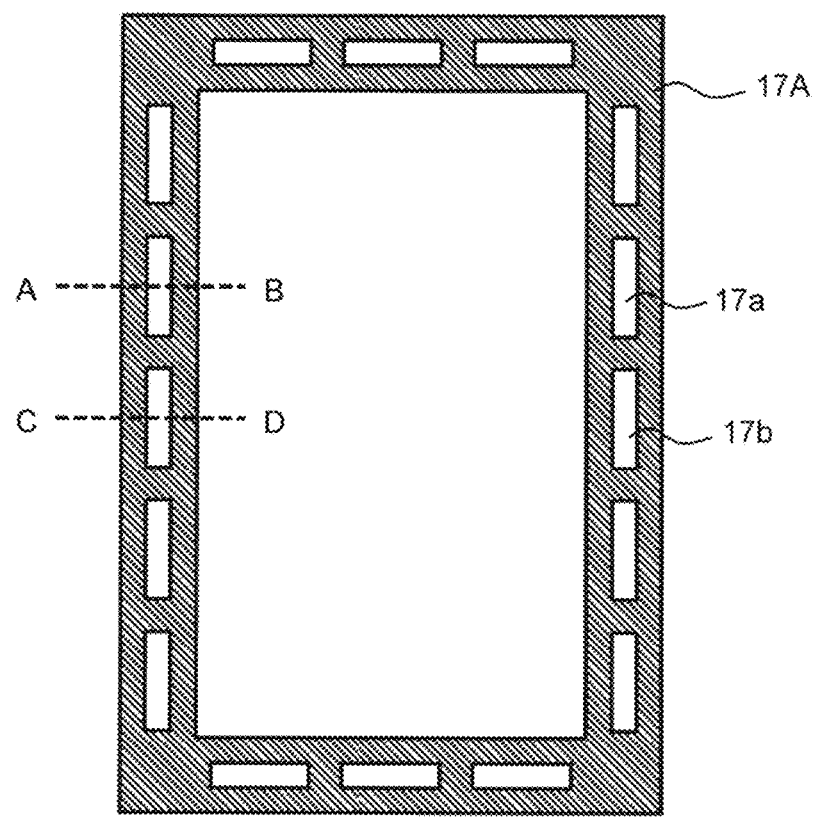
FIG. 11A is a schematic diagram of a thin plate 17A according to an embodiment and is a top view of the thin plate 17A.
Figure 11B:
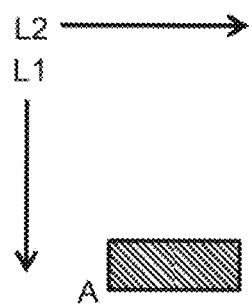
FIG. 11B is a cross-sectional view of the thin plate 17A in the line segment AB shown in FIG. 11A.
Figure 11C:
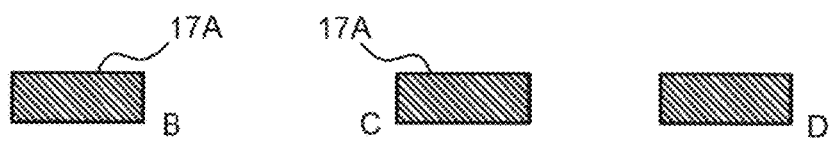
FIG. 11C is a cross-sectional view of the thin plate 17A in the line segment CD shown in FIG. 11A.

FIGS. 11A to 11C are schematic diagrams of the thin plate 17A. FIG. 11A is a top view of the thin plate 17A, FIG. 11B) is a cross-sectional view of the thin plate 17A in the line segment AB shown in FIG. 11A, and FIG. 11C is a cross-sectional view of the thin plate 17A in the line segment CD shown in FIG. 11A. The thin plate 17A has, for example, a rectangular frame shape, and has an opening 17a opened in the first direction L1, and an opening 17b arranged adjacent to the opening 17a. The opening 17a is arranged at a position corresponding to the opening 13a of the thin plate 13A and constitutes the hole 3 extending in the first direction L1 together with the opening 13a. The opening 17b corresponds to the first groove 16c extending in the first direction L1 and constitutes the second engaging portion 16b. There is no particular limitation on the number of the opening 17a, and the opening 17a can be arranged at a position corresponding to the first engaging portion 11b arranged on the first support frame part 11A. Metals, glasses, silicon wafers, ceramics, and resins are exemplified as a material for the thin plate 17A.

Figure 12A:
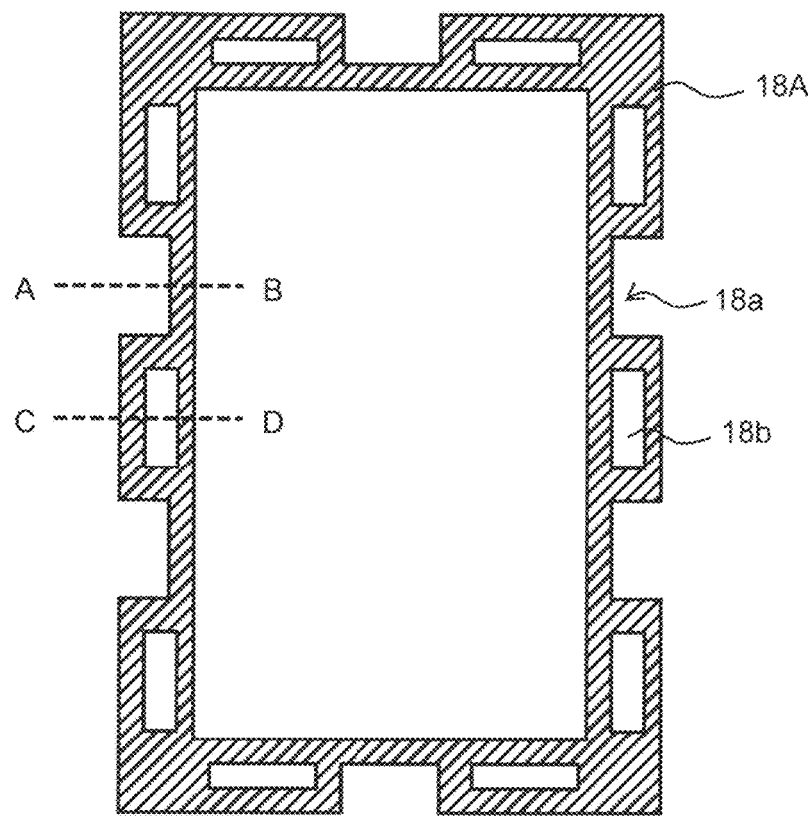
FIG. 12A is a schematic diagram of a thin plate 18A according to an embodiment and is a top view of the thin plate 18A.
Figure 12B:
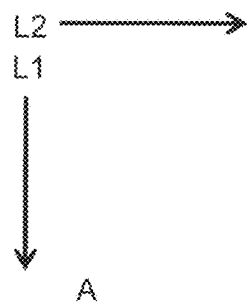
FIG. 12B is a cross-sectional view of the thin plate 18A in the line segment AB shown in FIG. 12A.
Figure 12C:
FIG. 12C is a cross-sectional view of the thin plate 18A in the line segment CD shown in FIG. 12A.

FIGS. 12A to 12C are schematic diagrams of the thin plate 18A. FIG. 12A is a top view of the thin plate 18A, FIG. 12B is a cross-sectional view of the thin plate 18A in the line segment AB shown in FIG. 12A, and FIG. 12C is a cross-sectional view of the thin plate 18A in the line segment CD shown in FIG. 12A. The thin plate 18A is, for example, a rectangular frame shape, and has a concave part (recess shape) 18a connected to the outer edge of the frame (which is the side that does not form a closed space when used as a pellicle) and recessed in the second direction. There is no particular limitation on the number of the concave part 18a, and a plurality of openings may be provided for the filters 30 that are sufficient to ventilate the closed space of the pellicle and the outside. In the present embodiment, a hole formed by the concave part 18a sandwiched between the thin plate 17A and the thin plate 19A corresponds to the hole 5 connected to the outer edge of the support frame 111A for pellicle (which is the side opposite to the inside of the support frame 111A for pellicle and which does not form a closed space when used as a pellicle) and extending in the second direction L2. The thin plate 18A has an opening 18b opened in a predetermined width larger in the second direction L2 than the opening 17a. The opening 18b constitutes the second groove 16d extending in the second direction L2 by sandwiching by thin plate 17A and thin plate 19A. The first groove 16c and the second groove 16d are connected to constitute the second engaging portion 16b. The shape of the thin plate 18A itself can also be appropriately set shape according to the shape of the desired frame body. The part of the opening 18b extending from the opening 17a in the second direction L2 participates in the engagement with the first engagement portion 11b. Here, the width of the portion of the opening 18b extending in the second direction L2 can be arbitrarily set as long as the strength of engagement between the first support frame part 11A and the second support frame part 16A can be obtained. Increasing the width of the portion of the opening 18b extending in the second direction L2 increases the reliability of engagement of the first support frame part 11A with the second support frame part 16A. On the other hand, when fixing the filter 30 by sandwiching between the first support frame part 11A and the second support frame part 16A, a distance in which the first support frame part 11A is moved in the second direction L2 in contact with the filter 30 becomes long, dust from the filter 30 is caused by the friction between the first support frame part 11A and the filter 30. Metals, glasses, silicon wafers, ceramics, and resins are exemplified as a material for the thin plate 18A.

Figure 13A:
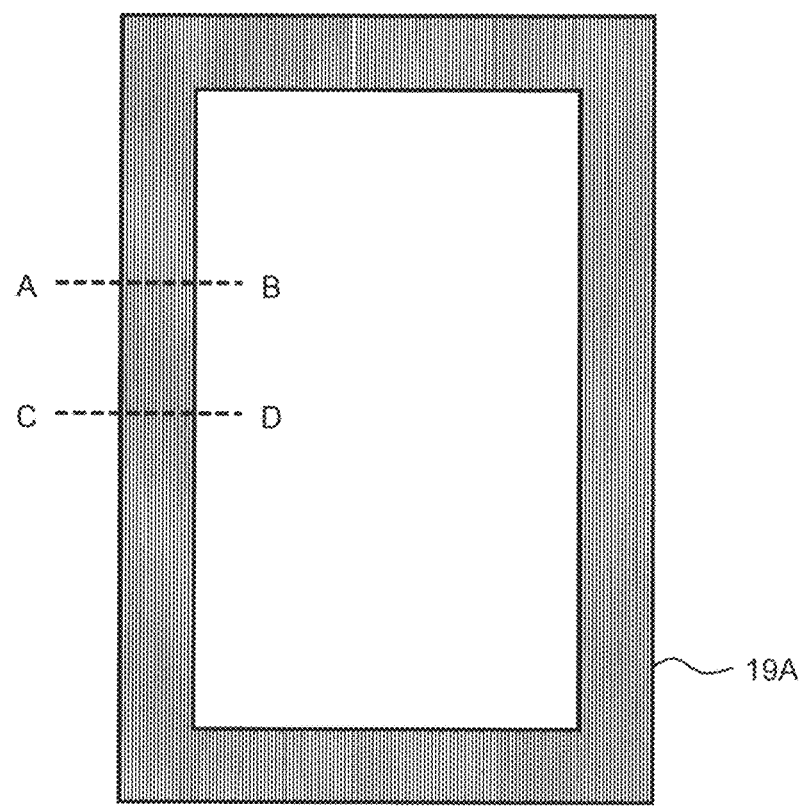
FIG. 13A is a schematic diagram of a thin plate 19A according to an embodiment and is a top view of the thin plate 19A.
Figure 13B:
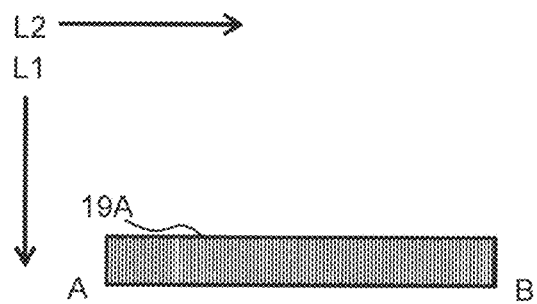
FIG. 13B is a cross-sectional view of the thin plate 19A in the line segment AB shown in FIG. 13A.
Figure 13C:
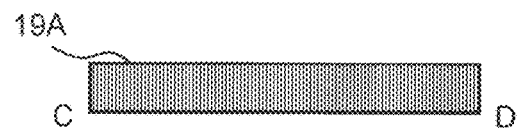
FIG. 13C is a cross-sectional view of the thin plate 19A at the line segment CD shown in FIG. 13A.

FIGS. 13A to 13C are schematic diagrams of the thin plate 19A. FIG. 13A is a top view of the thin plate 19A, FIG. 13B is a cross-sectional view of the thin plate 19A in the line segment AB shown in FIG. 13A, and FIG. 13C is a cross-sectional view of the thin plate 19A in the line segment CD shown in FIG. 13A. The thin plate 19A functions as a bottom plate in the support frame 111A for pellicle, and has, for example, a rectangular frame shape, but can be appropriately set in accordance with a desired shape of frame body. Metals, glasses, silicon wafers, ceramics, and resins are exemplified as a material for the thin plate 19A. Each thin plate described above may be formed by combining the thin plate formed of the same kind of material, or may be formed by combining the thin plate formed of different materials, or may be formed by combining the thin plate formed of partly the same kind of material.

In the present embodiment, the fixing of the thin plate is not particularly limited as long as it is fixed. Examples of the fixing method include an adhesive sheet, an adhesive, a bonding agent, a normal temperature bonding, a direct bonding, atomic diffusion bonding, metal bonding, welding, solder bonding, thermocompression bonding, hot melt, flux bonding, a surface fastener, a mechanical fixing such as screw, pin, clip and caulking, and a method of fixing sandwiched by using magnetism and the like.

The attachment of the filter 30 to the support frame 111A for pellicle and detachment of the filter 30 from the support frame 111A for pellicle can be performed by the method described in Embodiment 1. The first engaging part 11b of the first support frame part 11A is passed through the opening b of the filter 30, further inserting in the first groove 16c of the second support frame part 16A toward the first direction L1 of the support frame 111A for pellicle, by sliding the first support frame part 11A in the second direction L2 intersecting the first direction L1 of the support frame 111A for pellicle when the first engaging part 11b reaches the bottom of the second support frame part 16A, it is possible to engage the first engaging part 11b and the second engaging part 16b. By sandwiching the filter 30 by the first support frame part 11A and the second support frame part 16A, the inner edge and the outer edge of the support frame 111A for pellicle are connected to form the vent hole 1 in which the filter 30 is arranged. In this embodiment, the filter 30 is one member with the flat plate-shaped frame shape, so it is not required to arrange the filter per the vent hole and can be conveniently attached to the support frame 111A for pellicle. In the present embodiment, since adhesives are not used to fix the filter 30, the filter 30 can be easily removed from the support frame 111A for pellicle by separating the first support frame part 11A and the second support frame part 16A engaged by the first engaging portion 11b and the second engaging portion 16b. In the conventional pellicle, since the filter was arranged for each vent hole, each filter had to be removed. In this embodiment, the filter 30 is one member having the flat plate-shaped frame shape, by separating the first support frame part 11A and the second support frame part 16A, and the filter 30 can be easily removed from the support frame 111A for pellicle.

In an embodiment, the filter 30 can be conveniently replaced by re-sandwiching a new filter as the filter 30 with the first support frame part 11A and the second support frame part 16A. In this embodiment, since no adhesive is used for fixing the filter 30, generation of outgas from the adhesive is reduced, and contamination in the region in the space formed by the pattern plate and the pellicle in which the EUV light is irradiated is suppressed. It is possible to suppress fogging of the lenses of optical system of the exposure device due to outgassing from the adhesives, exposure defects, and light deficiency.

The present embodiment is not limited to this, and the direction in which the first engaging portion 11b of the first support frame part 11A is arranged and the direction in which the second engaging portion 16b is arranged may be arranged in opposite directions to the second direction L2. That is, a sliding direction in the second direction L2 when engaging the first engaging portion 11b and the second engaging portion 16b, and a sliding direction in the second direction L2 when releasing the engagement between the first engaging portion 11b and the second engaging portion 16b may be set in the opposite direction to the second direction L2 of the second embodiment. The direction in which the first support frame part 11A is slid to the second support frame part 16A when the filter 30 is sandwiched may be set to the first direction L1.

Embodiment 3

In the above-described embodiment, the first engaging portion 11b and the second engaging portion 16b are engaged by sliding the first support frame part 11 in one direction, the engagement of the first engaging portion 11b and the second engaging portion 16b is released by sliding the first support frame part 11 in the opposite direction. In this embodiment, a method of locking the first support frame part 11 by sequentially sliding the first support frame part 11 in two directions will be described.

Figure 14A:
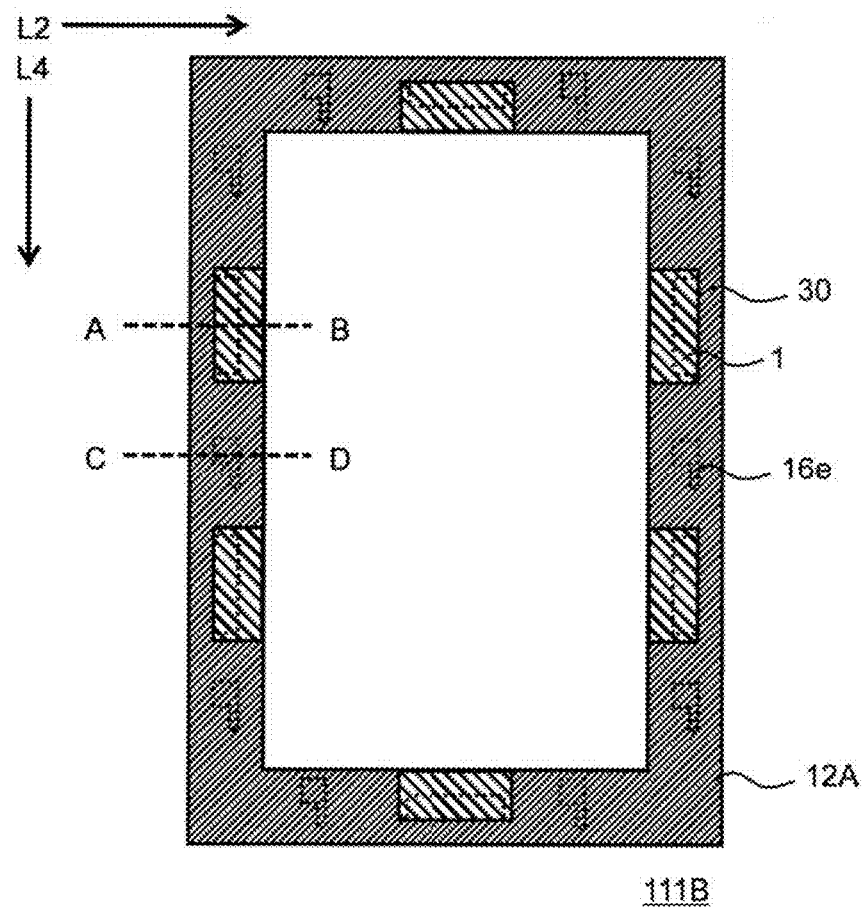
FIG. 14A is a schematic diagram of a support frame 111B for pellicle according to an embodiment and is a schematic diagram of the support frame 111B for pellicle viewed in the plane direction of the pattern plate where the support frame 111B for pellicle is arranged from the side where the pellicle film is arranged.
Figure 14B:
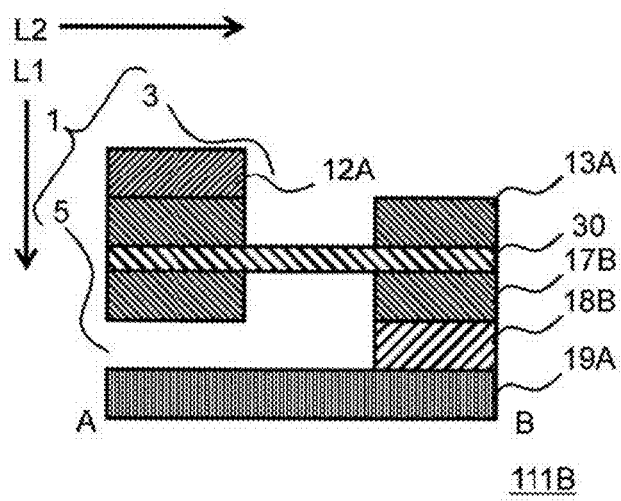
FIG. 14B is a cross-sectional view of the support frame 111B for pellicle in the line segment AB in FIG. 14A.
Figure 14C:
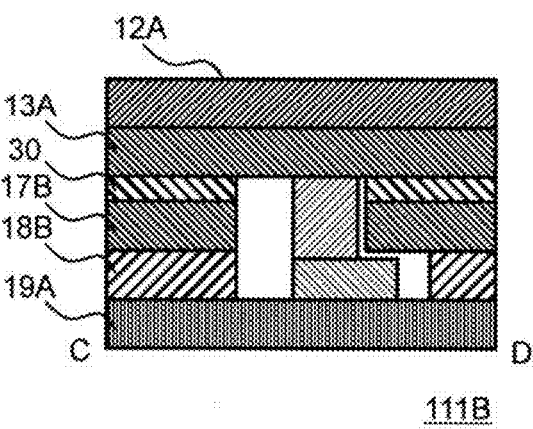
FIG. 14C is a cross-sectional view of the support frame 111B for pellicle in the line segment CD in FIG. 14A.
Figure 15A:
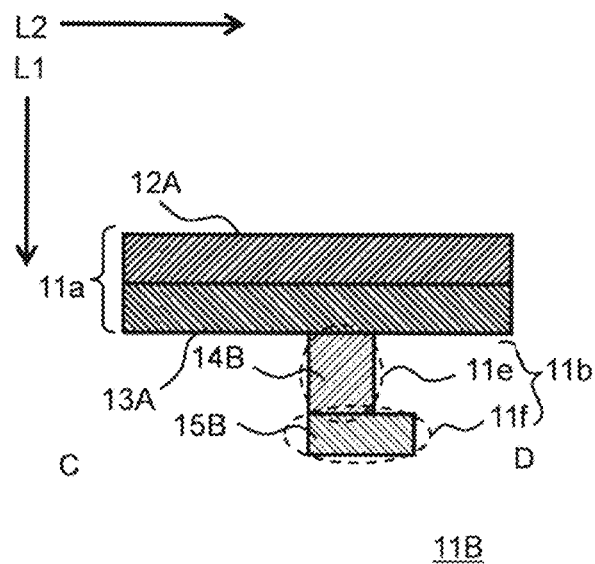
FIG. 15A is a schematic diagram illustrating details of a first support frame part 11B and a second support frame part 16B constituting the support frame 111B for pellicle according to the embodiment and is a schematic diagram illustrating details of the first support frame part 11B.
Figure 15B:
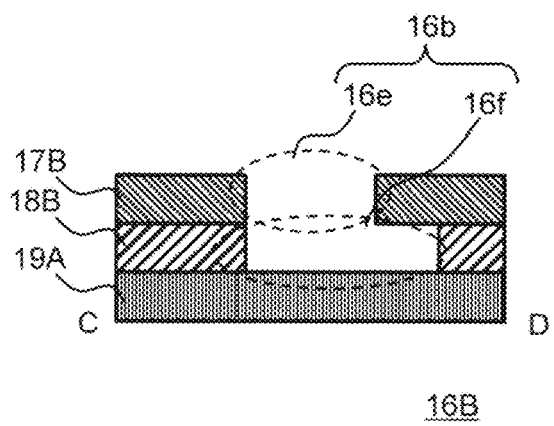
FIG. 15B is a schematic diagram illustrating details of the second support frame part 16B.
Figure 15C:
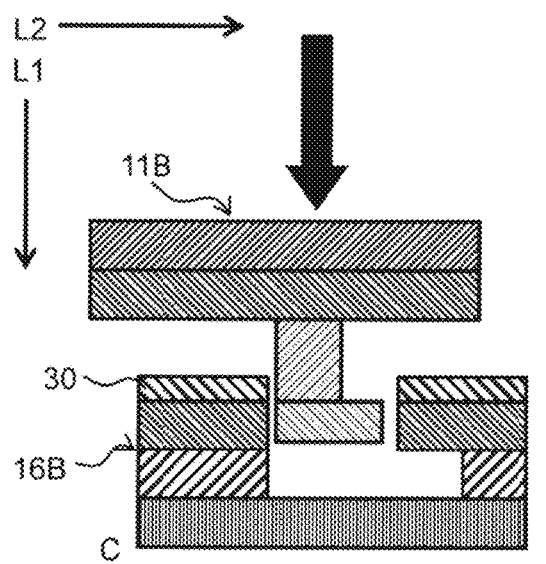
FIG. 15C is a schematic diagram illustrating a method of sandwiching and fixing the filter 30 by the first support frame part 11B and the second support frame part 16B.
Figure 15D:
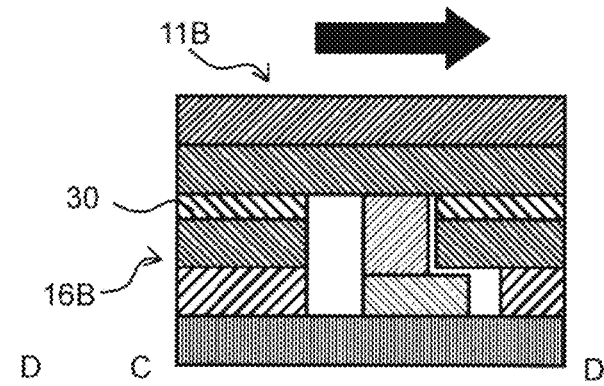
FIG. 15D is a schematic diagram illustrating a method of sandwiching and fixing the filter 30 by the first support frame part 11B and the second support frame part 16B.
Figure 16A:
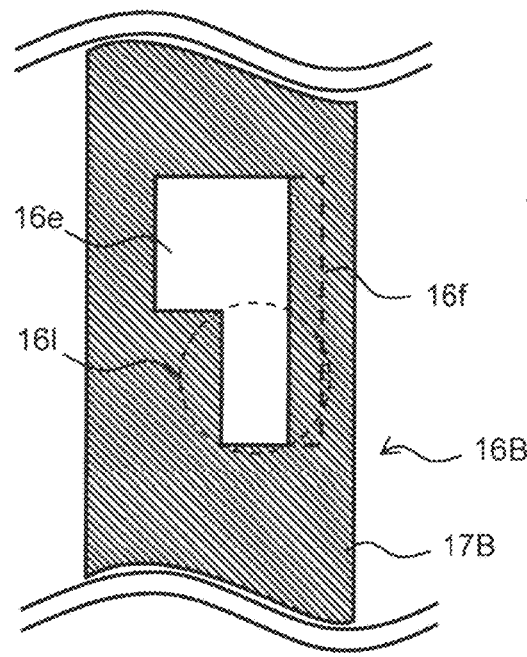
FIG. 16A shows a method of engaging a first engaging portion 11b with a second engaging portion 16b and is schematic diagrams of the support frame 111B for pellicle viewed at a first surface a of the second support frame part 16B located toward the first support frame part 11B side in the surface direction of the pattern plate in which the support frame 111B for pellicle is arranged from a side in which a pellicle film is arranged.
Figure 16B:
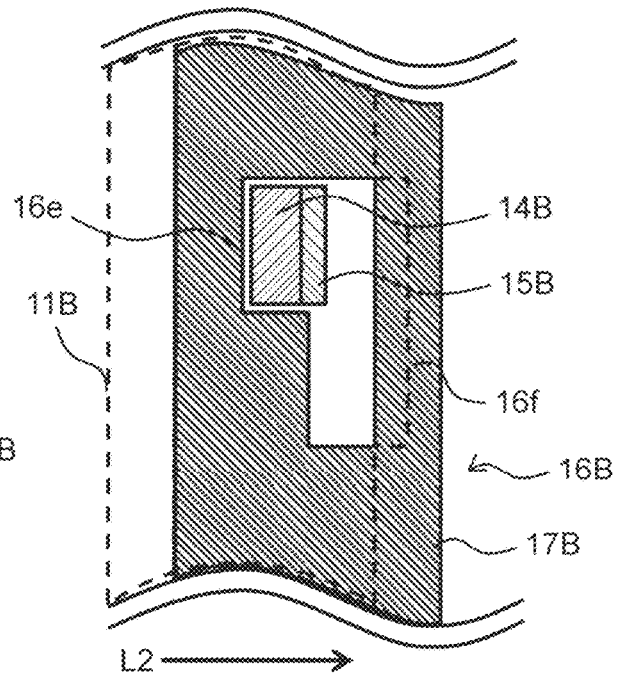
FIG. 16B shows a method of engaging a first engaging portion 11b with a second engaging portion 16b and is schematic diagrams of the support frame 111B for pellicle viewed at a first surface a of the second support frame part 16B located toward the first support frame part 11B side in the surface direction of the pattern plate in which the support frame 111B for pellicle is arranged from a side in which a pellicle film is arranged.
Figure 16C:
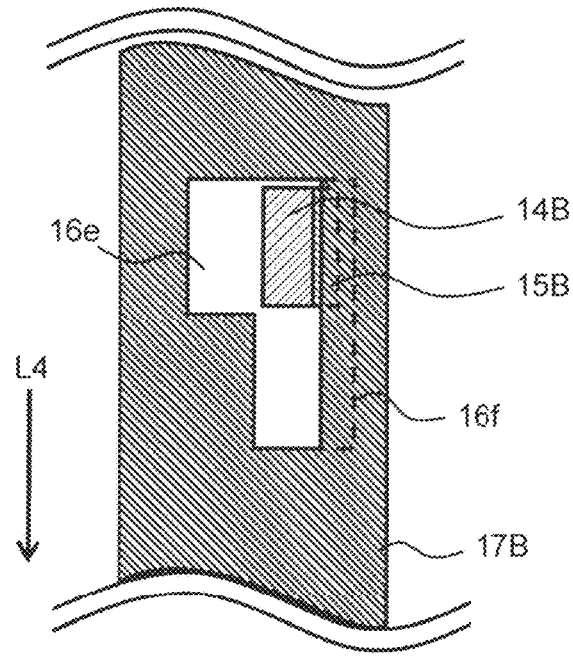
FIG. 16C shows a method of engaging a first engaging portion 11b with a second engaging portion 16b and is schematic diagrams of the support frame 111B for pellicle viewed at a first surface a of the second support frame part 16B located toward the first support frame part 11B side in the surface direction of the pattern plate in which the support frame 111B for pellicle is arranged from a side in which a pellicle film is arranged.
Figure 16D:
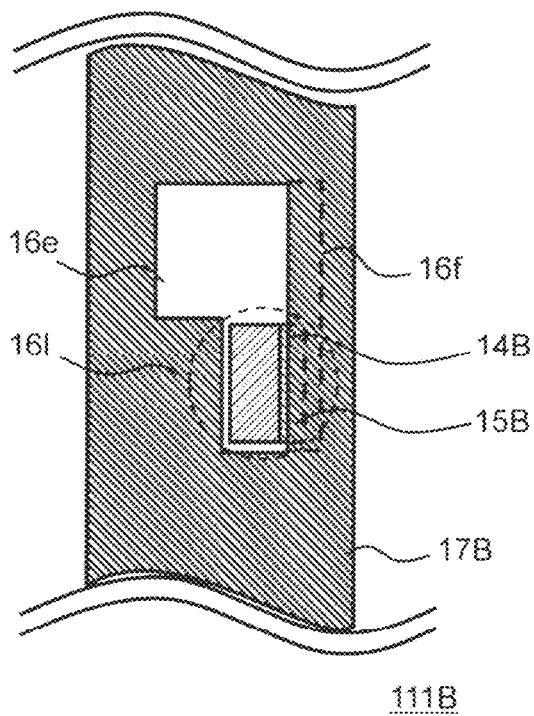
FIG. 16D shows a method of engaging a first engaging portion 11b with a second engaging portion 16b and is schematic diagrams of the support frame 111B for pellicle viewed at a first surface a of the second support frame part 16B located toward the first support frame part 11B side in the surface direction of the pattern plate in which the support frame 111B for pellicle is arranged from a side in which a pellicle film is arranged.

FIGS. 14A to 14C are schematic diagrams of a support frame 111B for pellicle according to an embodiment of the present invention. FIG. 14A is a schematic diagram of the support frame 111B for pellicle viewed in the plane direction of the pattern plate where the support frame 111B for pellicle is arranged from the side where the pellicle film is arranged. FIG. 14B is a cross-sectional view of the support frame 111B for pellicle in the line segment AB of FIG. 14A, and FIG. 14C is a cross-sectional view of the support frame 111B for pellicle in the line segment CD of FIG. 14A. FIGS. 15A to 15D are schematic diagrams illustrating the detail of a first support frame part 11B and a second support frame part 16B constituting the support frame 111B for pellicle. FIG. 15A is a schematic diagram illustrating the details of the first support frame part 11B, and FIG. 15B is a schematic diagram illustrating the details of the second support frame part 16B. FIGS. 15C and 15D are schematic diagrams illustrating a method of sandwiching and fixing the filter 30 by the first support frame part 11B and the second support frame part 16B. FIGS. 16A to 16D show a method of engaging the first engaging portion 11b with the second engaging portion 16b. It is schematic diagrams of the support frame 111B for pellicle viewed at a first surface a of the second support frame part 16B located toward the first support frame part 11B side in the surface direction of the pattern plate in which the support frame 111B for pellicle is arranged from a side in which a pellicle film is arranged.

In the present embodiment, a thin plate 17B having an L-shaped opening forms a first groove 16e, and a thin plate 18B having an L-shaped opening forms a second groove 116f. The second engaging portion 16b is configured by connecting the second groove 16f to the first groove 16e. The support frame 111B for pellicle has the first support frame part 11B, the second support frame part 16B, and the filter 30. The filter 30 is sandwiched between the first support frame part 11B and the second support frame part 16B. The first support frame part 11B has, for example, a first body part 11a formed by laminating the thin plate 12A having flat plate-shaped frame shape described above and the thin plate 13A having a flat plate-shaped frame shape arranged on the lower surface of the thin plate 12A. The configuration of a notch portion of the first support frame part 11B may be the same as that of the above-described embodiment, and a detailed explanation thereof is omitted.

The first support frame part 11B includes a first engaging portion 11b formed by laminating a thin plate 14B extending from the lower surface of the thin plate 13A in the first direction L1 of the support frame 111B for pellicle and a thin plate 15B extending from the thin plate 14B in the second direction L2 of the support frame 111B for pellicle intersecting the first direction L1 and arranged on the lower surface of the thin plate 14B. In the present embodiment, a first extending portion 11e extending from the first body part 11a in the first direction L1 of the support frame 111B for pellicle is constituted by the thin plate 14B. A second extending portion 11f extending in the second direction L2 from an end opposite to the first body part 11a of the first extending portion 11e is constituted by the thin plate 15B.

The second support frame part 16B has a second body part 16a configured by sequentially stacking the thin plate 18B having flat plate-shaped frame shapes and the thin plate 17B having flat plate-shaped frame shapes on the upper surface of the thin plate 19A having the flat plate-shaped frame shape described above. In this embodiment, a concave part is arranged in an outer edge of the thin plate 18B, a hole 5 extending in the second direction L2 of the support frame 111B for pellicle can be arranged by sandwiching the concave part by the thin plate 17B and the thin plate 19A.

A first groove 16e is arranged in the thin plate 17B, and a second groove 16f is arranged in the thin plate 18B. By sequentially stacking the thin plate 18B and the thin plate 17B on the upper surface of the thin plate 19A, the first groove 16e extending in the first direction L1, which is the thickness direction of the second support frame part 16B, and extending in the second direction L2 (the plane direction in which pellicle film is arranged) which intersects (or is orthogonal to) the first direction L1, and a part of which extends in the fourth direction L4, which intersects (or is orthogonal to) the second direction L2 (which is the third direction in this embodiment, but is referred to herein as the fourth direction in relation to the embodiment described above), and the second groove 16f extending further in the second direction L2 than the first groove 16e overlap to form a concave part in the second support frame part 16B. The concave part functions as the second engaging portion 16b which engages with the first engaging portion 11b. At least a part of the second extending portion 11f is housed in the second groove 16f, and then the first engaging portion 11b engages with the second engaging portion 16b. In the present embodiment, the first groove 16e extending in the fourth direction L4 constitutes a locking mechanism 161. Since the width of the first groove 16e in the second direction L2 in the locking mechanism 161 is substantially equal to the width of the thin plate 14B constituting the first extending portion 11e, it is possible to prevent the engagement between the first engaging portion 11b and the second engaging portion 16b from releasing by returning the first engaging portion 11b to the third direction (the direction opposite to the second direction L2).

Here, the respective thin plate constituting the first support frame part 11B and the second support frame part 16B will be further described. Since the thin plate 12A has been described in the second embodiment, detailed descriptions thereof are omitted. Since the thin plate 13A is also described in the second embodiment, detailed descriptions thereof are omitted. The thin plate 14B is, for example, a rectangular shape, connected to the lower surface of the thin plate 13A, constituting the first extending portion 11e extending from the first body part 11a in the first direction L1 of the support frame 111B for pellicle. The thin plate 14B is arranged on a region adjacent to the region of the thin plate 13A in which the opening 16e is arranged. There is no particular limitation on the number of the thin plate 14 B, and it is preferable to arrange the thin plate 14 B on a region of the thin plate 13A located at both sides of the opening 16e. That is, in the present embodiment, since the first engaging portion 11b and the second engaging portion 16b are arranged on both sides of the vent hole 1, the strength of engagement between the first support frame part 11B and the second support frame part 16B can be increased.

The thin plate 15B is, for example, a rectangular shape, connected to the lower surface of the thin plate 14B, constituting the second extending portion 11f extending in the second direction L2 of the support frame 111B for pellicle. For this reason, the thin plate 15B differs from the thin plate 15A in that it extends in a predetermined length in the second direction L2 than the thin plate 14B. The rest of the configuration of the thin plate 15B may be the same as the configuration of the thin plate 15A, and detailed descriptions thereof are omitted.

As shown in FIGS. 16A to 16D, for example, being a rectangular frame shape, the thin plate 17B has the L-shaped first groove 16e in which a part of the opening extending in the second direction L2 extends in the fourth direction L4. The opening of the first groove 16e extending in the fourth direction L4 constitutes the locking mechanism 161. In the locking mechanism 161, the width of the first groove 16e of the second direction L2 is approximately equal to the width of the thin plate 14B of the second direction L2.

The thin plate 18B is a rectangular frame shape, and has a concave part (recess shape) connected to the outer edge of the frame and recessed in the second direction. There is no particular limitation on the number of the concave part, and a plurality of openings may be provided for the filter 30 that provide adequate ventilation between the closed space of the pellicle and the outside. In the present embodiment, the hole formed by the concave part sandwiched between the thin plate 17B and the thin plate 19A corresponds to the hole 5 connected to the outer edge of the support frame 111B for pellicle and extending in the second direction L2. The thin plate 18B has the L-shaped second groove 16f in which a part of the opening extending in the second direction L2 extends in the fourth direction L4. The second groove 16f has an opening which is opened in a predetermined width larger in the second direction L2 than the opening of the thin plate 17B constituting the first groove 16e. The opening of the thin plate 18B constitutes the second groove 16f extending in the second direction L2 by sandwiching by the thin plate 17B and the thin plate 19A. The first groove 16e and the second groove 16f are connected to constitute the second engaging portion 16b. The shape of the thin plate 18B itself can also be appropriately set according to the shape of the desired frame body. The rest of the configuration of the thin plate 18B may be the same as the configuration of the thin plate 18A, and detailed descriptions thereof are omitted. Since the thin plate 19A has been described in the second embodiment, detailed descriptions thereof are omitted.

In attaching and detaching the filter 30 to and from the support frame 111B for pellicle, the first engaging portion 11b of the first support frame part 11B is passed through the opening b of the filter 30, and, is further inserted into the first groove 16e of the second support frame part 16B toward the first direction L1 of the support frame 111B for pellicle, by sliding the first support frame part 11B in the second direction L2 intersecting the first direction L1 of the support frame 111B for pellicle at the time when the first engaging portion 11b reaches the bottom of the second support frame part 16B, the first engaging portion 11b and the second engaging portion 16b are engaged. Thereafter, by sliding the first support frame part 11B in the fourth direction L4, the first engaging portion 11b is positioned in the locking mechanism 161, the first engaging portion 11b can no longer be returned to the third direction, the first engaging portion 11b and the second engaging portion 16b is locked to the engaged state.

Since the first body part 11a, the filter 30, and the second body part 16a have the same or substantially the same widths, they can be integrated to form the support frame 111B for pellicle. In the present embodiment, since the filter 30 is one member having a flat plate-shaped frame shape, there is no need to arrange the filter for each vent hole, and it can be easily attached to the support frame 111B for pellicle. In this way, connecting the inner edge and the outer edge of the support frame 111B for pellicle, the vent hole 1 in which the filter 30 is arranged is configured.

In FIGS. 16A to 16D, the width of the opening of the first groove 16e extending in the second direction L2 is slightly larger than the width of twice the width of the thin plate 14B of the second direction L2, the length of the opening of the first groove 16e extending in the fourth direction L4 is slightly larger than the length of twice the length of the thin plate 14B of the fourth direction L4, the shape of the first groove 16e of the present embodiment is not limited thereto. For example, the width of the opening of the first groove 16e extending in the second direction L2 may be a width that allows the thin plate 15A constituting the first engaging portion 11b to be inserted in the first direction L1. The length of the first groove 16e in the fourth direction L4 may be a length that can be moved to the locking mechanism 161 so that the thin plate 14B constituting the first engaging portion 11b does not return to the third direction. That is, the width of the first groove 16e in the second direction L2 may be substantially equal to the width of the thin plate 14B in the second direction L2, and a part of the first engaging portion 11b may be housed.

In the present embodiment, since the filter 30 is one member having a flat plate-shaped frame shape, there is no need to arrange the filter for each vent hole, and it can be easily attached to the support frame 111B for pellicle. In the present embodiment, since adhesives are not used to fix the filter 30, the filter 30 can be easily removed from the support frame 111B by separating the first support frame part 11B and the second support frame part 16B engaged by the first engaging portion 11b and the second engaging portion 16b. In the conventional pellicle, since the filter was arranged for each vent hole, each filter had to be removed. In the present embodiment, since the filter 30 is one member having a flat plate-shaped frame shape the filter 30 can be easily removed from the support frame 111B for pellicle by separating the first support frame part 11B and the second support frame part 16B.

In an embodiment, the filter 30 can be conveniently replaced by re-sandwiching a new filter as the filter 30 with the first support frame part 11B and the second support frame part 16B. In this embodiment, since no adhesive is used for fixing the filter 30, generation of outgassing from the adhesive is reduced, and contamination in the region in which the EUV light is irradiated in the space formed by the pattern plate and the pellicle is suppressed. It is possible to suppress fogging of the lenses of optical system of the exposure device due to outgassing from the adhesives, exposure defects, and light deficiency. The present embodiment can also be applied to Embodiments 1 to 2 and variations thereof.

Modification of Embodiments 2 and 3

Figure 17A:
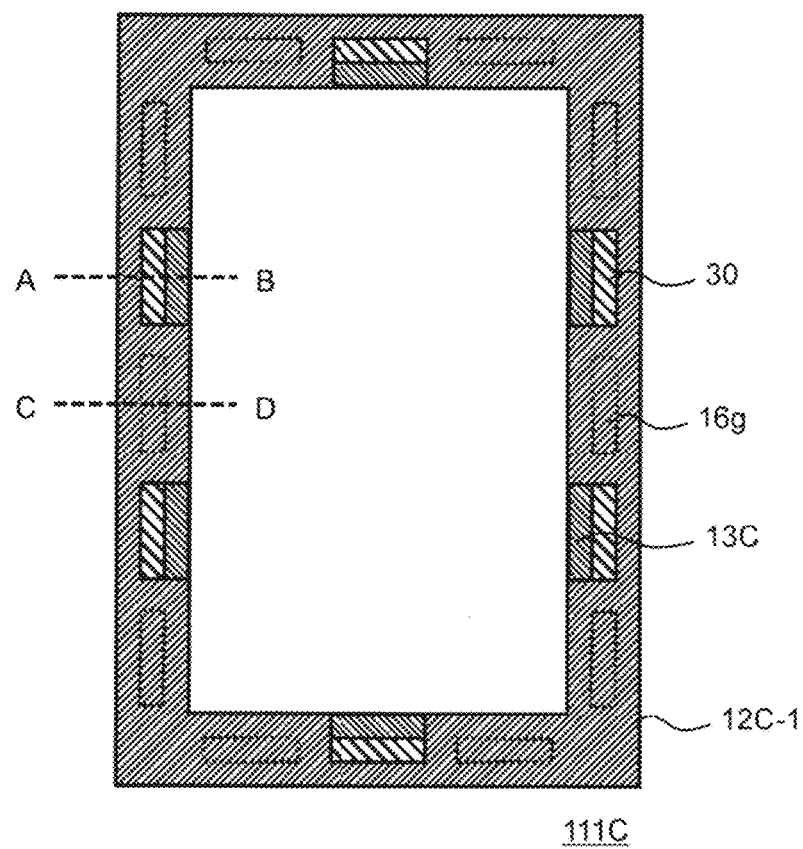
FIG. 17A is a schematic diagram of a support frame 111C for pellicle according to a modification and is a schematic diagram of the support frame 111C for pellicle viewed in the plane direction of the pattern plate where the support frame 111C for pellicle is arranged from the side where the pellicle film is arranged.
Figure 17B:
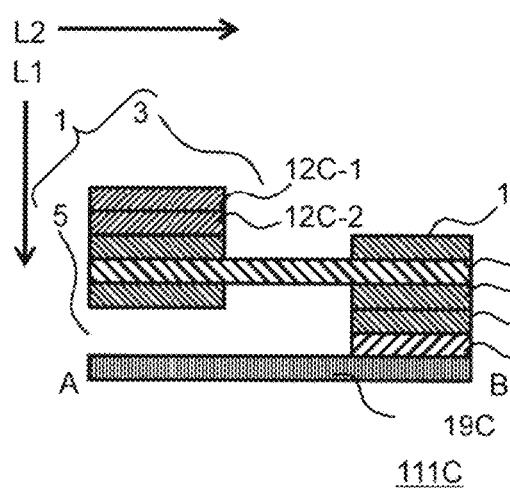
FIG. 17B is a cross-sectional view of the support frame 111C for pellicle in the line segment AB in FIG. 17A.
Figure 17C:
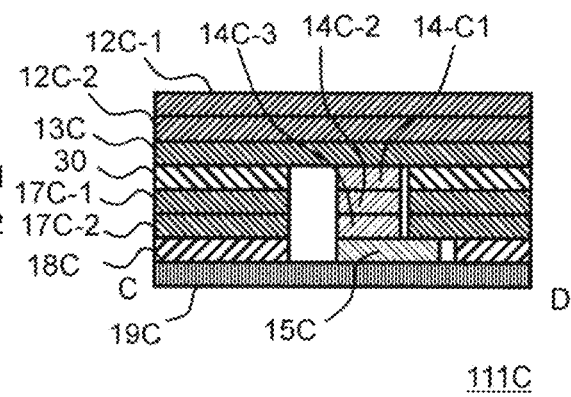
FIG. 17C is a cross-sectional view of the support frame 111C for pellicle in the line segment CD in FIG. 17A.
Figure 18A:
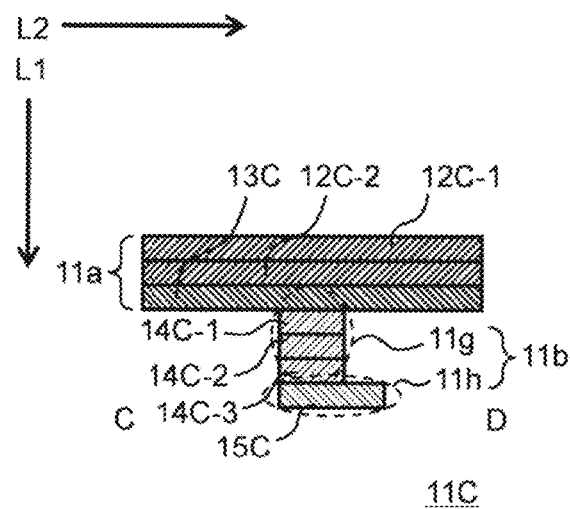
FIG. 18A is a schematic diagram illustrating details of a first support frame part 11C and a second support frame part 16C constituting the support frame 111C for pellicle according to the embodiment and is a schematic diagram illustrating details of the first support frame part 11C.
Figure 18B:
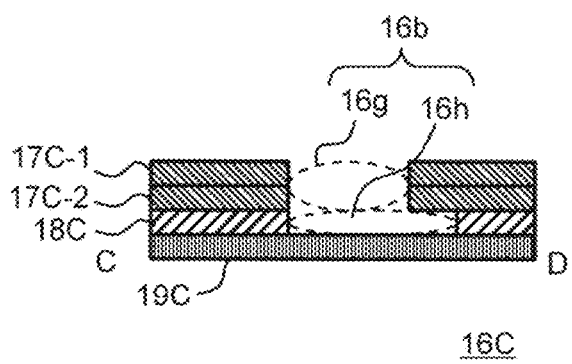
FIG. 18B is a schematic diagram illustrating details of the second support frame part 16C.
Figure 18C:
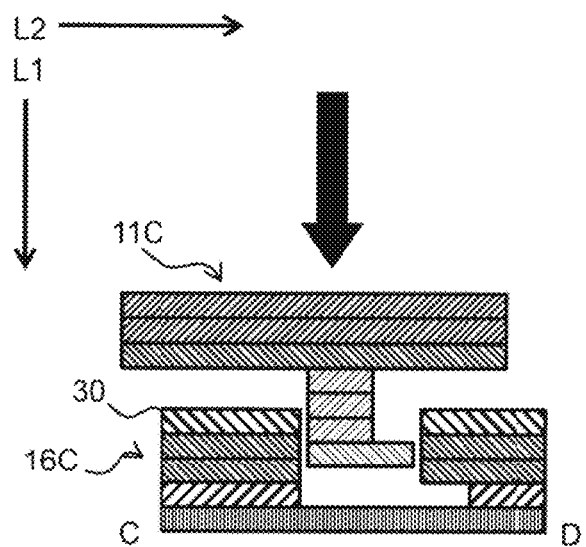
FIG. 18C is a schematic diagram illustrating a method of sandwiching and fixing the filter 30 by the first support frame part 11C and the second support frame part 16C.
Figure 18D:
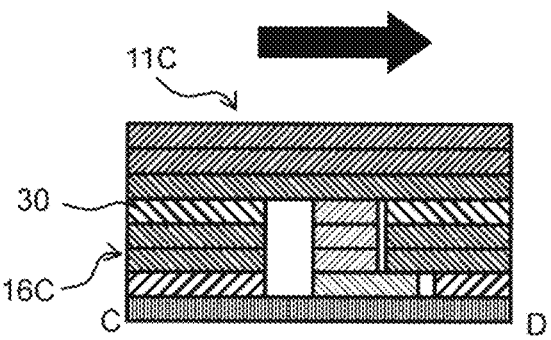
FIG. 18D is a schematic diagram illustrating a method of sandwiching and fixing the filter 30 by the first support frame part 11C and the second support frame part 16C.

A modification of the 2 and 3 embodiments described above will be described. FIGS. 17A to 17C are schematic diagrams of a support frame 111C for pellicle according to a modification of the present embodiment. FIG. 17A is a schematic diagram of the support frame 111C for pellicle in the plane direction of the pattern plate where the support frame 111C for pellicle is arranged from the side where the pellicle film is arranged. FIG. 17B is a cross-sectional view of the support frame 111C for pellicle in the line segment AB of FIG. 17A, and FIG. 17C is a cross-sectional view of the support frame 111C for pellicle in the line segment CD of FIG. 17A. FIGS. 18A to 18D are schematic diagrams illustrating the details of a first support frame part 11C and a second support frame part 16C constituting the support frame 111C for pellicle. FIG. 18A is a schematic diagram illustrating the details of the first support frame part 11C, and FIG. 18B is a schematic diagram illustrating the details of the second support frame part 16C. FIGS. 18C and 18D are schematic diagrams illustrating a method of sandwiching and fixing the filter 30 by the first support frame part 11C and the second support frame part 16C.

The first support frame part 11C has the first body part 11a in which a thin plate 12C-2 and a thin plate 13C are stacked on a lower surface of a thin plate 12C-1. In the present embodiment, the thin plate 12C-1 and the thin plate 12C-2, similarly to the thin plate 12A described above, for example, a rectangular frame shape, and have a concave part (recess shape) connected to an inner edge of the frame and recessed in the second direction. There is no particular limitation on the number of the concave part, and a plurality of concave parts may be provided for the filters 30 that provide adequate ventilation between the closed space of the pellicle and the outside. In the present embodiment, since the thin plate 12C-1 and the thin plate 12C-2 are used by stacking, the thin plate 12C-1 and the thin plate 12C-2 may be a thinner member than the thin plate 12A. Other configurations of the thin plate 12C-1 and the thin plate 12C-2 may be the same as those of the thin plate 12A, and detailed descriptions thereof are omitted. In the present embodiment, an opening formed by the concave part of the thin plate 12C-1 and the thin plate 12 C-2 corresponds to the hole of the first direction L1. The first support frame part 11C has the first engaging portion 11b formed by stacking a first extending portion 11g formed by stacking a thin plate 14C-1, a thin plate 14C-2, and a thin plate 14C-3 extending in the first direction L1 of the support frame 111C for pellicle from the bottom surface of thin plate 13C and a second extending portion 11h formed by a thin plate 15C arranged on the bottom surface of the thin plate 14C-3 and extending in the second direction L2 intersecting the first direction L1 of the support frame 111C for pellicle from the thin plate 14 C-3.

The second support frame part 16C includes the second body part 16a in which a thin plate 18C having a flat plate-shaped frame shape on the upper surface of a thin plate 19C having a flat plate-shaped frame shape, and a thin plate 17C-1 and a thin plate 17C-2 having a flat plate-shaped frame shape are sequentially laminated and configured. In the present embodiment, as will be described later, a concave part is arranged on the outer edge of the thin plate 17C-2 and the thin plate 18C, and the hole 5 of the support frame 111C for pellicle extending in the second direction L2 can be arranged by sandwiching the concave part by the thin plate 17C-1 and the thin plate 19C.

The support frame 111C for pellicle differs from the second embodiment in that the thin plate corresponding to the thin plate 12A configuring the first body part 11a is configured by a plurality of thin plates (in FIGS. 17A to 17C, the thin plate 12C-1 and the thin plate 12C-2) and the thin plate 14A configuring the first engagement unit 11b is configured by a plurality of thin plates (in FIGS. 17A to 17C, the thin plate 14C-1, the thin plate 14C-2 and the thin plate 14C-3). The support frame 111C for pellicle differs from the second embodiment in that the thin plate 17A constituting the second engaging portion 16b is configured by a plurality of thin plates (in FIGS. 17A to 17C, the thin plate 17C-1 and the thin plate 17C-2). That is, in the present modification, any thin plate can be configured by using a plurality of thin plates in the above-described Embodiments 2 to 3 and their modifications. In this modification, as in the thin plate 17C-1 and the thin plate 17C-2, as an example in which the thin plate which is partially different may be combined, in FIG. 17B, similarly to the thin plate 18C, the thin plate 17C-2 is different from the thin plate 17C-1 in that the thin plate 17C-2 is connected to the outer edge of the frame and has the concave part recessed in the second direction.

In this modification, by forming the thin plate 17C-1 and the thin plate 17C-2 located in the second engaging portion 16b into the same shape, it is possible to increase the strength of the second engaging portion 16b in the first direction L1. On the other hand, since the thin plate 17C-2 has a concave part connected to the outer edge of the frame, the height of the hole 5 relative to the first direction L1 extending in the second direction L2 constituted by laminating with the thin plate 18C is increased, it is possible to increase the ventilating capacity. The present modification is not limited thereto, and a shape of any thin plate may be realized by another neighboring thin plate. Except for these configurations described above, configurations similar to those described above in Embodiments 2 and 3 and variations thereof may be used, and a detailed description thereof is omitted.

The attachment and detachment of the filter 30 to and from the support frame 111C for pellicle can be performed by the method described in Embodiment 1. By passing the first engaging portion 11*b* of the first support frame part 11C through the opening b of the filter 30, and further inserting it into a first groove 16*g* of the second support frame part 16C toward the first direction L1 of the support frame 111C for pellicle, and sliding the first support frame part 11C in the second direction L2 intersecting the first direction L1 of the support frame 111C for pellicle when the first engaging portion 11*b* reaches the bottom of the second support frame part 16C, the second extending portion 11*h* constituted by the thin plate 15C can be housed in the second groove 16*h* to engage the first engaging portion 11*b* and the second engaging portion 16*b*. By sandwiching the filter 30 by the first support frame part 11C and the second support frame part 16C, the inner edge and the outer edge of the support frame 111C for pellicle are connected to form the vent hole 1 in which the filter 30 is arranged.

In this embodiment, since the filter 30 is one member having a flat plate-shaped frame shape, it is not need to arrange the filter per the vent hole and the filter 30 can be conveniently attached to the support frame 111C for pellicle. In the present embodiment, since no adhesive is used for fixing the filter 30, the filter 30 can be easily removed from the support frame 111C for pellicle by separating the first support frame part 11C and the second support frame part 16C engaged by the first engaging portion 11*b* and the second engaging portion 16*b*. In the conventional pellicle, since the filter is arranged for each vent hole, each filter had to be removed. In this embodiment, the filter 30 is one member having a flat plate-shaped frame shape, and the filter 30 can be easily removed from the support frame 111C for pellicle by separating the first support frame part 11C and the second support frame part 16C.

In an embodiment, the filter 30 can be conveniently replaced by re-sandwiching a new filter as the filter 30 with the first support frame part 11C and the second support frame part 16C. In this embodiment, since no adhesive is used for fixing the filter 30, generation of outgassing from the adhesive is reduced, and contamination in the region in which the EUV light is irradiated in the space formed by the pattern plate and the pellicle is suppressed. It is possible to suppress fogging of the lenses of optical system of the exposure device due to outgassing from the adhesives, exposure defects, and light deficiency.

Embodiment 4

In the embodiment described above, the second engaging portion 16*b* is formed by stacking the thin plate constituting the second support frame part, but the support frame 111 for pellicle is not limited to this. In the present embodiment, examples that the second engaging portion 16*b* is configured by arranging a bolt-like fixing tool in the second support frame part and engages with the first engaging portion 11*b* will be described.

Figure 19A:
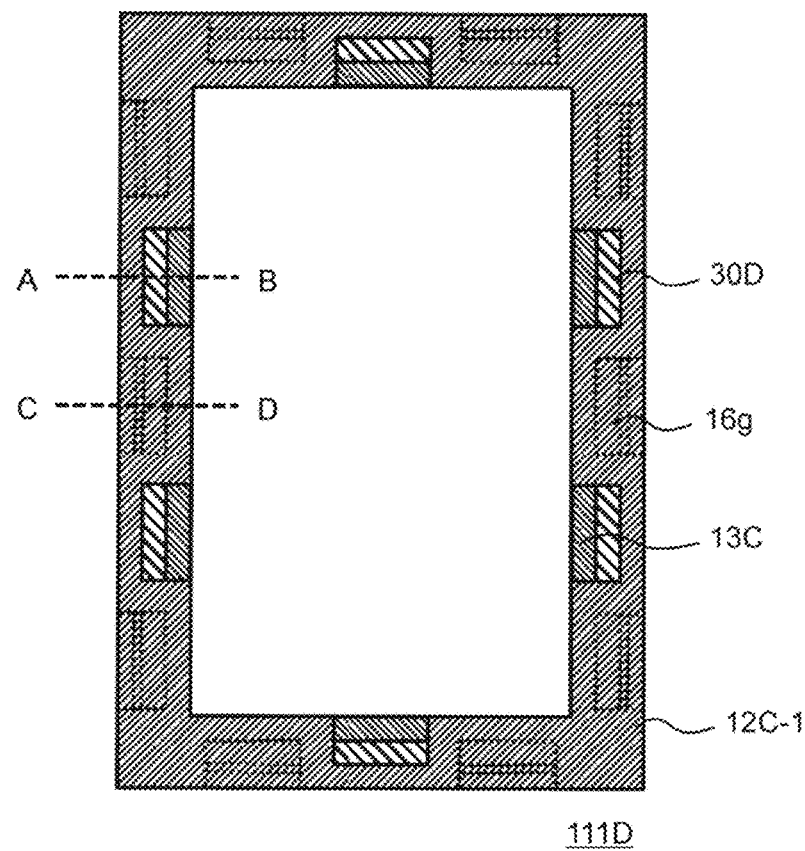
FIG. 19A is a schematic diagram of a support frame 111D for pellicle according to embodiment and is a schematic diagram of the support frame 111D for pellicle viewed in the plane direction of the pattern plate where the support frame 111D for pellicle is arranged from the side where the pellicle film is arranged.
Figure 19B:
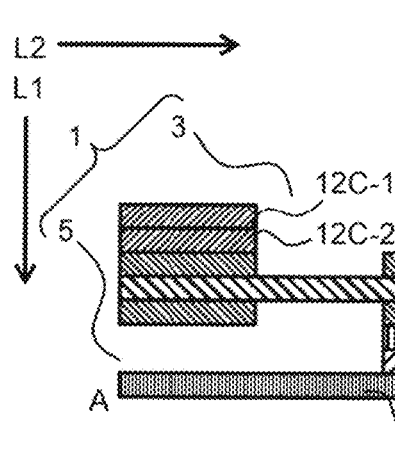
FIG. 19B is a cross-sectional view of the support frame 111D for pellicle in the line segment AB in FIG. 19A.
Figure 19C:
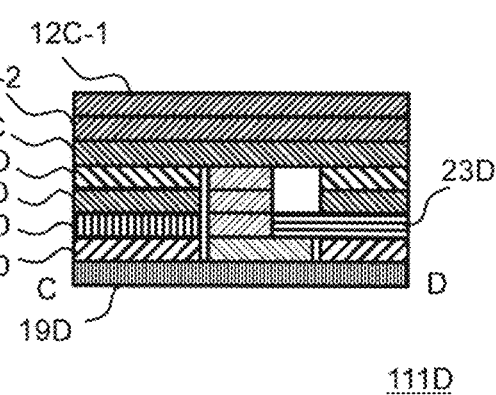
FIG. 19C is a cross-sectional view of the support frame 111D for pellicle in the line segment CD in FIG. 19A.
Figure 20A:
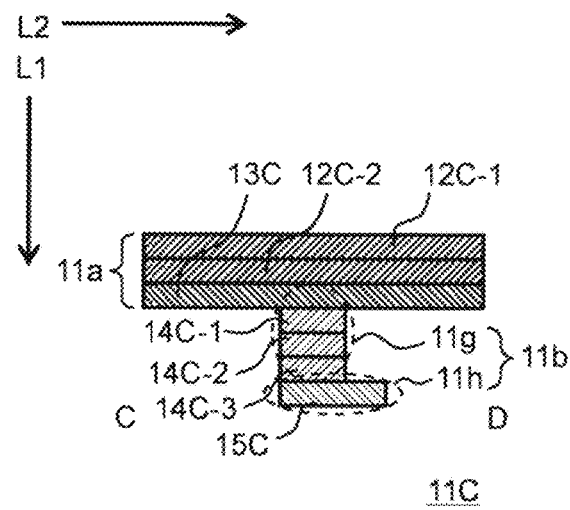
FIG. 20A is a schematic diagram illustrating details of a first support frame part 11C and a second support frame part 16D constituting the support frame 111D for pellicle according to the embodiment and is a schematic diagram illustrating details of the first support frame part 11C.
Figure 20B:
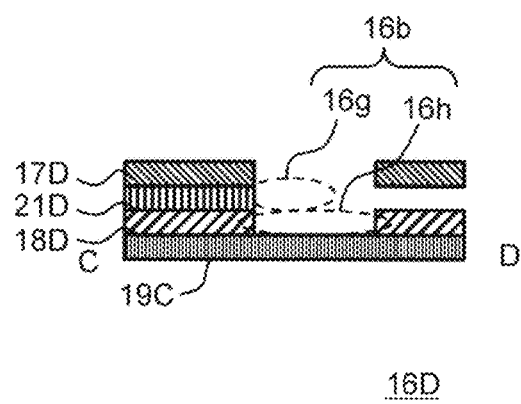
FIG. 20B is a schematic diagram illustrating details of the second support frame part 16D.
Figure 20C:
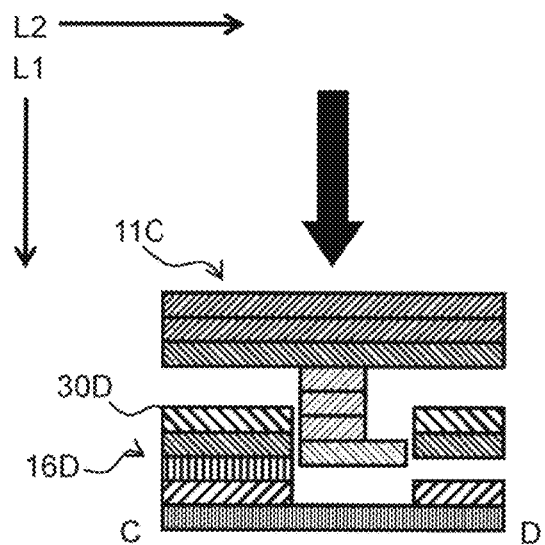
FIG. 20C is a schematic diagram illustrating a method of sandwiching and fixing the filter 30 by the first support frame part 11C and the second support frame part 16D.
Figure 20D:
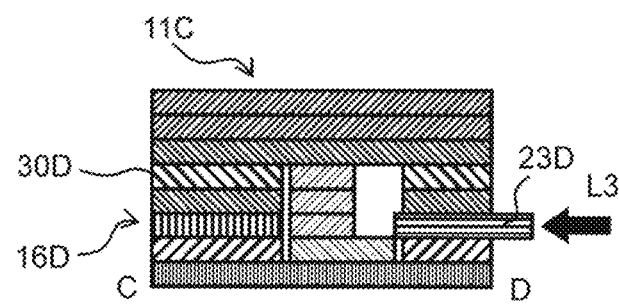
FIG. 20D is a schematic diagram illustrating a method of sandwiching and fixing the filter 30 by the first support frame part 11C and the second support frame part 16D.
Figure 21A:
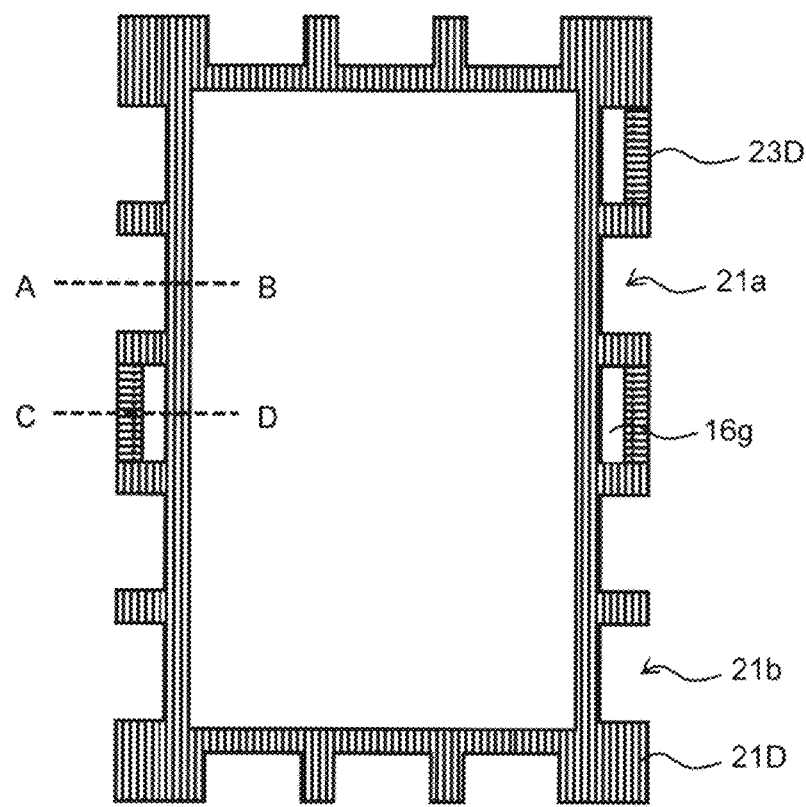
FIG. 21A is a schematic diagram of a thin plate 21D arranged with a fixing tool 23D according to an embodiment and is a top view of the thin plate 21D arranged with the fixing tool 23D.
Figure 21B:
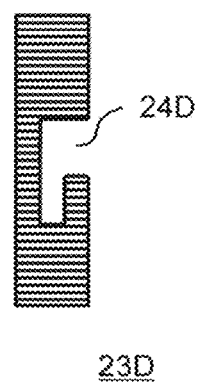
FIG. 21B is a top view of the fixing tool 23D.
Figure 21C:
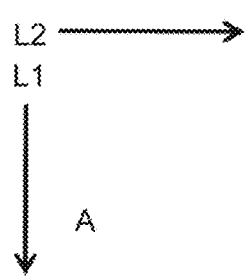
FIG. 21C is a cross-sectional view of the thin plate 21D in the line segment AB shown in FIG. 21A.
Figure 21D:
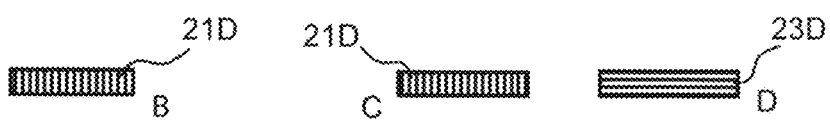
FIG. 21D is a top view of the thin plate 21D with the fixing tool 23D arranged in the line segment CD shown in FIG. 21A.

FIGS. 19A to 19C are schematic diagrams of a support frame 111D for pellicle according to an embodiment of the present invention. FIG. 19A is a schematic diagram of the support frame 111D for pellicle in the plane direction of the pattern plate where the support frame 111D for pellicle is arranged from the side where the pellicle film is arranged. FIG. 19B is a cross-sectional view of the support frame 111D for pellicle in the line segment AB of FIG. 19A, and FIG. 19C is a cross-sectional view of the support frame 111D for pellicle in the line segment CD of FIG. 19A. FIGS. 20A to 20D are schematic diagrams illustrating the details of the first support frame part 11C and the second support frame part 16D constituting the support frame 111D for pellicle. FIG. 20A is a schematic diagram illustrating the details of the first support frame part 11C, FIG. 20B is a schematic diagram illustrating the details of the second support frame part 16D. FIGS. 20C and 20D are schematic diagrams illustrating a method of sandwiching and fixing the filter 30 by the first support frame part 11C and the second support frame part 16D. FIGS. 21A to 21D are schematic diagrams of a thin plate 21D in which a fixing tool 23D is arranged. FIG. 21A is a top view of the thin plate 21D arranging the fixing tool 23D, FIG. 21B is a top view of the fixing tool 23D, FIG. 21C is a cross-sectional view of the thin plate 21D in the line segment AB shown in FIG. 21A, FIG. 21D is a cross-sectional view of the thin plate 21D arranging the fixing tool 23D in the line segment CD shown in FIG. 21A.

The first support frame part 11C may have the same configuration as that described in the modifications of the second and third embodiments, and a detailed explanation thereof is omitted. The second support frame part 16D has a second body part 16*a* formed by sequentially stacking the thin plate 21D and a thin plate 17D having flat plate-shaped frame shape on a thin plate 18D having flat plate-shaped frame shape on the upper surface of the thin plate 19D having flat plate-shaped frame shape. In the present embodiment, as will be described later, a concave part is arranged in an outer edge of the thin plate 17D and the thin plate 18D, and the hole 5 of the support frame 111D for pellicle extending in the second direction L2 can be arranged by sandwiching the concave part by the thin plate 17D and the thin plate 19D. In this embodiment, the thin plate 17D has the same shape as the thin plate 18D at the position of the second engaging portion 16*b*. In the present embodiment, a filter 30D also has the same shape as the thin plate 18D in the position of the second engaging portion 16*b*. That is, the thin plate 17D, the thin plate 18D and the filter 30D has an opening constituting the second groove 16*h* at the position of the second engaging portion 16*b*, the shape of the opening is substantially the same shape as the second extending portion 11*h* in planar view.

The thin plate 21D is, for example, a rectangular frame shape, and has a concave part (recess shape) 21*a* connected to the outer edge of the frame and recessed in the second direction. There is no particular limitation on the number of the concave part 21*a*, it is possible to provide a plurality of openings for the filters 30D which is sufficient to ventilate the closed space and the outside of the pellicle. In the present embodiment, a hole formed by the concave part 21*a* laminated with the thin plate 18C and sandwiched between the thin plate 17D and the thin plate 19D corresponds to the hole 5 connected to the outer edge of the support frame 111D for pellicle and extending in the second direction L2. In the thin plate 21D, an opening 21*b* connected to the outer edge and constituting the first groove 16*g* when the fixing tool 23D is arranged is arranged at a position adjacent to the concave part 21*a* and corresponding to the position where the second groove 16*h* is arranged. The first groove 16*g* is approximately the same shape as the first extending portion 11*g* in planar view. Metals, glasses, silicon wafers, ceramics, and resins are exemplified as a material for the thin plate 21D.

The fixing tool 23D is a member that configures the first groove 16*g* together with the opening 21*b* by arranging it in the outer edge of the opening 21*b*. In FIG. 21B, the fixing tool 23D is a rectangular flat plate-shaped member but is not limited thereto. The outer edge side of the fixing tool 23D has a third engaging portion 24D which is engageable with an L-shaped jig. The third engaging portion 24D has an L-shaped groove in planar view. This allows easy attachment and detachment (insertion and removal) of the fixing tool 23D using the L-shaped jig. Materials for the fixing tool 23D include metals, glasses, silicon wafers, ceramics, and resins.

In the present embodiment, the second engaging portion 16b has the fixing tool 23D which is arranged away from the bottom of the second groove 16h in the first direction L1, and the second groove 16h is configured by the bottom of the first groove 16g and the fixing tool 23D. The first engagement portion 11b of a first support frame part 11C is passed through the opening of the filter 30D and further inserted into the first groove 16g of the second support frame part 16D toward the first direction L1 of the support frame 111D for pellicle. By sliding the fixing tool 23D in the third direction of the second support frame part 16D, the second extending portion 11h constituted by the thin plate 15C is housed in the second groove 16h, it is possible to engage the first engaging portion 11b and the second engaging portion 16b. By sandwiching the filter 30D by the first support frame part 11C and the second support frame part 16D, the vent hole 1 in which the filter 30D is arranged is configured by connecting the inner edge and the outer edge of the support frame 111D for pellicle. In the present embodiment, the engagement with the first engagement portion 11b is released by removing the fixing tool 23D from the second support frame part 16D.

In this embodiment, since the filter 30D is one member having a flat plate-shaped frame shape, it is not need to arrange the filter per the vent hole and can be conveniently attached to the support frame 111D for pellicle. In the present embodiment, since no adhesive is used for fixing the filter 30D, the filter 30D can be easily removed from the support frame 111D for pellicle by separating the first support frame part 11C and the second support frame part 16D engaged by the first engaging portion 11b and the second engaging portion 16b. In the conventional pellicle, since the filter was arranged for each vent hole, each filter had to be removed. In this embodiment, since the filter 30D is one member having a flat plate-shaped frame shape, if the first support frame part 11C and the second support frame part 16D are separated, the filter 30D can be easily removed from the support frame 111D for pellicle.

In an embodiment, the filter 30 can be conveniently replaced by re-sandwiching a new filter as the filter 30D with the first support frame part 11C and the second support frame part 16D. In this embodiment, since no adhesive is used for fixing the filter 30D, generation of outgassing from the adhesive is reduced, and contamination in the region in which the EUV light is irradiated in the space formed by the pattern plate and the pellicle is suppressed. It is possible to suppress fogging of the lenses of optical system of the exposure device due to outgassing from the adhesives, exposure defects, and light deficiency.

Embodiment 5

Figure 22A:
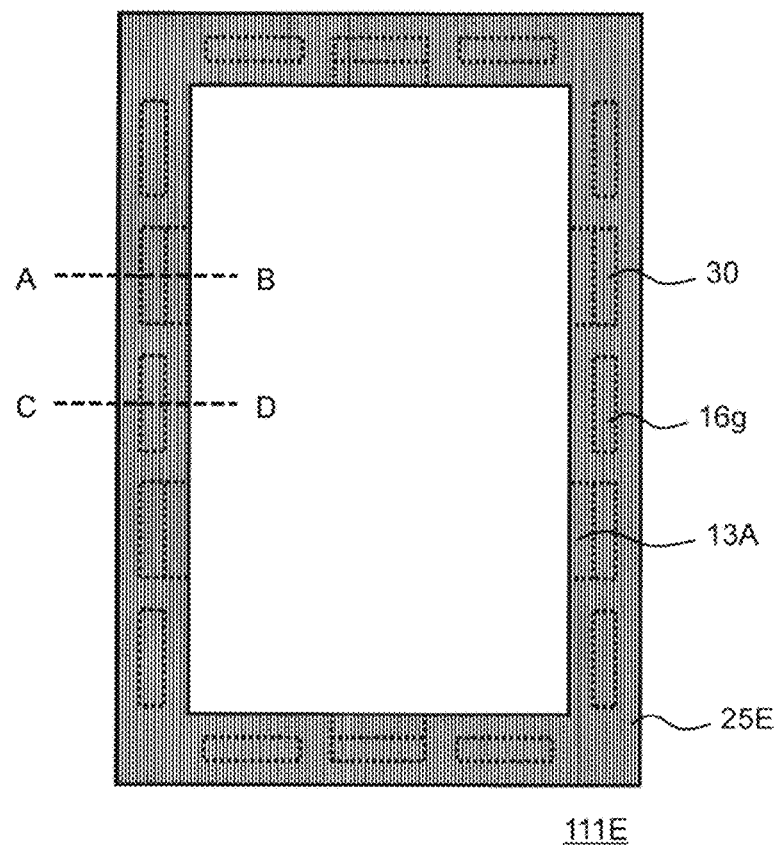
FIG. 22A is a schematic diagram showing a support frame 111E for pellicle according to embodiment and is a schematic diagram of the support frame 111E for pellicle viewed in the plane direction of the pattern plate where the support frame 111E for pellicle is arranged from the side where the pellicle film is arranged.
Figure 22B:
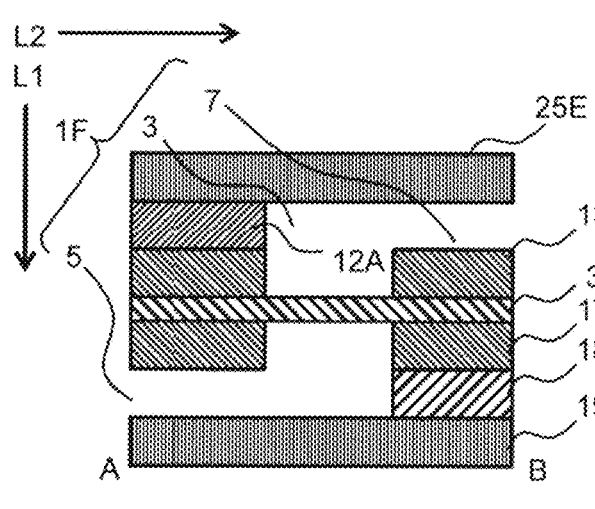
FIG. 22B is a cross-sectional view of the support frame 111E for pellicle in the line segment AB in FIG. 22A.
Figure 22C:
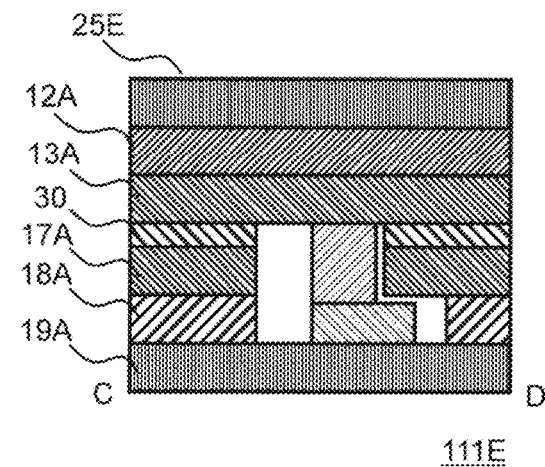
FIG. 22C is a cross-sectional view of the support frame 111E for pellicle in the line segment CD in FIG. 22A.

FIGS. 22A to 22C are schematic diagrams showing a support frame 111E for pellicle according to an embodiment of the present invention. FIG. 22A is a schematic diagram of the support frame 111E for pellicle in the plane direction of the pattern plate where the support frame 111E for pellicle is arranged from the side where the pellicle film is arranged. FIG. 22B is a cross-sectional view of the support frame 111E for pellicle in the line segment AB of FIG. 22A, and FIG. 22C is a cross-sectional view of the support frame 111E for pellicle in the line segment CD of FIG. 22A. In FIGS. 22A to 22C, as an example, an example in which a top plate 25E is arranged in the support frame for pellicle 111E described in Embodiment 2 is shown, but the present embodiment is not limited to this, and can be applied to any support frame for pellicle described in the above embodiments and the modifications.

Figure 23A:
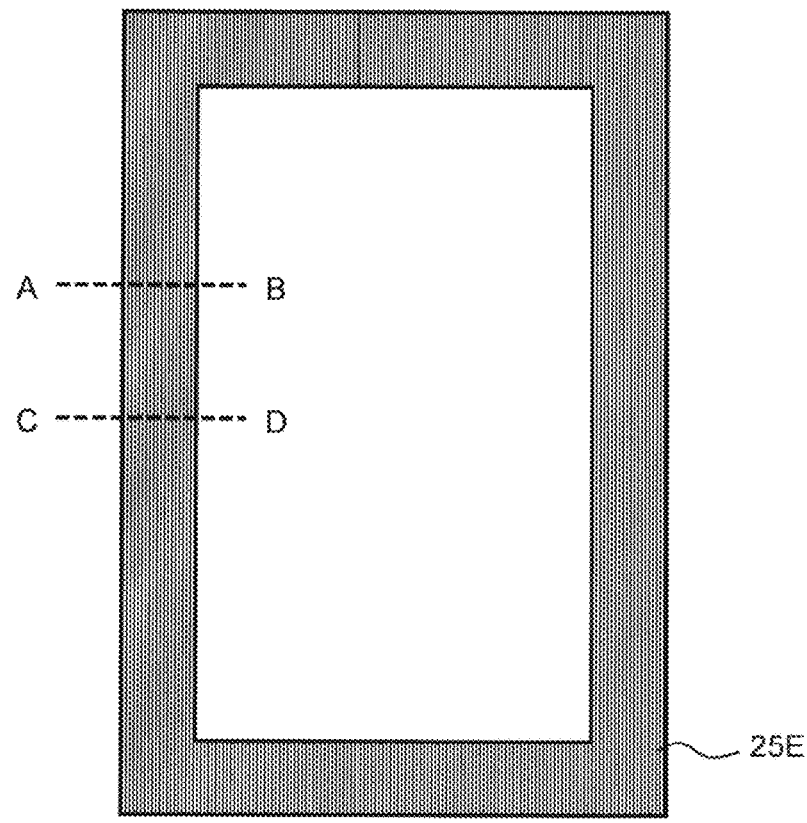
FIG. 23A is a schematic diagram of a top plate 25E according to an embodiment and is a top view of the top plate 25E.
Figure 23B:
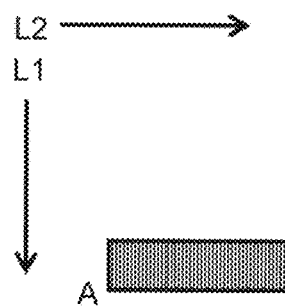
FIG. 23B is a cross-sectional view of the top plate 25E in the line segment AB shown in FIG. 23A.
Figure 23C:
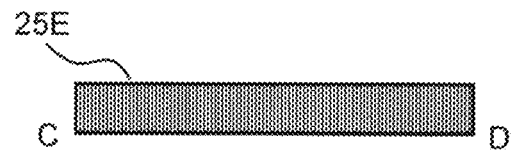
FIG. 23C is a cross-sectional view of the top plate 25E in the line segment CD shown in FIG. 23A.

FIGS. 23A to 23C are schematic diagrams of the top plate 25E. FIG. 23A is a top view of the top plate 25E, FIG. 23B is a cross-sectional view of the top plate 25E in the line segment AB shown in FIG. 23A, and FIG. 23C is a cross-sectional view of the top plate 25E in the line segment CD shown in FIG. 23A. The top plate 25E is a thin plate having flat plate-shaped frame shape and has a schematically identical shape to the thin plate 19A. Metals, glasses, silicon wafers, ceramics, and resins are exemplified as a material for the top plate 25E. In FIG. 22A, since the top plate 25E is present, it is impossible to observe the filter 30 from the upper surface, the location where the filter 30 is arranged in the lower layer is shown using dotted lines.

In this embodiment, the top plate 25E is connected on the thin plate 12A and the top of the hole 3 is covered by the top plate 25E. In the present embodiment, the thin plate 13A, the thin plate 12A, and the top plate 25E are sequentially stacked to constitute the vent hole 1 connected to the second end of the hole 3 and having a hole 7 (third hole) provided in the second direction L2. The top plate 25 E is connected to the pellicle film or the pellicle film body. In the fifth embodiment, since the connection with the pellicle film or the pellicle film body can be performed at the entire top plate, the connection strength can be increased. Since the filter 30 is covered with the top plate 25E, exposure light is less likely to hit the filter 30, and it is possible to further suppress the degradation of the filter 30.

Embodiment 6

FIGS. 27A to 27C are schematic diagrams showing a support frame 111F for pellicle according to an embodiment of the present invention. FIG. 27A is a schematic diagram of the support frame 111F for pellicle in the plane direction of the pattern plate where the support frame 111F for pellicle is arranged from the side where the pellicle film is arranged. FIG. 27B is a cross-sectional view of the support frame 111F for pellicle in the line segment AB of FIG. 27A, and FIG. 27C is a cross-sectional view of the support frame 111F for pellicle in the line segment CD of FIG. 27A. The support frame 111F for pellicle has a configuration similar to that of the support frame 111A for pellicle described in Embodiment 2. Therefore, explanations of the same or similar components as those of the support frame 111A for pellicle are omitted. The support frame 111F for pellicle differs from the support frame 111A for pellicle shown in the second embodiment in that a wall 17F for shielding the exposure light is arranged inside the filter (on the closed space partial side when the pellicle indicated by the arrow P in FIG. 1 is mounted on the pattern plate).

The EUV light irradiated to the pattern plate through the pellicle film is scattered and diffracted on the surface of the pattern plate, and a part of the EUV light is also irradiated to the inner wall of the support frame for pellicle. Here, referring to FIGS. 4(b) and 4(c), the filter 30 has a structure in which an end surface is exposed. Therefore, inside the support frame 111F for pellicle (the cross-sectional directions B and D), although the exposure area of the end surface of the filter 30 is small, it may be exposed to the scattered and diffracted EUV light, and there is a possibility that it cause light degradation. Outgassing caused by photodegradation may cause contamination to deposit on the surface of the pattern plate.

Figure 28A:
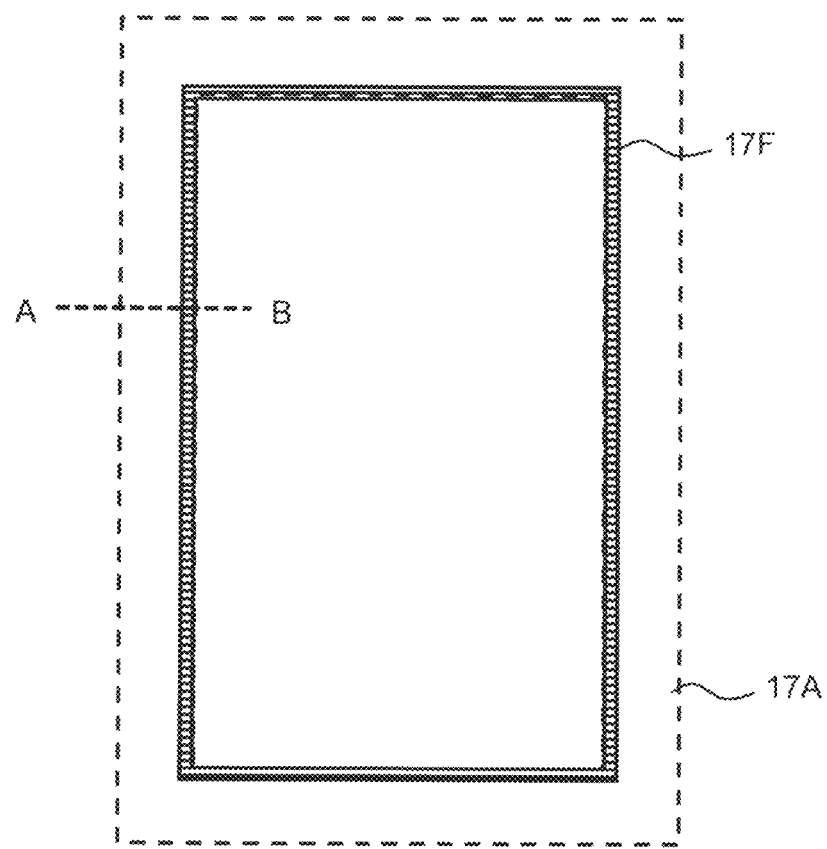
FIG. 28A is a schematic diagram of a wall 17F of the support frame 111F for pellicle according to an embodiment and is a top view of the wall 17F.
Figure 28B:
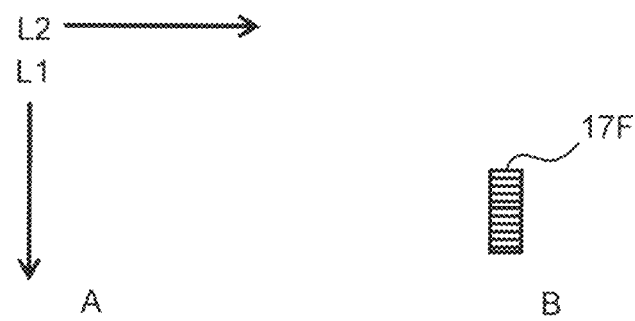
FIG. 28B is a cross-sectional view of the wall 17F in the line segment AB shown in FIG. 28A.

In the support frame 111F for pellicle, since the wall 17F for shielding the exposure light is arranged inside the filter 30F, the filter 30F is not exposed to the exposure light, and the filter 30F can be protected. FIG. 28A is a top view of the wall 17F, and FIG. 28B is a cross-sectional view of the wall 17F in the line segment AB shown in FIG. 28A. The wall 17F has, for example, a rectangular frame shape. The width of the wall 17F in the line segment AB may be any width capable of shielding the EUV light and can be determined from the transmittance of the EUV light of the raw material of the wall 17F. In an embodiment, the wall 17F can shield the EUV light from 90% or more, 95% or more, 98% or more, or 99% or more. Metal, glass, silicon wafer, ceramics, and resin are exemplified as the material of the wall 17F, but it is preferable that the material be a material which does not reflect or scatter the EUV light but absorbs it.

The height of the wall 17F is preferably greater than the thickness of the filter 30F for the purpose of preventing the filter 30F from being exposed to the scattered and diffracted EUV light, it is not more than the sum of the thickness of the filter 30F and the thickness of a thin plate 13F. If the height of the wall 17F is equal to the sum of the thickness of the filter 30F and the thickness of the thin plate 13F, the wall 17F is sandwiched between a thin plate 12F and the thin plate 17A, and the filter 30F can be completely prevented from being exposed by the EUV light in parts other than the notch portion N. In the notch portion N, the walls 17F can substantially prevent the filter 30F from being exposed to the EUV light. The wall 17F may be integrally formed with the thin plate 17A.

FIGS. 29A to 29C are schematic diagrams of the thin plate 13F. FIG. 29A is a top view of the thin plate 13F, FIG. 29B is a cross-sectional view of the thin plate 13F in the line segment AB shown in FIG. 29A, and FIG. 29C is a cross-sectional view of the thin plate 13F in the line segment CD shown in FIG. 29A. To arrange the wall 17F between the thin plate 12F and the thin plate 17A, the width of the thin plate 13F is set so that the width of the closed space part side is narrower than the width of the thin plate 17A. In other configurations, the thin plate 13F may have a configuration similar to that of the thin plate 13A, and a detailed explanation thereof is omitted.

Figure 30A:
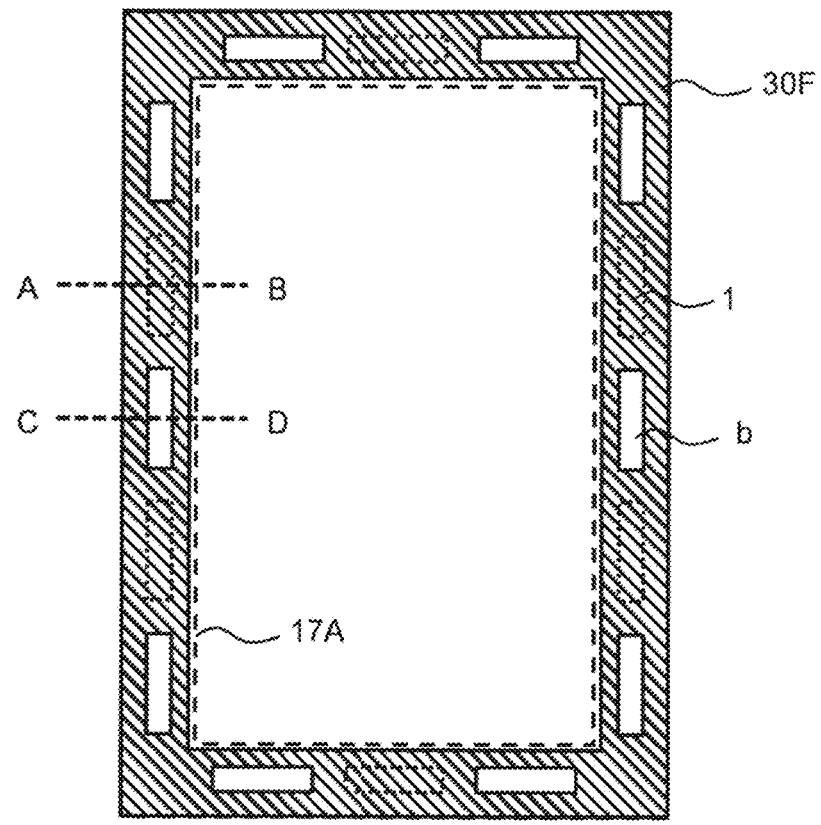
FIG. 30A is a schematic diagram of a filter 30F according to an embodiment and is a top view of the filter 30F.
Figure 30B:
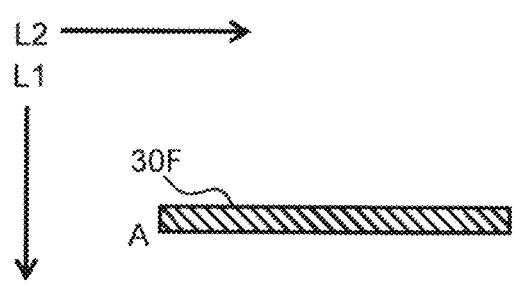
FIG. 30B is a cross-sectional view of the filter 30F in the line segment AB shown in FIG. 30A.
Figure 30C:
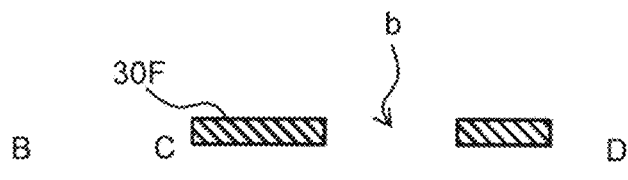
FIG. 30C is a cross-sectional view of the filter 30F in the line segment CD shown in FIG. 30A.

FIGS. 30A to 30C are schematic diagrams of the filter 30F. FIG. 30A is a top view of the filter 30F, FIG. 30B is a cross-sectional view of the filter 30F in the line segment AB shown in FIG. 30A, and FIG. 30C is a cross-sectional view of the filter 30F in the line segment CD shown in FIG. 30A. To arrange the wall 17F between the thin plate 12F and the thin plate 17A, the width of the filter 30F is set so that the width of the closed space part side is narrower than the width of the thin plate 17A. In other configurations, the filter 30F may have the same configuration as the filter 30, and a detailed description thereof is omitted.

In the support frame 111F for pellicle, the first support frame part is composed of the thin plate 12A, the thin plate 13F, the thin plate 14A, and the thin plate 15A. The second support frame part is composed of the wall 17F, the thin plate 17A, the thin plate 18A, and the thin plate 19A. In the support frame 111F for pellicle, similarly to the support frame 111F for pellicle, the filter 30F is sandwiched by the first support frame part and the second support frame part. As shown in FIG. 5(d), since the first engaging portion and the second engaging portion are engaged by sliding in the second direction L2, it is preferable to provide a slight gap between the wall 17F, the thin plate 13F and the filter 30F to prevent dust generation by colliding the thin plate 13F and the filter 30F with the wall 17F in FIGS. 27(b) and 27(c). From the viewpoint of preventing the filter 30F from being exposed by the EUV light, the wall 17F may be brought close to the thin plate 13F and the filter 30F at a distance so as not to generate dust.

In the support frame 111F for pellicle, it is possible to suppress degradation of the filter 30F and accumulation of contamination by arranging the wall 17F. In FIGS. 27A to 27C, a configuration similar to the support frame 111A for pellicle described in Embodiment 2 is shown as an example, but the present embodiment is not limited to this, and can be applied to any support frame for pellicle described in the above embodiments and the modifications. The top plate 25E described in Embodiment 5 can be arranged above the support frame 111F for pellicle.

Embodiment 7

Figure 31A:
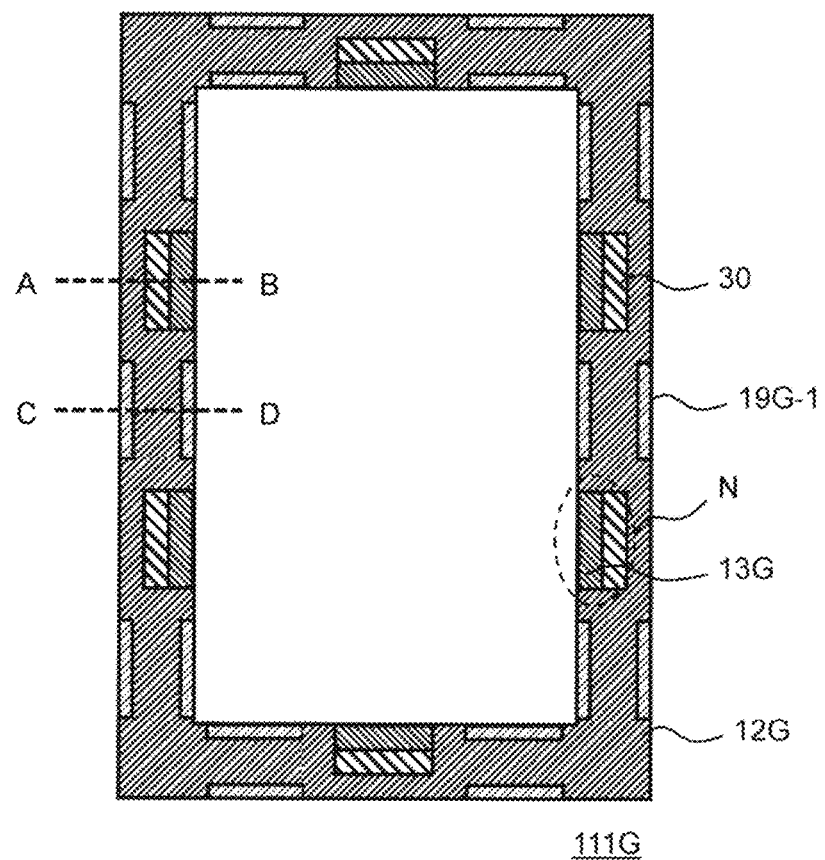
FIG. 31A is a schematic diagram showing a support frame 111G for pellicle according to embodiment and is a schematic diagram of the support frame 111G for pellicle viewed in the plane direction of the pattern plate where the support frame 111G for pellicle is arranged from the side where the pellicle film is arranged.
Figure 31B:
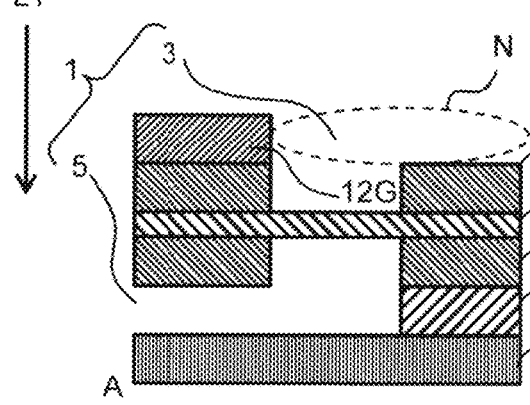
FIG. 31B is a cross-sectional view of the support frame 111G for pellicle in the line segment AB in FIG. 31A.
Figure 31C:
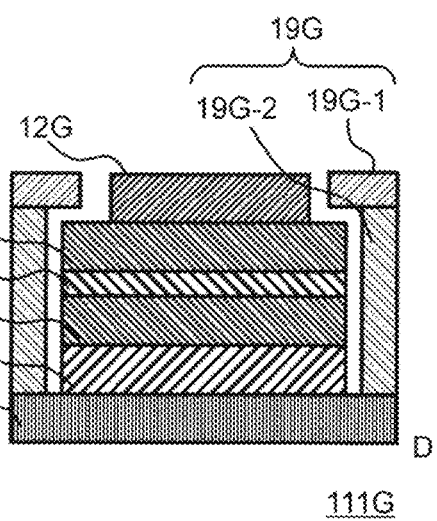
FIG. 31C is a cross-sectional view of the support frame 111G for pellicle in the line segment CD in FIG. 31A.

In the embodiment described above, the filters were sandwiched and fixed by sliding the first support frame part and the second support frame part or by using a fixing tool. In Embodiment 7, a third fixing method will be described. FIGS. 31A to 31C are schematic diagrams showing a support frame 111G for pellicle according to an embodiment of the present invention. FIG. 31A is a schematic diagram of the support frame 111G for pellicle in the plane direction of the pattern plate where the support frame 111G for pellicle is arranged from the side where the pellicle film is arranged. FIG. 31B is a cross-sectional view of the support frame 111G for pellicle in the line segment AB of FIG. 31A, and FIG. 31C is a cross-sectional view of the support frame 111G for pellicle in the line segment CD of FIG. 31A. The support frame 111G for pellicle differs from the above-described embodiment in that the first support frame part and the second support frame part are fixed by using a hooking portion 19G.

Figure 32A:
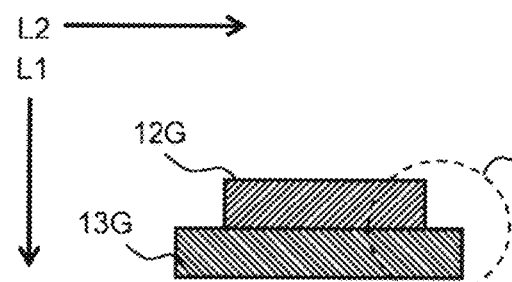
FIG. 32A is a schematic diagram illustrating details of a first support frame part 11G and a second support frame part 16G constituting the support frame 111G for pellicle according to the embodiment and is a schematic diagram illustrating details of the first support frame part 11G.
Figure 32B:
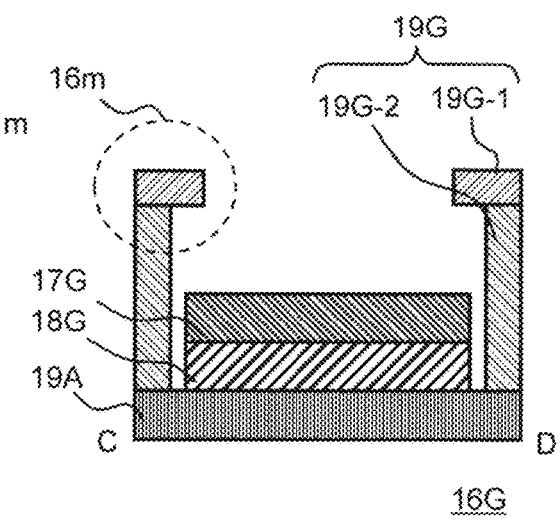
FIG. 32B is a schematic diagram illustrating details of the second support frame part 16G.
Figure 32C:
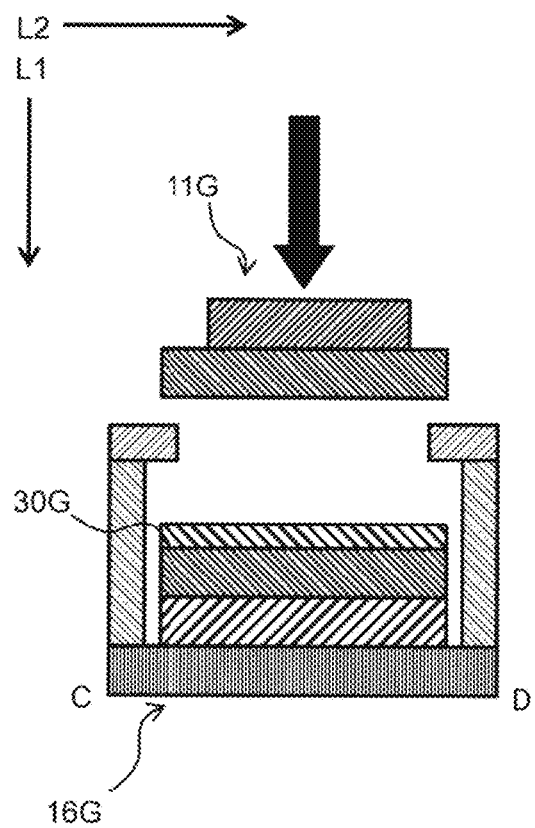
FIG. 32C is a schematic diagram illustrating a method of sandwiching and fixing the filter 30G by the first support frame part 11G and the second support frame part 16G.
Figure 32D:
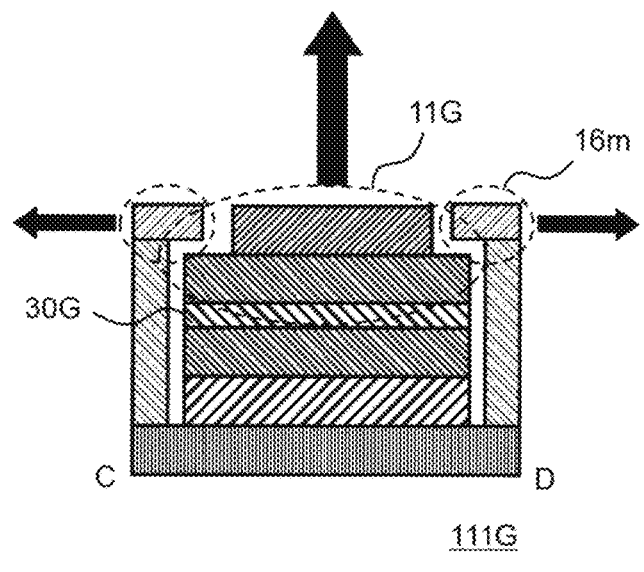
FIG. 32D is a schematic diagram illustrating a method of separating the first support frame part 11G and the second support frame part 16G.

FIGS. 32A to 32D are schematic diagrams illustrating the details of a first support frame part 11G and a second support frame part 16G constituting the support frame 111G for pellicle. FIG. 32A is a schematic diagram illustrating the details of the first support frame part 11G, and FIG. 32B is a schematic diagram illustrating the details of the second support frame part 16G. FIG. 32C is a schematic diagram illustrating a method of sandwiching and fixing a filter 30G by the first support frame part 11G and the second support frame part 16G, and FIG. 32D is a schematic diagram illustrating a method of separating the first support frame part 11G and the second support frame part 16G.

The support frame 111G for pellicle includes the first support frame part 11G, the second support frame part 16G, and the filter 30G. The filter 30G is sandwiched by the first support frame part 11G and the second support frame part 16G. The first support frame part 11G, for example, has a stacked structure of a thin plate 12G having a flat plate-shaped frame shape and a thin plate 13G having a flat plate-shaped frame shape arranged on the lower surface of the thin plate 12G. The first support frame part 11G has a first engaging portion 11m for engaging the hooking portion 19G arranged in the second support frame part 16G. The hooking portion 19G has a second engaging portion 16m for engaging the first engaging portion 11m. The support frame 111G for pellicle engages the first engaging portion 11m and the second engaging portion 16m to sandwich and fix the filter 30G. It is possible to separate the first engaging portion 11m and the second engaging portion 16m to replace the filter 30G by releasing the engagement between the first engaging portion 11m and the second engaging portion 16m.

The first support frame part 11G has a stacked structure of the thin plate 12G having a flat plate-shaped frame and the thin plate 13G having a flat plate-shaped frame shape. As shown in FIG. 32A, the width of the second direction L2 of the thin plate 12G is shorter than the width of the second direction L2 of the thin plate 13G in the first engaging portion 11m (line segment CD). The difference between the width of the thin plate 12G and the width of the thin plate 13G at the first engaging portion 11m can be arbitrarily set to the extent that can be engaged with the second engaging portion 16m.

The second support frame part 16G has the second engaging portion 16m configured by sequentially stacking the thin plate 18G having a flat plate-shaped frame shape and the thin plate 17G having a flat plate-shaped frame shape on the upper surface of the thin plate 19A having a flat plate-shaped frame shape. The second support frame part 16G has the hooking portion 19G. The hooking portion 19G is formed of a wall-shaped member 19G-2 having a predetermined length and a flat plate-shaped member 19G-1 having a predetermined length. The hooking portion 19G is configured by sequentially stacking the wall-shaped member 19G-2 and the flat plate-shaped member 19G-1 on the upper surface of the thin plate 19A, in an embodiment, two hook portions 19G are arranged opposite the upper surface of the thin plate 19A. In other words, the two hooking portions 19G are arranged to sandwich the thin plate 17G and the thin plate 18G. As shown in FIG. 32B, in the second engaging portion 16m (line segment CD), the width of the flat plate-shaped member 19G-1 in the second direction L2 is longer than the width of the wall-shaped member 19G-2 in the second direction L2. The difference between the width of the flat plate-shaped member 19G-1 and the width of the wall-shaped member 19G-2 at the second engaging portion 16m can be arbitrarily set to the extent that can be engaged with the first engaging portion 11m. The number of the hooking portion 19G is not particularly limited, with two hooking portions 19G as one pair, and the second support frame part 16G has two or more pairs, preferably four or more pairs of hooking portions 19G.

Figure 33A:
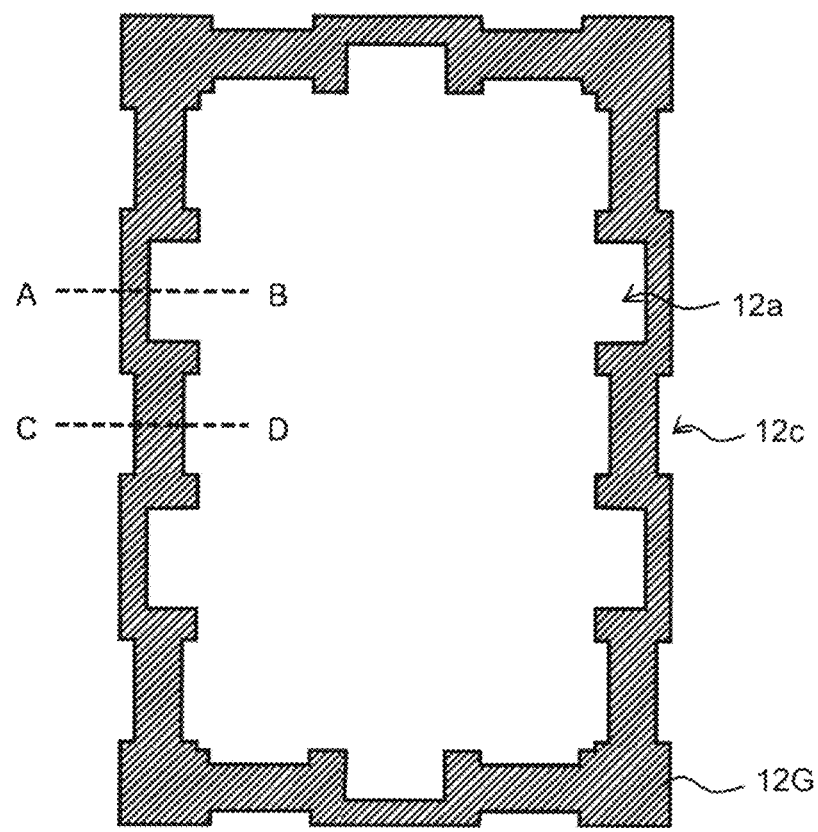
FIG. 33A is a schematic diagram of a thin plate 12G according to an embodiment and is a top view of the thin plate 12G.
Figure 33B:
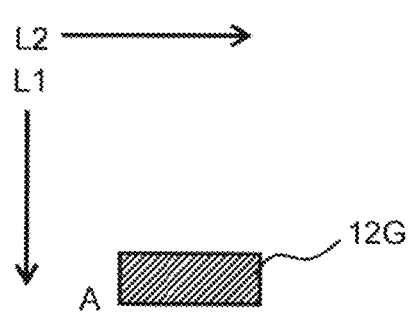
FIG. 33B is a cross-sectional view of the thin plate 12G in the line segment AB shown in FIG. 33A.
Figure 33C:
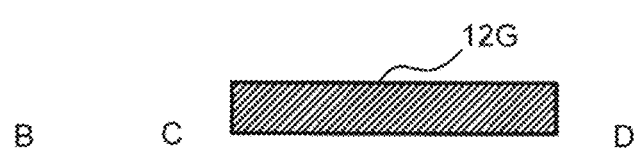
FIG. 33C is a cross-sectional view of the thin plate 12G in the line segment CD shown in FIG. 33A.

Here, the respective thin plate constituting the first support frame part 11G and the second support frame part 16G will be further described. Since the configuration of the thin plate 19A has been described in the above-described embodiment, further explanation is omitted. FIGS. 33A to 33C are schematic diagrams of the thin plate 12G. FIG. 33A is a top view of the thin plate 12G, FIG. 33B is a cross-sectional view of the thin plate 12G in the line segment AB shown in FIG. 33A, FIG. 33C is a cross-sectional view of the thin plate 12G in the line segment CD shown in FIG. 33A. The thin plate 12G is, for example, a rectangular frame shape, and has the concave part (recess shape) 12a connected to an inner edge of the frame (which is the side where the pellicle film is extended, and the side where the closed space is formed when used as a pellicle) and recessed in the second direction. Since the concave part 12a has been described in the above embodiment, detailed descriptions thereof will be omitted. As shown in FIG. 33A, a region adjacent to the concave part 12a has a width corresponding to the width of the thin plate 19A and imparts the required strength to the first support frame part 11G. The portions of both sides of the frame constituting the first engaging portion 11m in the line segment CD has a concave part (recess shape) 12C in the second direction. When the first engaging portion 11m and the second engaging portion 16m are engaged, since the flat plate-shaped member 19G-1 is arranged adjacently, the width of the second direction L2 is set narrower than the region adjacent to the concave part 12a by the width of two concave parts 12c. In FIG. 31C, when the first engaging portion 11m and the second engaging portion 16m are engaged, a slight gap may be arranged between the thin plate 12G and the flat plate-shaped member 19G-1. The other configurations of the thin plate 12G may be the same as that of thin plate 12A, and detailed descriptions thereof are omitted.

Figure 34A:
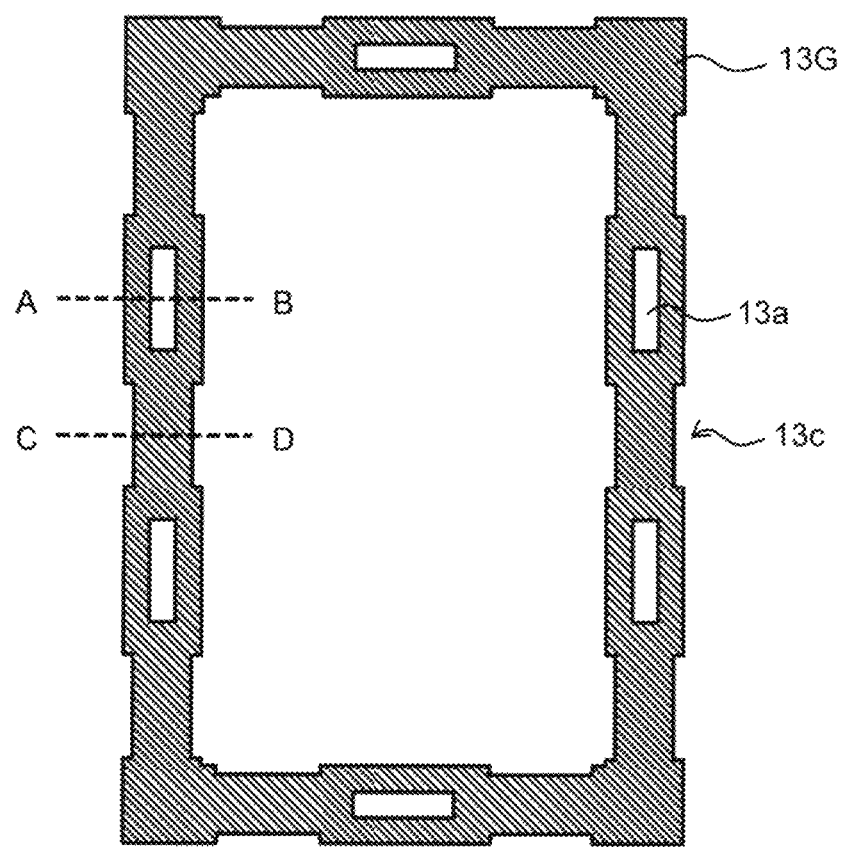
FIG. 34A is a schematic diagram of a thin plate 13G according to an embodiment and is a top view of the thin plate 13G.
Figure 34B:
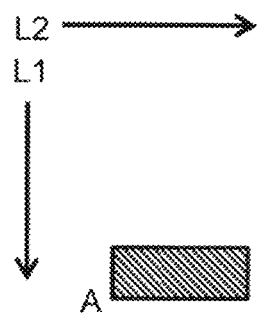
FIG. 34B is a cross-sectional view of the thin plate 13G in the line segment AB shown in FIG. 34A.
Figure 34C:
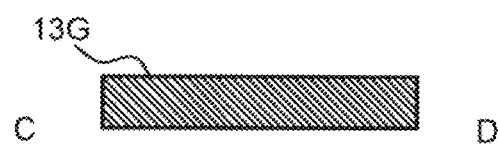
FIG. 34C is a cross-sectional view of the thin plate 13G in the line segment CD shown in FIG. 34A.

FIGS. 34A to 34C are schematic diagrams of the thin plate 13G. FIG. 34A is a top view of the thin plate 13G, FIG. 34B is a cross-sectional view of the thin plate 13G in the line segment AB shown in FIG. 34A, and FIG. 34C is a cross-sectional view of the thin plate 13G in the line segment CD shown in FIG. 34A. The thin plate 13G has, for example, a rectangular frame shape, and has the opening 13a opened in the first direction L1. Since the opening 13a has been described in the above embodiment, detailed descriptions thereof will be omitted. A region adjacent to the opening 13a has a width corresponding to the width of the thin plate 19A and imparts the required strength to the first support frame part 11G. The portions of both sides of the frame constituting the first engaging portion 11m in the line segment CD has a concave part (recess shape) 13c in the second direction. When the first engaging portion 11m and the second engaging portion 16m are engaged, since the wall-shaped member 19G-2 is arranged adjacently, the width of the second direction L2 is set narrower than the region adjacent to the opening 13a by the width of two concave parts 13c. In FIG. 31C, when the first engaging portion 11m and the second engaging portion 16m are engaged, a slight gap may be arranged between the thin plate 13G and the wall-shaped member 19G-2. The rest of the configurations of the thin plate 13G may be the same as that of the thin plate 13A, and detailed descriptions thereof are omitted.

FIGS. 35A to 35C are schematic diagrams of the filter 30G. FIG. 35A is a top view of the filter 30G, FIG. 35B is a cross-sectional view of the filter 30G in the line segment AB shown in FIG. 35A, and FIG. 35C is a cross-sectional view of the filter 30G in the line segment CD shown in FIG. 35A. The filter 30G, for example, a rectangular shape, has two concave parts 30c at a position corresponding to the first engaging portion 11m and the second engaging portion 16m. That is, the concave part 30c is arranged at the position of the filter 30G corresponding to the region adjacent to the region where the opening 13a of the thin plate 13G is arranged. When the first engaging portion 11m and the second engaging portion 16m are engaged, since the wall-shaped member 19G-2 is arranged adjacently, the width of the second direction L2 is set narrower than the width of the region where the opening 13a is arranged by the width of the two concave parts 30c. In FIG. 31C, when the first engaging portion 11m and the second engaging portion 16m are engaged, a slight gap may be arranged between the filter 30G and the wall-shaped member 19G-2. The other configurations of the filter 30G may be the same as that of the filter 30, and detailed descriptions thereof are omitted.

Figure 36A:
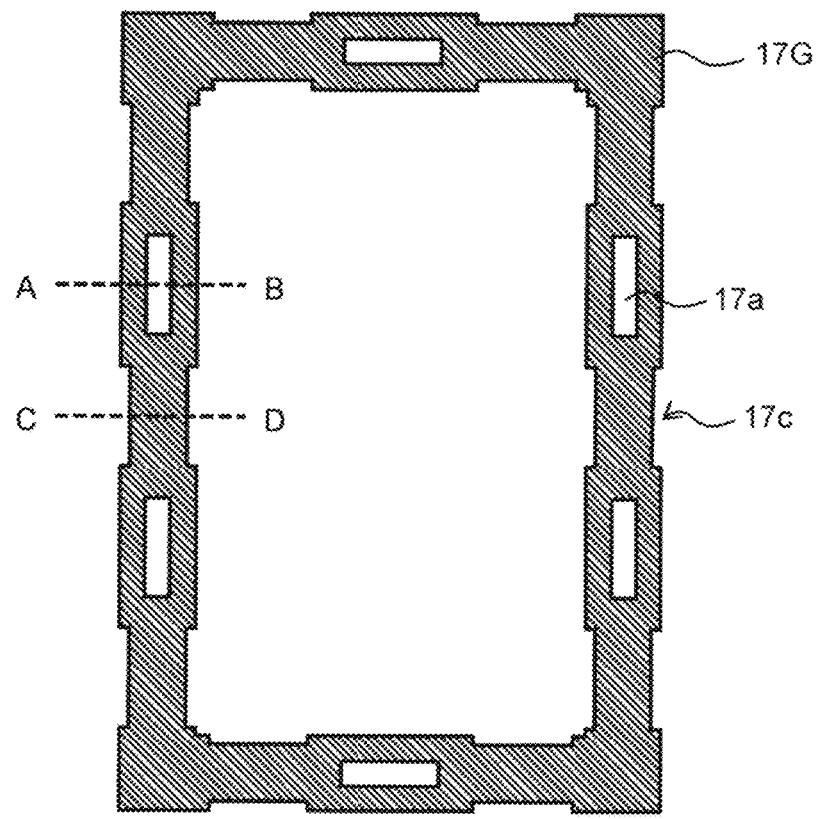
FIG. 36A is a schematic diagram of a thin plate 17G according to an embodiment and is a top view of the thin plate 17G.
Figure 36B:
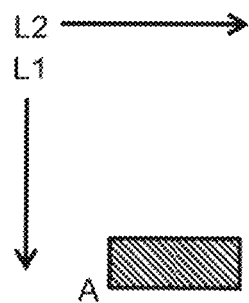
FIG. 36B is a cross-sectional view of the thin plate 17G in the line segment AB shown in FIG. 36A.
Figure 36C:
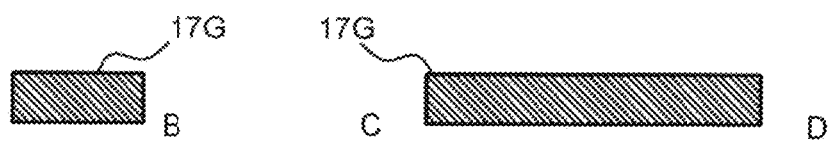
FIG. 36C is a cross-sectional view of the thin plate 17G in the line segment CD shown in FIG. 36A.

FIGS. 36A to 36C are schematic diagrams of the thin plate 17G. FIG. 36A is a top view of the thin plate 17G, FIG. 36B is a cross-sectional view of the thin plate 17G in the line segment AB shown in FIG. 36A, and FIG. 36C is a cross-sectional view of the thin plate 17G in the line segment CD shown in FIG. 36A. The thin plate 17G has, for example, a rectangular frame shape, and has the opening 17a opened in the first direction L1. Since the opening 17a has been described in the above embodiment, detailed descriptions thereof will be omitted. A region adjacent to the opening 17a has a width corresponding to the width of the thin plate 19A and imparts the required strength to the second support frame part 16G. The portions of both sides of the frame constituting the second support frame part 16G in the line segment CD has a concave part (recess shape) 17c in the second direction. When the first engaging portion 11m and the second engaging portion 16m are engaged, since the wall-shaped member 19G-2 is arranged adjacently, the width of the second direction L2 is set narrower than the region adjacent to the opening 17a by the width of the two concave parts 17c. In FIG. 31C, when the first engaging portion 11m and the second engaging portion 16m are engaged, a slight gap may be arranged between the thin plate 17G and the wall-shaped member 19G-2. The other configurations of the thin plate 17G may be the same as that of the thin plate 17A, and detailed descriptions thereof are omitted.

Figure 37A:
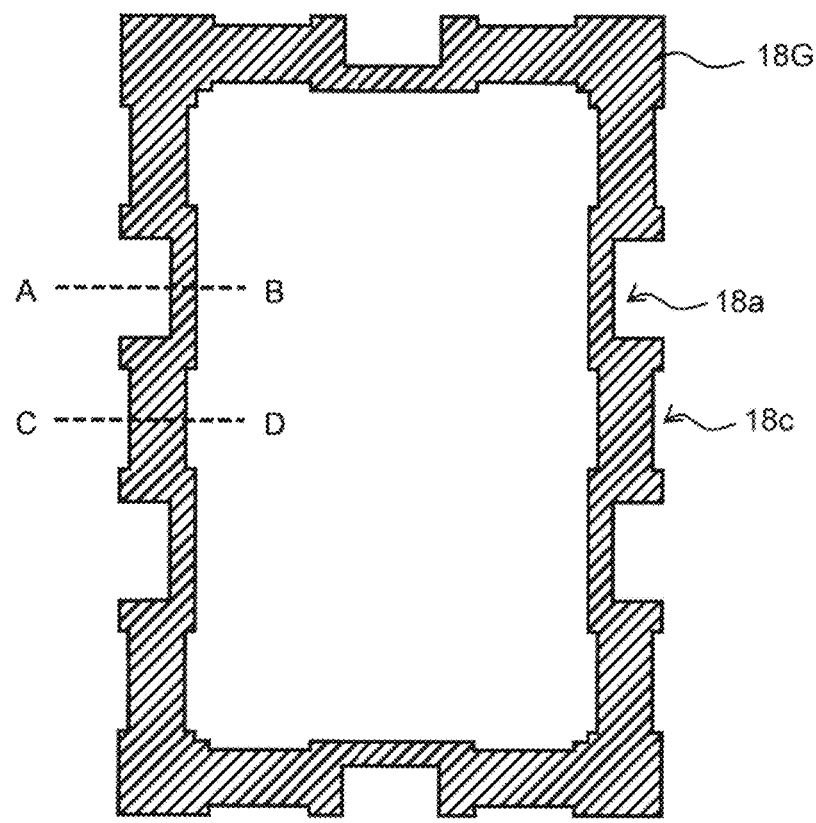
FIG. 37A is a schematic diagram of a thin plate 18G according to an embodiment and is a top view of the thin plate 18G.
Figure 37B:
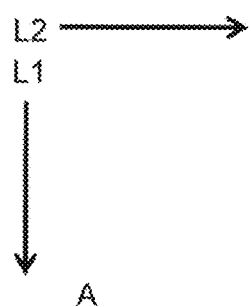
FIG. 37B is a cross-sectional view of the thin plate 18G in the line segment AB shown in FIG. 37A.
Figure 37C:
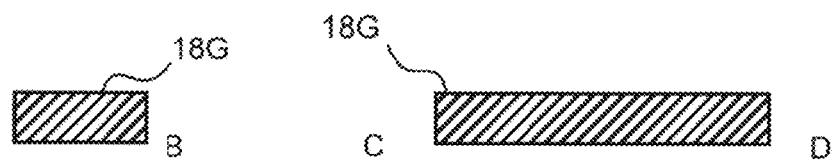
FIG. 37C is a cross-sectional view of the thin plate 18G in the line segment CD shown in FIG. 37A.

FIGS. 37A to 37C are schematic diagrams of the thin plate 18G. FIG. 37A is a top view of the thin plate 18G, FIG. 37B is a cross-sectional view of the thin plate 18G in the line segment AB shown in FIG. 37A, and FIG. 37C is a cross-sectional view of the thin plate 18G in the line segment CD shown in FIG. 37A. The thin plate 18 G has, for example, a rectangular frame shape, and has an opening 18a opened in the first direction L1. Since the opening 18a has been described in the above embodiment, detailed descriptions thereof will be omitted. A region adjacent to the opening 18a has a width corresponding to the width of the thin plate 19A and imparts the required strength to the second support frame part 16G. The portions of both sides of the frame constituting the second support frame part 16G in the line segment CD has a concave part (recess shape) 18c in the second direction. When the first engaging portion 11m and the second engaging portion 16m are engaged, since the wall-shaped member 19G-2 is arranged adjacently, the width of the second direction L2 is set narrower than the region adjacent to the concave part 18a by the width of the two concave parts 18c. In FIG. 31C, when the first engaging portion 11m and the second engaging portion 16m is engaged, a slight gap may be arranged between the thin plate 18G and the wall-shaped member 19G-2. The other configurations of the thin plate 18G may be the same as that of the thin plate 18A, and detailed descriptions thereof is omitted.

Figure 38A:
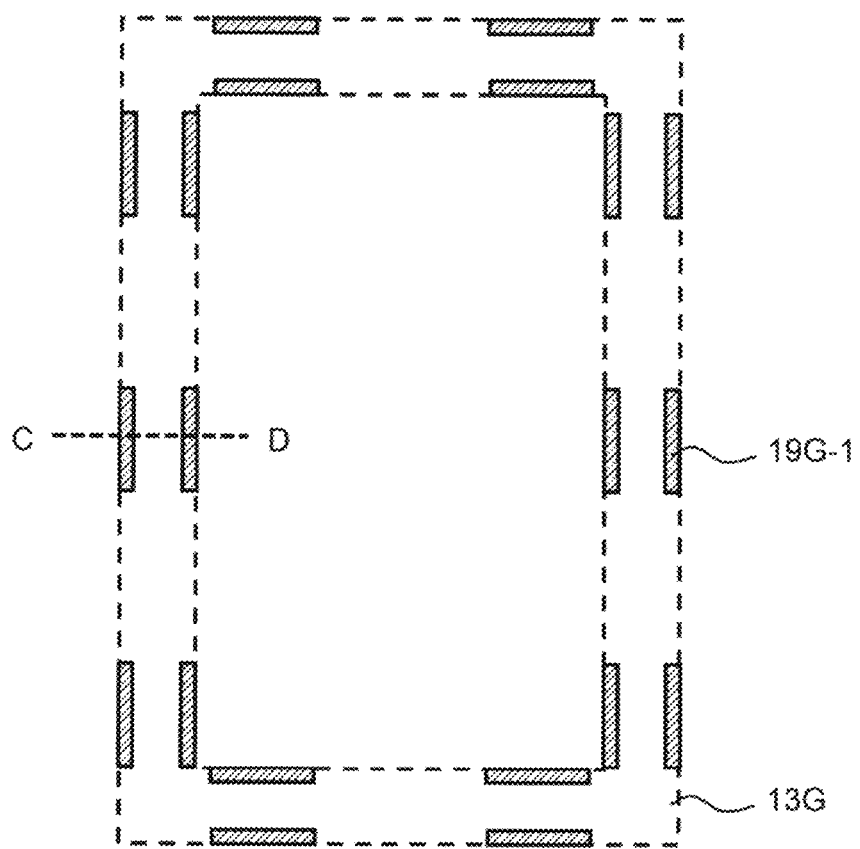
FIG. 38A is a schematic diagram of a flat plate-shaped member 19G-1 according to an embodiment and is a top view of the flat plate-shaped member 19G-1.
Figure 38B:
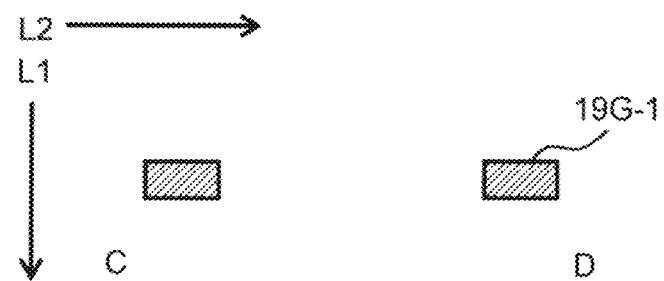
FIG. 38B is a cross-sectional view of the flat plate-shaped member 19G-1 in the line segment CD shown in FIG. 38A.

FIGS. 38A to 38B is a schematic diagram of the flat plate-shaped member 19 G-1. FIG. 38A is a top view of the flat plate-shaped member 19G-1, and FIG. 38B is a cross-sectional view of the flat plate-shaped member 19G-1 in the line segment CD shown in FIG. 38A. The flat plate-shaped member 19G-1 is, for example, a rectangular shape, connected to the upper surface of the thin plate 19A via the wall-shaped member 19G-2 to constitute the second engaging portion 16m of the hooking portion 19G extending in the second direction L2. The flat plate-shaped member 19G-1 extends in a predetermined length in the second direction L2 than in the wall-shaped member 19G-2. The part of the flat plate-shaped member 19G-1 extending from the wall-shaped member 19G-2 in the second direction L2 participates in the engagement with the first engagement portion 11m. Here, the length of the part of the flat plate-shaped member 19G-1 extending in the second direction L2 can be arbitrarily set as long as the strength at which the first support frame part 11G and the second support frame part 16G engage with each other can be obtained. Therefore, when the part of the flat plate-shaped member 19G-1 extending in the second direction L2 is lengthened, the reliability of the engagement between the first support frame part 11G and the second support frame part 16G is increased. The flat plate-shaped member 19G-1 is arranged in a region adjacent to the region of the thin plate 12G where the opening 12a is arranged. There is no particular limitation on the number of the flat plate-shaped member 19G-1, and it is preferable to arrange one pair on the region of the thin plate 12G located at both sides of the opening 12a. That is, in the present embodiment, the first support frame part 11G and the second support frame part 16G can increase the strength to engage by arranging first engaging portion 11m and the second engaging portion 16m on both sides of the vent hole 1, and then air leakage when venting through the filter is reduced. Metals, glasses, silicon wafers, ceramics, and resins are exemplified as a material for the flat plate-shaped member 19G-1.

Figure 39A:
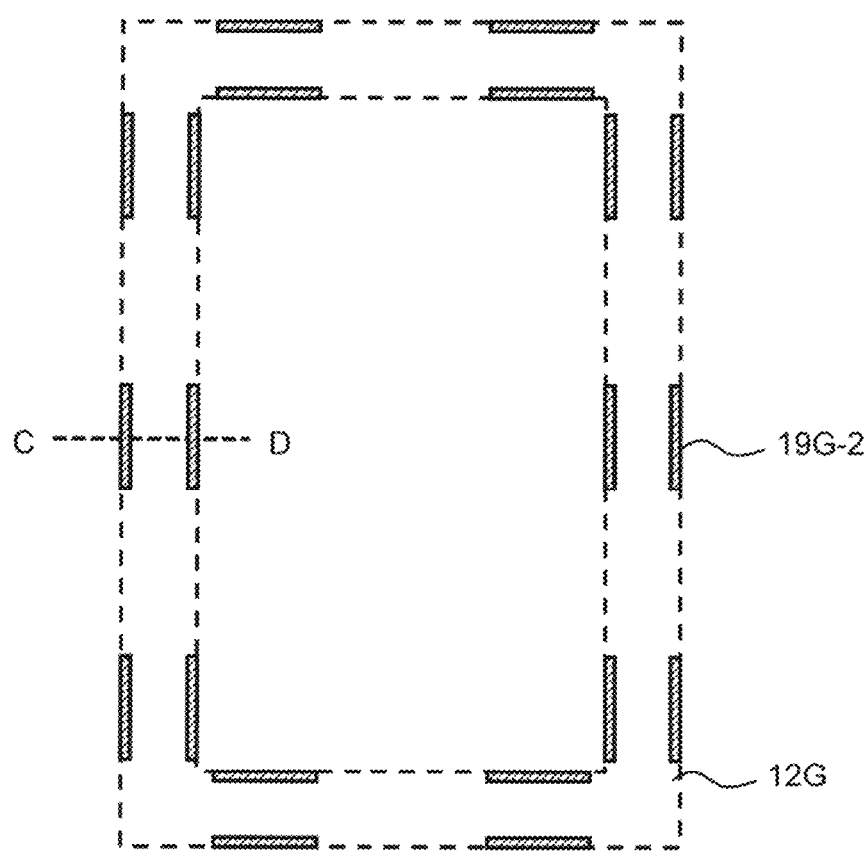
FIG. 39A is a schematic diagram of a wall-shaped member 19G-2 according to an embodiment and is a top view of the wall-shaped member 19G-2.
Figure 39B:
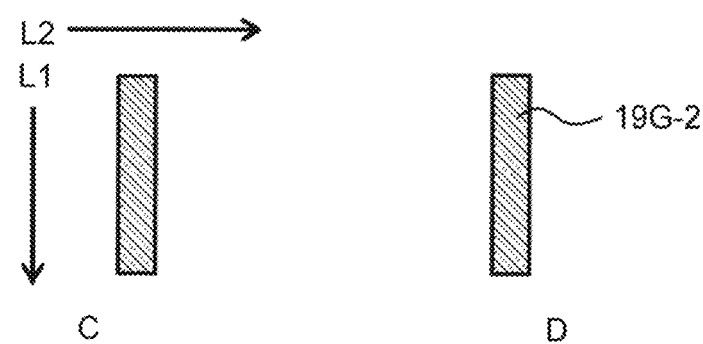
FIG. 39B is a cross-sectional view of the wall-shaped member 19G-2 in the line segment CD shown in FIG. 39A.

FIGS. 39A and 39B are schematic diagrams of the wall-shaped member 19G-2. FIG. 39A is a top view of the wall-shaped member 19G-2, and FIG. 39B is a cross-sectional view of the wall-shaped member 19G-2 in the line segment CD shown in FIG. 39A. The wall-shaped member 19G-2 is, for example, a rectangular-shaped and connects to the top surface of the thin plate 19A and extends in a first orientation L1 of the support frame 111G for pellicle. The wall-shaped member 19G-2 is connected to the flat plate-shaped member 19G-1 extending in the second direction L2 to constitute the second engaging portion 16m of the hooking portion 19G. The wall-shaped member 19G-2 is arranged in a region adjacent to the region of the thin plate 13G where the opening 13a is arranged. There is no particular limitation on the number of the wall-shaped member 19G-2, and it is preferable to arrange one pair of the wall-shaped member on the region of the thin plate 13G located at both sides of the opening 13a. That is, in the present embodiment, the first support frame part 11G and the second support frame part 16G can increase the strength to engage by arranging the first engaging portion 11m and the second engaging portion 16m on both sides of the vent hole 1, air leakage when venting through the filter is reduced. Metals, glasses, silicon wafers, ceramics, and resins are exemplified as a material for the wall-shaped member 19G-2.

Referring to FIGS. 32(c) and 32(d), methods of attaching and detaching the filter 30G to and from the support frame 111G for pellicle will be described. FIG. 32C is a schematic diagram illustrating a method of fixing the filter 30G to the support frame 111G for pellicle. The filter 30G is arranged on the upper surface of the thin plate 17G of the second support frame part 16G. At this time, the concave part 30c of the filter 30G is arranged at a position corresponding to the wall-shaped member 19G-2. Therefore, the filter 30G is sandwiched by a pair of wall-shaped member 19G-2 in the position where the concave part 30c is arranged. Thereafter, the first support frame part 11G is arranged on the filters 30G in the first direction L1. As a result, the concave part 13c of the first support frame part 11G passes between the pair of flat plate-shaped member 19G-1, and the thin plate 13G and the filter 30G are brought into close contact with each other. In the support frame 111G for pellicle, since the wall-shaped member 19G-2 has flexibility, when the concave part 13c of the thin plate 13G passes between the pair of flat plate-shaped member 19G-1, the wall-shaped member 19G-2 is deflected toward the second direction L2 (outer direction of the thin plate 13G), whereby the first engaging portion 11m and the second engaging portion 16m can be engaged with each other. In the present embodiment, compared with the system using the slide or the fixing tool described in the other embodiments, the frame is simplified in construction, and since the fixing system does not have the sliding operation, the risks of dust generation are reduced.

FIG. 32D is a schematic diagram illustrating a method of removing the filter 30G from the support frame 111G for pellicle. For example, the first support frame part 11G is lifted in the first direction L1 while pulling the second engaging portion 16m in the second direction L2 (outer side of the thin plate 13G). Thus, the engagement between the first engaging portion 11m and the second engaging portion 16m is released to separate the first support frame part 11G and the second support frame part 16G. By removing the first support frame part 11G from the support frame 111G for pellicle, the filter 30G can be removed from the second support frame part 16G and replaced.

The method of sandwiching and fixing the filter described in the present embodiment is also applicable to the layer configuration of the other embodiments described above.

[Pellicle]

By arranging a pellicle film 102 or the pellicle frame body in the support frame shown in the respective embodiments described above, the pellicle can be configured. As will be described later, since the pellicle film 102 according to the embodiment of the present invention is a very thin film, it is preferable to set the pellicle frame body in which a first frame body is provided on one surface of the pellicle film 102, and arrange the pellicle frame body in a support frame from the viewpoint of handling. The method of connecting the pellicle film 102 or the pellicle frame body to the support frame is not particularly limited, and can be connected by adhesive sheets, adhesives, bonding agents, room temperature bonding, direct bonding, atomic diffusion bonding, metallic bonding, welding, solder bonding, thermocompression bonding, hot melt, flux bonding, surface fasteners, van der Waals forces, electrostatic forces, magnetic forces, mechanical forces such as screw pins, clips, and crimping.

Figure 24A:
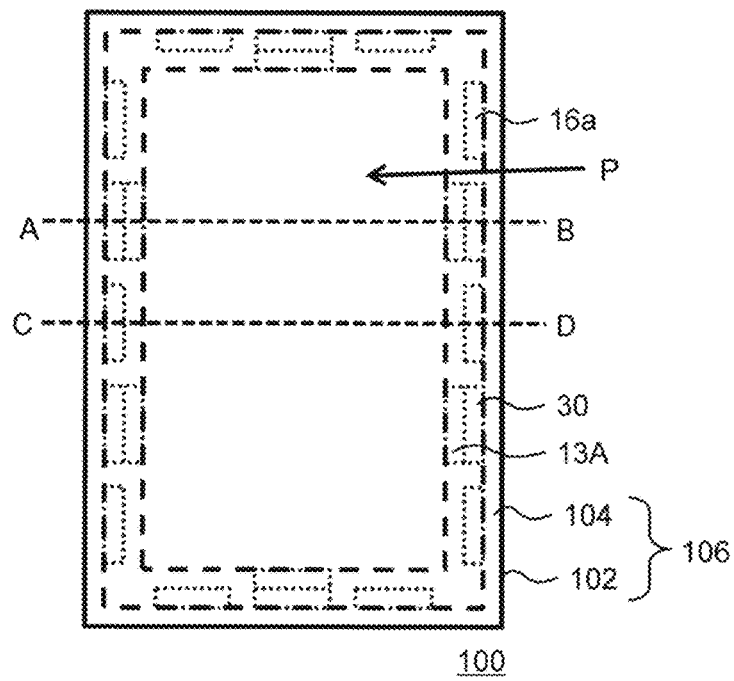
FIG. 24A is a schematic diagram showing a pellicle 100 according to an embodiment and is a top view of the pellicle 100.
Figure 24B:
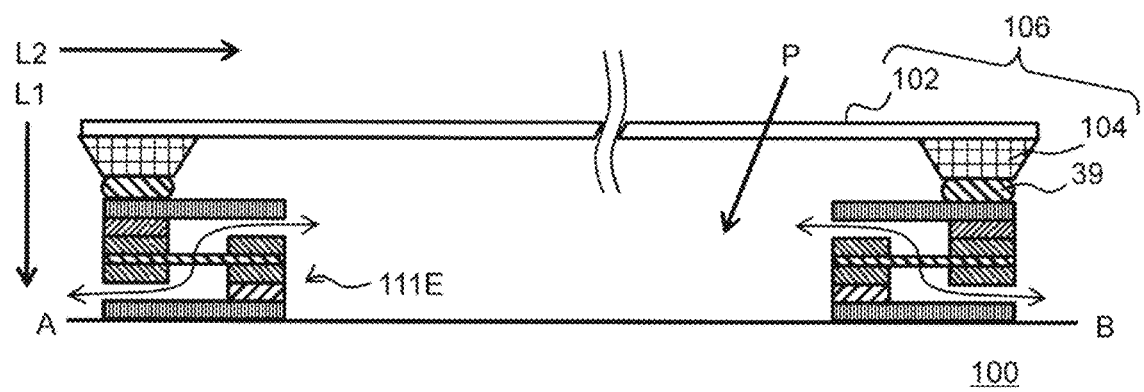
FIG. 24B is a cross-sectional view of the pellicle 100 in the line segment AB shown in FIG. 24A.
Figure 24C:
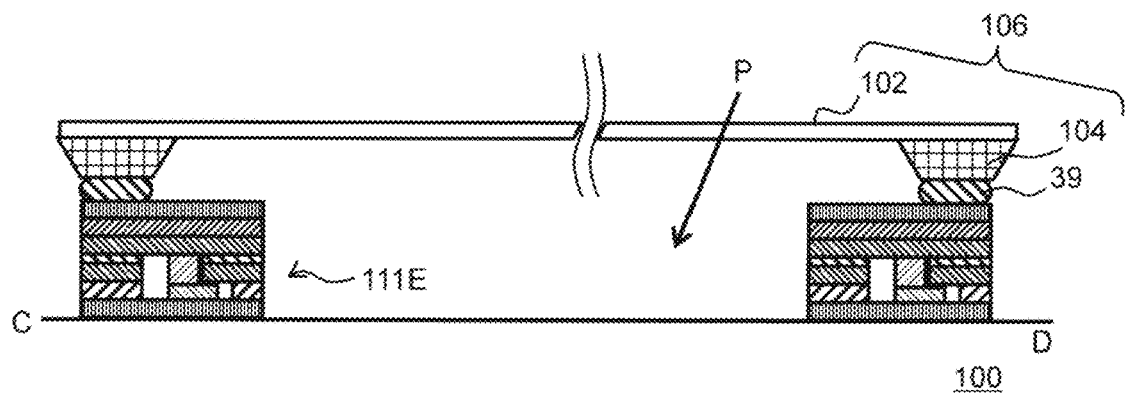
FIG. 24C is a cross-sectional view of the pellicle 100 in the line segment CD in FIG. 24A.

FIGS. 24A to 24C are schematic diagrams showing a pellicle 100 according to an embodiment of the present invention. FIG. 24A is a top view of the pellicle 100, FIG. 24B is a cross-sectional view of the pellicle 100 in the line segment AB shown in FIG. 24A, and FIG. 24C is a cross-sectional view of the pellicle 100 in the line segment CD of FIG. 24A. In FIGS. 24A to 24C, as an example, an example in which the pellicle film 102 arranged in a first frame body 104 is arranged in the support frame 111E for pellicle described in Embodiment 5 is shown, but the present embodiment is not limited to this, and can be applied to any support frame for pellicle described in the above embodiments and the modifications.

The first frame body 104 has a substantially rectangular frame shape and is made of a material selected from metals, glasses, silicones, ceramics, graphite, resins, and the like. The pellicle film 102 is extended on the first frame body 104 and the first frame body 104 supports the pellicle film 102. A structure in which the pellicle film 102 is arranged on the first frame body 104 is referred to as a pellicle frame body 106. In the pellicle 100, the pellicle frame body 106 is affixed to the top surface of the top plate 25E of the support frame 111E for pellicle via an adhesive layer 39. Therefore, in this embodiment, the pellicle film 102 is provided on the support frame 111E for pellicle via the first frame body 104 provided on one surface of the pellicle film 102. In this embodiment, an example has been described in which the support part has the first frame body 104 supporting the pellicle film 102 and the second frame body constituting the support frame 111C for pellicle, but the present embodiment is not limited thereto, and the pellicle film 102 may be arranged on the support frame 111E for pellicle without the first frame body 104.

The adhesive layer 39 is a layer which adheres the pellicle film or the first frame body and the support frame. The adhesive layer 39 is, for example, a double-sided adhesive tape, a silicone-resin adhesive, an acrylic adhesive, a polyolefin-based adhesive, an inorganic-based adhesive, or the like. From the viewpoint of maintaining the degree of vacuuming at the time of EUV exposure, it is preferable that the adhesive layer 39 has a small amount of outgas. As a method of evaluating the outgas, for example, a temperature-raised desorption gas analyzer can be used. The adhesive layer 39 may be previously formed into the support frame prior to connecting the pellicle film or the first frame body and the support frame. The adhesive layer 39 may be formed on the layer of the support frame arranged on the closest to the pellicle film side.

[Pellicle Film]

The thickness of the pellicle film (total thickness when composed of two or more layers) can be, for example, 10 nm to 200 nm, preferably 10 nm to 100 nm, more preferably 10 nm to 70 nm, and particularly preferably 10 nm to 50 nm.

The pellicle film preferably has a high transmittance of EUV light, and the transmittance of light used for EUV lithography (for example, light having a wavelength of 13.5 nm or light having a wavelength of 6.75 nm) is preferably 50% or more, more preferably 80% or more, and still more preferably 90% or more. When the pellicle film is laminated with a protective layer, it is preferable that the transmittance of light of the film containing these is 50% or more.

As the material of the pellicle film, a material of a known pellicle film for EUV may be used. For example, carbon-based materials such as carbon nanotubes, diamond-like carbon, amorphous carbon, graphite and silicon carbide, silicon-based materials such as single-crystal silicon, polycrystalline silicon, amorphous silicon and metal silicide, and polymer-based materials such as aromatic polyimide, aliphatic polyimide, cross-linked polyethylene, cross-linked polystyrene, polyetherimide, polyphenylene sulfone, polyphenylene ether, polyethersulfone, polyetherketone, liquid crystal polymer, polyethylene terephthalate, aromatic polyamide and parylene, are exemplified as a material of the pellicle film include.

[Exposure Pattern Plate]

Figure 25:
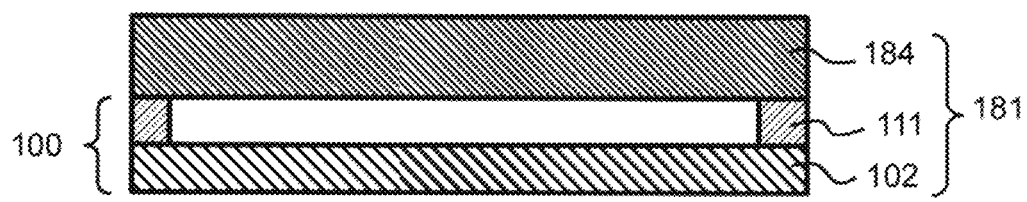
FIG. 25 is a schematic diagram showing a cross-sectional configuration of an exposure pattern plate 181 according to an embodiment.

FIG. 25 is a schematic diagram showing a cross-sectional configuration of an exposure pattern plate 181 according to an embodiment of the present invention. As an example, the exposure pattern plate 181 includes the pellicle 100 having the pellicle film 102 and the support frame 111 for pellicle, and a pattern plate 184. The exposure pattern plate 181 according to the present invention allows to attach and detach the filter 30 provided on the vent hole of the support frame 111 for pellicle in the pellicle 100 provided with the pellicle film 102 for extreme ultraviolet light lithography mounted on the pattern plate 184, and the contamination to the pattern plate 184 can be reduced. Although FIG. 25 shows an example in which the pellicle 100 including the pellicle film 102 and the support frame 111 for pellicle is arranged on the surface of the patterned pattern plate 184, the exposure pattern plate according to the present invention is not limited to this and the pellicle having the support frame described in the above embodiments may be arranged.

There is no particular limitation on the method of attaching the pellicle according to the present invention to the pattern plate. For example, the support frame may be applied directly to the pattern plate, through an adhesive layer for pattern plate on one end surface of the support frame, or mechanical fastening methods or attractive forces such as magnets may be used to fasten the pattern plate and the support frame. Since the adhesive layer for pattern plate can be the same as that of the adhesive layer 39, a detailed description thereof will be omitted.

[Use of Pellicle]

The pellicle may be not only a protective member for preventing foreign matter from adhering to the pattern plate in an EUV exposure device, but also a protective member for protecting the pattern plate during storage of the pattern plate and transportation of the pattern plate. For example, if a pellicle is attached to the pattern plate (exposure pattern plate), the pattern plate can be removed from the EUV exposure device and stored as it is. The method of attaching the pellicle to the pattern plate includes a method of sticking with an adhesive, a method of mechanically fixing, and the like.

[Exposure Device]

Figure 26:
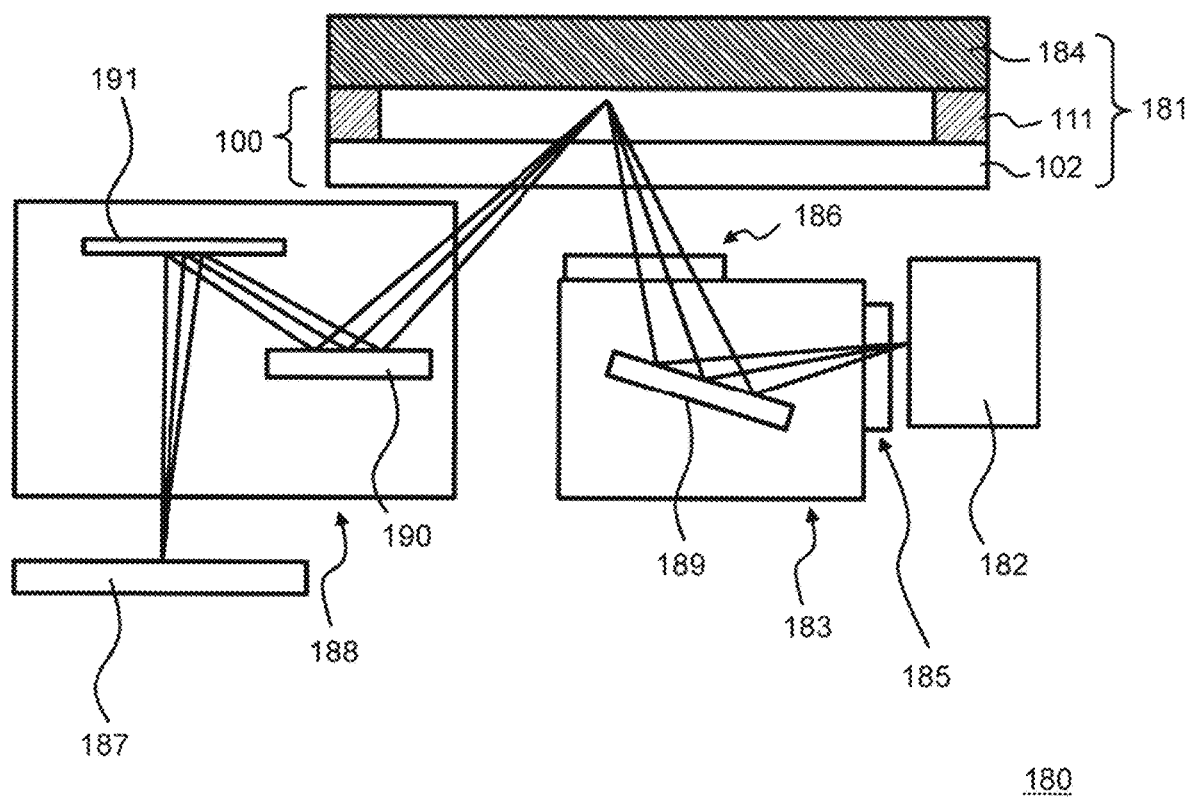
FIG. 26 is a schematic diagram showing an exposure device 180 according to an embodiment.

FIG. 26 is a schematic diagram showing an exposure device 180 according to an embodiment of the present invention. In FIG. 26, the exposure pattern plate 181 is shown in a cross-sectional view.

As an example, the EUV exposure device 180 includes a light source 182 that emits EUV light, the exposure pattern plate 181 that is an example of the exposure pattern plate of the present embodiment, and a lighting optical system 183 that directs the EUV light emitted from the light source 182 to the exposure pattern plate 181.

In the EUV exposure device 180, the EUV light emitted from the light source 182 is condensed by the lighting optical system 183 to uniformize the illuminance, and is irradiated to the exposure pattern plate 181. The EUV light irradiated on the exposure pattern plate 181 is reflected in a pattern by the pattern plate 184.

The exposure pattern plate 181 is an example of the exposure pattern plate of the present embodiment. The exposure pattern plate 181 is arranged so that the EUV light emitted from the light source 182 is transmitted through the pellicle film 102 and irradiated onto the pattern plate 184. The pattern plate 184 reflects the irradiated EUV light in a pattern.

The lighting optical system 183 includes a plurality of multilayer film mirrors 189 and optical couplers (optical integrators) for adjusting the optical path of the EUV light.

As the light source 182 and the lighting optical system 183, known light sources and lighting optical systems can be used.

In the EUV exposure device 180, filter windows 185 and 186 are respectively provided between the light source 182 and the lighting optical system 183 and between the lighting optical system 183 and the pattern plate 184. The filter windows 185 and 186 are capable of capturing scattered particles (debris). The EUV exposure device 180 includes a projection optical system 188 that directs the EUV light reflected by the pattern plate 184 to a sensitive substrate 187. The projection optical system 188 may include a plurality of multilayer film mirrors 190 and multilayer film mirrors 191 to direct the EUV light reflected by the pattern plate 184 to the sensitive substrate 187.

The exposure device according to an embodiment of the present invention, since the pellicle in which the filter is detachably provided in the vent hole and the pellicle film for extreme ultraviolet light lithography is provided is connected to the exposure pattern plate, it is possible to reduce the effect on the optical system of the exposure device.

The exposure device of the present embodiment preferably includes a light source for emitting exposure light (preferably EUV light or the like, more preferably EUV light; the same shall apply hereinafter), the exposure pattern plate of the present embodiment, and the optical system for directing the exposure light emitted from the light source to the exposure pattern plate. The exposure pattern plate is preferably arranged so that the exposure light emitted from the light source is transmitted through the pellicle film and irradiated onto the pattern plate.

According to this embodiment, in addition to being able to form a pattern miniaturized by EUV light or the like (e.g., a line width of 32 nm or less), even when using EUV light that tends to cause problems with poor resolution due to foreign matter is used, it is possible to perform a pattern exposure in which poor resolution due to foreign matter is reduced.

[Manufacturing Method of Semiconductor Device]

A manufacturing method of a semiconductor device of the present embodiment includes a step of irradiating the pattern plate with the exposure light emitted from the light source by transmitting the pellicle film of the exposure pattern plate of the present embodiment and reflecting with the pattern plate, and a step of exposing the exposure light in a pattern by transmitting the exposure light reflected by the pattern plate in a pattern through the pellicle film and irradiating the sensitive substrate with the exposure light.

According to the manufacturing method of the semiconductor device of the present embodiment, even when using EUV light that tends to cause problems with resolution due to foreign matter becomes a problem, it is possible to produce a semiconductor device in which the poor resolution due to foreign matter is reduced. For example, it is possible to perform the manufacturing process of the semiconductor device according to the present embodiment by using the exposure device according to the present embodiment.

According to the manufacturing method of the semiconductor device according to an embodiment of the present invention, since the pellicle in which the filter is detachably provided in the vent hole and the pellicle film for extreme ultraviolet light lithography is provided is connected to the exposure pattern plate, high-definition exposure can be performed in extreme ultraviolet light lithography.

According to the present invention, a support frame in which easily detachable filter is provided in a vent hole and a pellicle film for extreme ultraviolet light lithography can be provided, a pellicle in which the support frame is provided with a pellicle film for extreme ultraviolet light lithography and a method for manufacturing a support frame, and an exposure pattern plate using these and an exposure device are provided.

In the embodiment, since no adhesive is required for fixing the filter, the generation of outgas from the adhesive is reduced, and contamination is suppressed in a region in the space formed by the pattern plate and the pellicle in which the EUV light is irradiated. It is possible to suppress fogging of the lenses of optical system of the exposure device due to outgassing from the adhesives, exposure defects, and light deficiency.

What is claimed is:

1. A support frame for pellicle comprising:
 a first support frame part, a second support frame part, and a filter;
 wherein the filter has a flat plate-shaped frame shape and sandwiched by the first support frame part and the second support frame part;

the first support frame part includes a first body part having a flat plate-shaped frame shape and a first engaging portion protruded from the first body part to a thickness direction of the support frame for pellicle; and the second support frame part includes a second body part having a flat plate-shaped frame shape and a second engaging portion of the second body part engaging with the first engaging portion being arranged in a concave part provided in the thickness direction of the support frame for pellicle.

2. The support frame for pellicle according to claim 1, wherein the first engaging portion includes a first extending portion extending in the thickness direction of the support frame for pellicle and a second extending portion extending in a direction intersecting with the thickness direction of the support frame for pellicle from an end of the first extending portion opposite to the first body part;

wherein the second engaging portion includes a first groove extending in the thickness direction of the support frame for pellicle from a first surface of the second support frame part arranged at a first support frame part side and a second groove extending in a direction intersecting with the thickness direction of the support frame for pellicle from a bottom of the first groove; and wherein at least a part of the second extending portion is housed in the second groove.

3. The support frame for pellicle according to claim 1, wherein the filter includes an opening at a position corresponding to the first engaging portion and the second engaging portion; and the first engaging portion engages with the second engaging portion through the opening.

4. The support frame for pellicle according to claim 2, wherein the second engaging portion includes a fixing tool separately arranging in a direction to the first surface from the bottom of the second groove;

the second groove is composed of the bottom of the first groove and the fixing tool.

5. The support frame for pellicle according to claim 4, wherein the fixing tool includes a third engaging portion engageable with a jig.

6. The support frame for pellicle according to claim 1, further comprising a vent hole connecting an inner edge and an outer edge of the support frame for pellicle, the vent hole arranged with the filter.

7. The support frame for pellicle according to claim 6, wherein the vent hole comprises a first hole arranging the filter is arranged and extending in a first direction almost parallel to the thickness direction of the support frame for pellicle, and a second hole connected to a first end of the first hole, the second hole extending in a second direction intersecting with the first direction, and the second hole having an opening in the inner edge or the outer edge.

8. The support frame for pellicle according to claim 7, wherein the vent hole further includes a third hole connected to a second end of the first hole and provided in a direction intersecting with the thickness direction of the support frame for pellicle.

9. The support frame for pellicle according to claim 8, wherein a plurality of the first engaging portions is arranged, and a plurality of the second engaging portions is arranged, and a plurality of the vent holes is arranged.

10. The support frame for pellicle according to claim 2, wherein the first support frame part is a laminated body including a thin plate having a frame shape forming the first body part, a thin plate forming the first extending portion, and a thin plate forming the second extending portion.

11. The support frame for pellicle according to claim 2, wherein the second support frame part is a laminated body including a thin plate forming the first groove and a thin plate forming the second groove.

12. The support frame for pellicle according to claim 1, further comprising: a wall arranged inside the frame shape of the filter.

13. A pellicle comprising: the support frame according to claim 1 and a pellicle film.

14. An exposure pattern plate comprising: the pellicle according to claim 13 and a pattern plate.

15. An exposure device comprising: the exposure pattern plate according to claim 14 and an optical system.

16. A method of manufacturing a support frame for pellicle, comprising steps of:

preparing a first support frame part including a first body part having a flat plate-shaped frame shape and a first engaging portion protruded in a thickness direction of the support frame for pellicle from the first body part;

preparing a second support frame part including a second body part having a flat plate-shaped frame shape and a second engaging portion arranged in a concave part of the second body part provided in the thickness direction of the support frame for pellicle and engaging with the first engaging portion;

preparing a filter having a flat plate-shaped frame shape; and sandwiching the filter by the first support frame part and the second support frame part, and engaging the first engaging portion with the second engaging portion.

17. The method of manufacturing the support frame for pellicle according to claim 16, comprising steps of:

connecting a thin plate forming the first body part, a thin plate forming a first extending portion, and a thin plate forming a second extending portion to prepare the first support frame part including the first engaging portion protruded from the first body part to the thickness direction of the support frame for pellicle;

connecting a thin plate forming a first groove, a thin plate forming a second groove, and a thin plate forming the second body part to preparer the second support frame part including the second engaging portion; and housing at least a part of the second extending portion in the second groove to engage the first engaging portion with the second engaging portion.

* * * * *